(12) United States Patent
Hong et al.

(10) Patent No.: US 12,309,955 B2
(45) Date of Patent: May 20, 2025

(54) DISPLAY DEVICE

(71) Applicant: LG ELECTRONICS INC., Seoul (KR)

(72) Inventors: Kyungjun Hong, Seoul (KR); Sangsoo Lee, Seoul (KR); Jaewon Oh, Seoul (KR); Kihyeong Im, Seoul (KR); Kitae Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 168 days.

(21) Appl. No.: 17/919,124

(22) PCT Filed: Apr. 14, 2020

(86) PCT No.: PCT/KR2020/005044
§ 371 (c)(1),
(2) Date: Oct. 14, 2022

(87) PCT Pub. No.: WO2021/210701
PCT Pub. Date: Oct. 21, 2021

(65) Prior Publication Data
US 2023/0180415 A1 Jun. 8, 2023

(51) Int. Cl.
*G09F 9/30* (2006.01)
*H05K 7/02* (2006.01)

(52) U.S. Cl.
CPC ..................................... *H05K 7/02* (2013.01)

(58) Field of Classification Search
CPC .. H05K 7/02; G09F 9/301; G09F 9/30; B65H 75/44
See application file for complete search history.

(56) References Cited

U.S. PATENT DOCUMENTS 10,194,543 B2  1/2019  Seo et al.
11,513,560 B2 * 11/2022  Dong ........................ B32B 9/04
(Continued)

FOREIGN PATENT DOCUMENTS

CN        110992828       4/2020
EP         3588243        1/2020
(Continued)

OTHER PUBLICATIONS

European Patent Office Application Serial No. 20930820.4, Search Report dated Dec. 4, 2023, 11 pages.
(Continued)

*Primary Examiner* — Anthony M Haughton
*Assistant Examiner* — Hung Q Dang
(74) *Attorney, Agent, or Firm* — LEE, HONG, DEGERMAN, KANG & WAIMEY

(57) ABSTRACT

Disclosed is a display device. The display device of the present disclosure includes: a flexible display panel; a cover sheet which is located in a rearward direction of the display panel, and has a plurality of holes; and a roller which extends long, and around or from which the display panel and the cover sheet are wound or unwound, wherein the cover sheet includes: a first section which extends long along a longitudinal direction of the roller; and a second section which extends long along the longitudinal direction of the roller, and is disposed side by side with the first section in a direction intersecting with the longitudinal direction of the roller; wherein the plurality of holes include: a plurality of first holes which are located in the first section, and disposed at a first interval; and a plurality of second holes which are located in the second section, and disposed at a second interval different from the first interval.

14 Claims, 76 Drawing Sheets

(56) References Cited

U.S. PATENT DOCUMENTS

2017/0364122 A1    12/2017    Kim et al.
2020/0103741 A1    4/2020    Song et al.

FOREIGN PATENT DOCUMENTS

| KR | 1020160148141 | | 12/2016 | | |
|---|---|---|---|---|---|
| KR | 1020180040181 | | 4/2018 | | |
| KR | 10-1945985 | | 2/2019 | | |
| KR | 101966787 | | 4/2019 | | |
| KR | 1020190080740 | | 7/2019 | | |
| KR | 1019667870000 | * | 8/2019 | ............... | G09F 9/30 |
| KR | 1020200030265 | | 3/2020 | | |
| KR | 10-2020-0036580 | | 4/2020 | | |

OTHER PUBLICATIONS

PCT International Application No. PCT/KR2020/005044, Search Report dated Jan. 12, 2021, 3 pages.
Korean Intellectual Property Office Application No. 10-2022-7038935, Office Action dated Aug. 21, 2024, 7 pages.

\* cited by examiner

[FIG. 1]
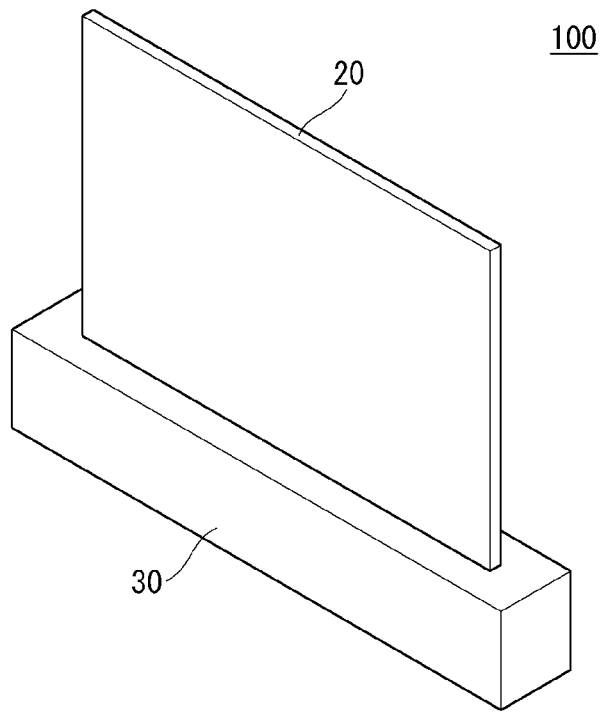
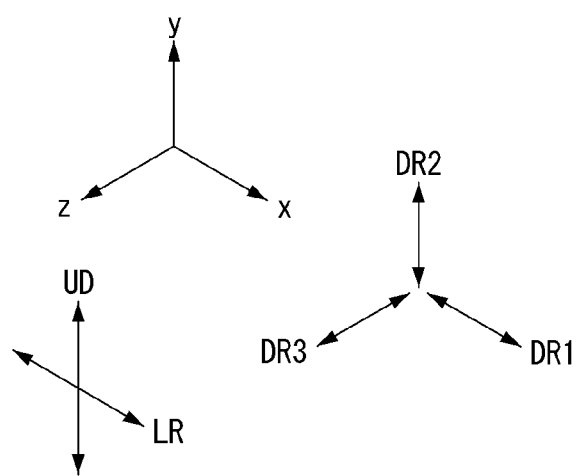

[FIG. 2]
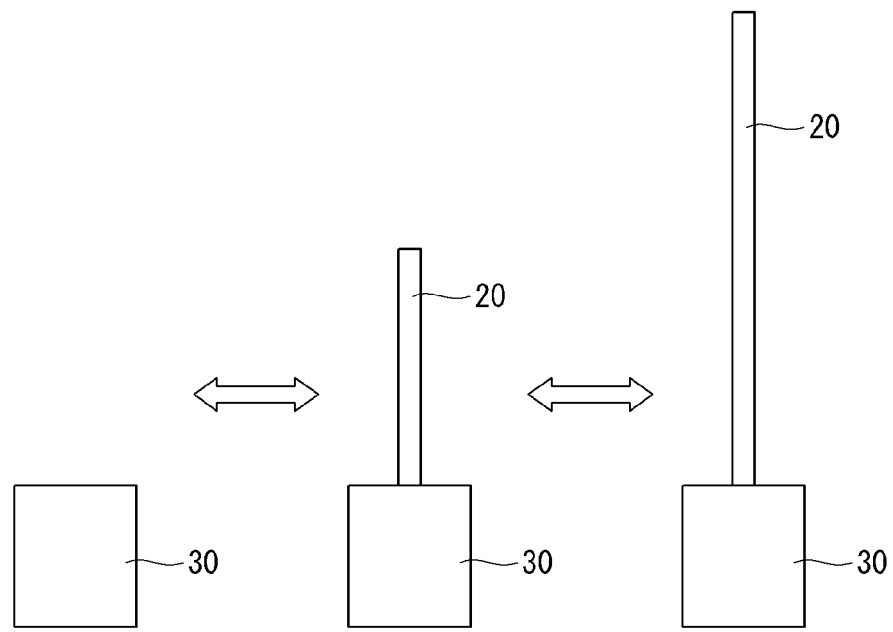

[FIG. 3]
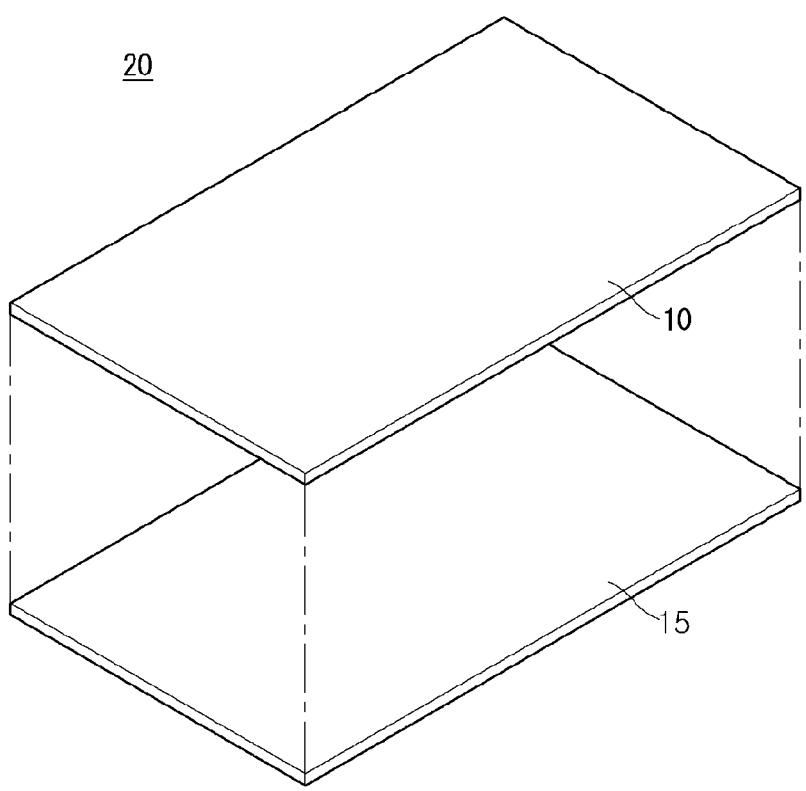

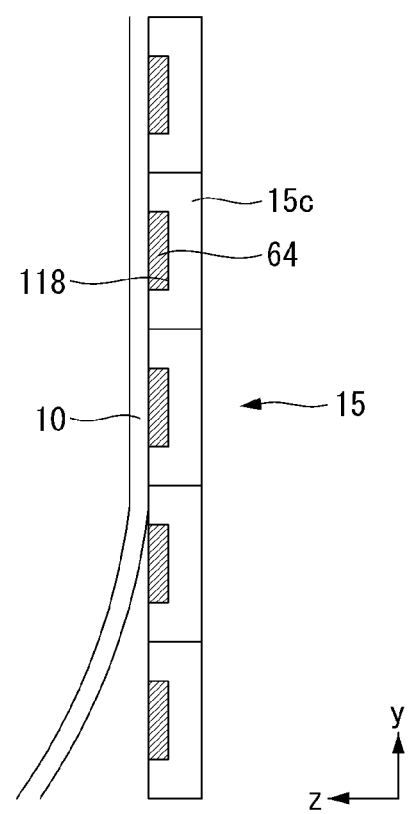
[FIG. 4]

[FIG. 5]
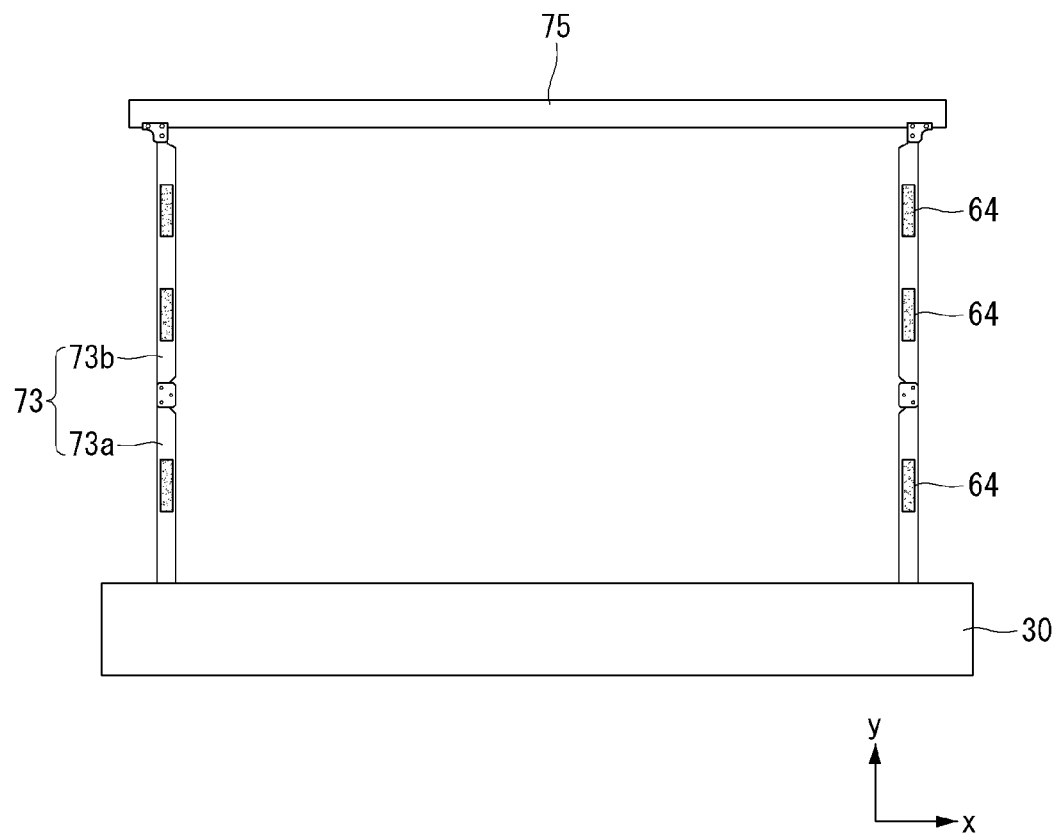

[FIG. 6]
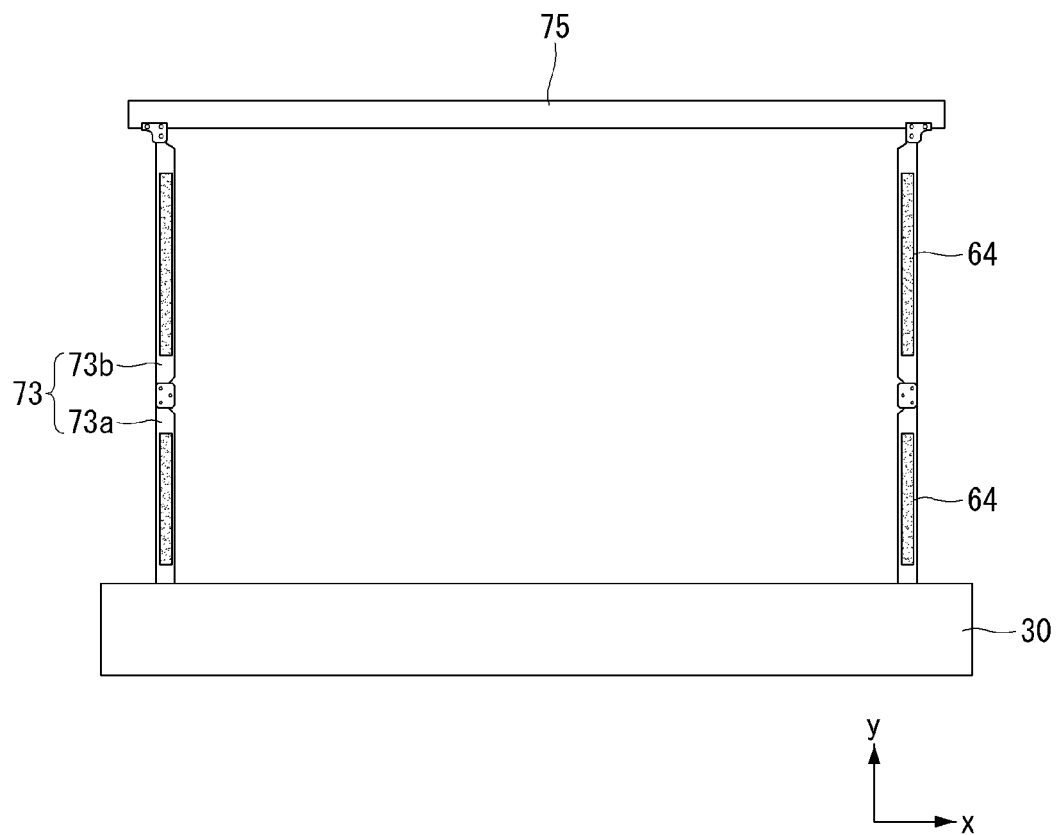

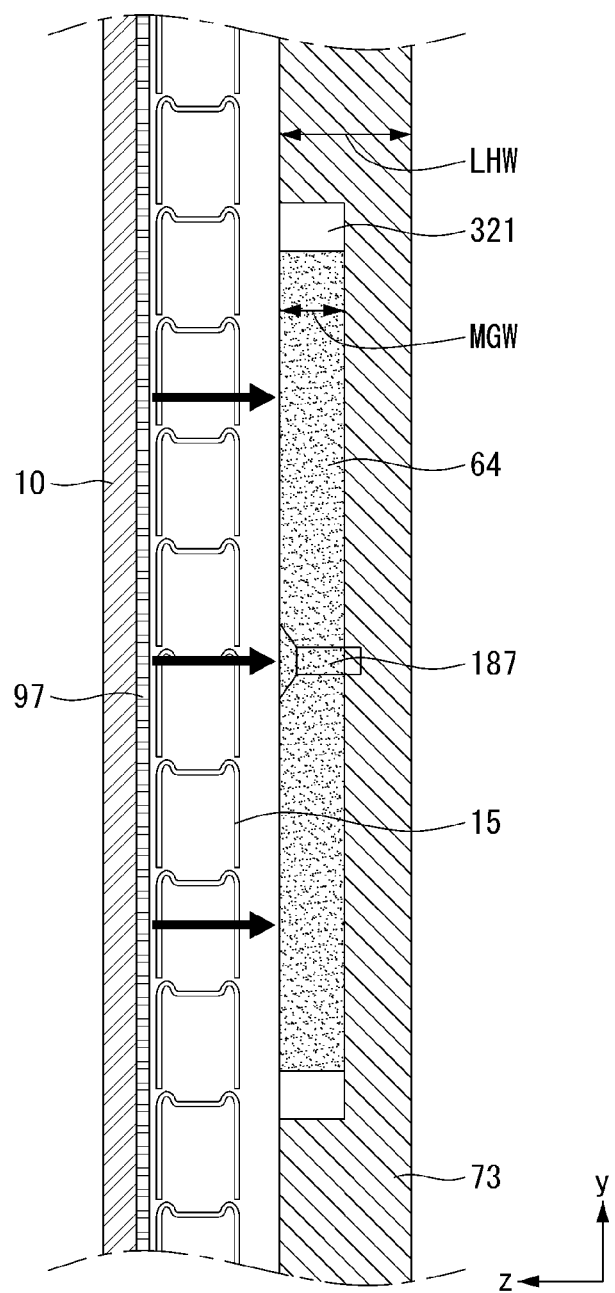
[FIG. 7]

[FIG. 8]
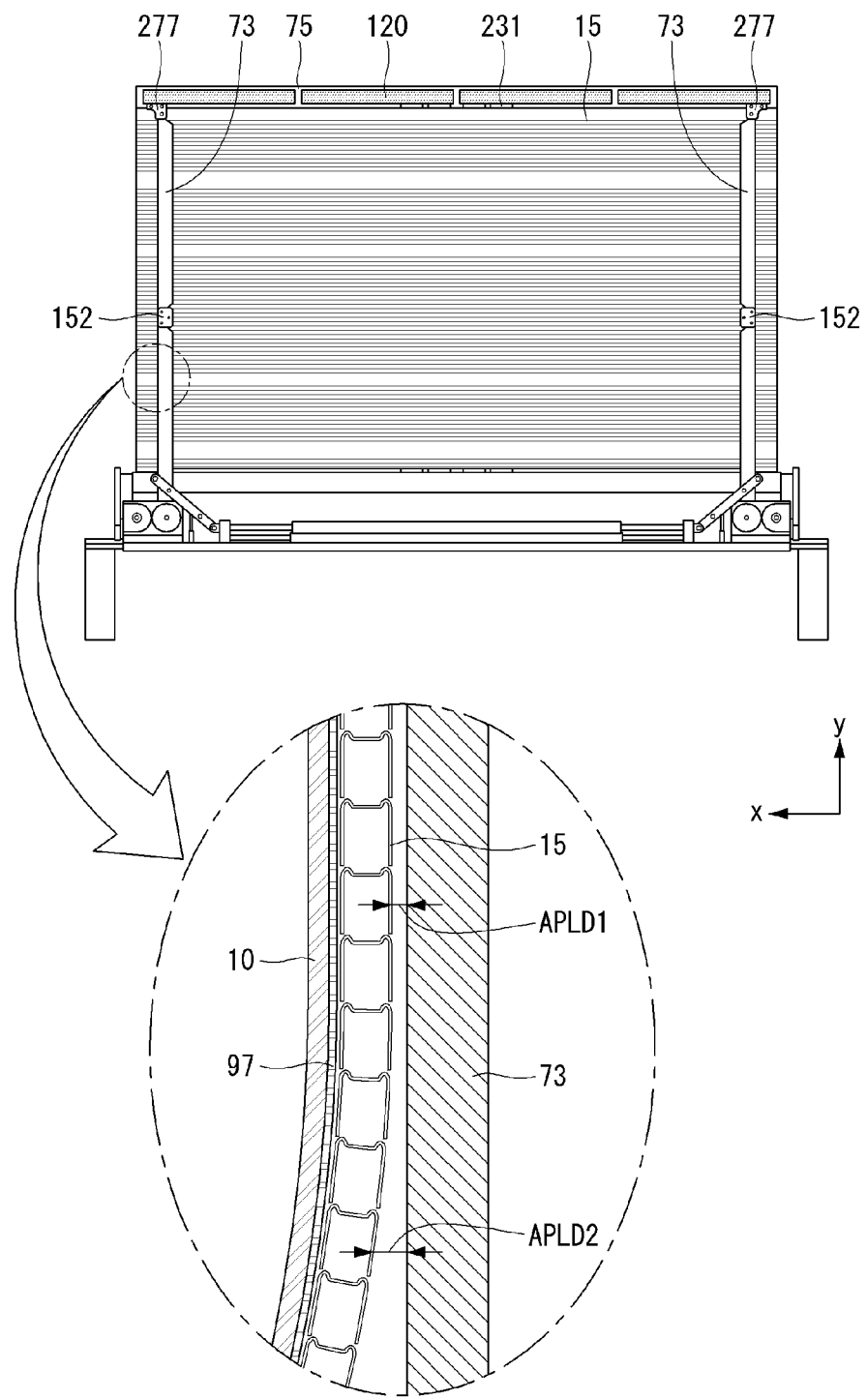

[FIG. 9]
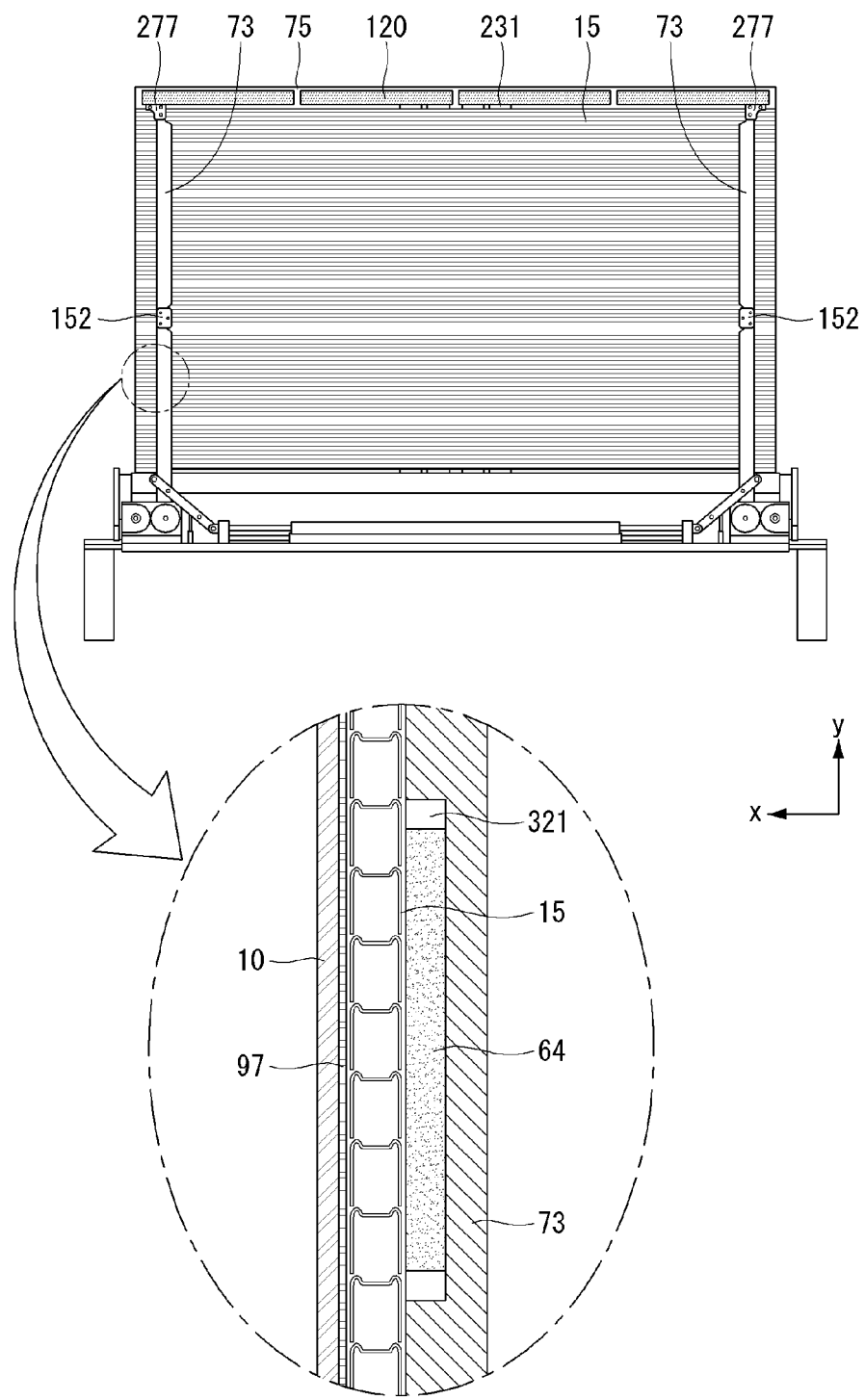

[FIG. 10]
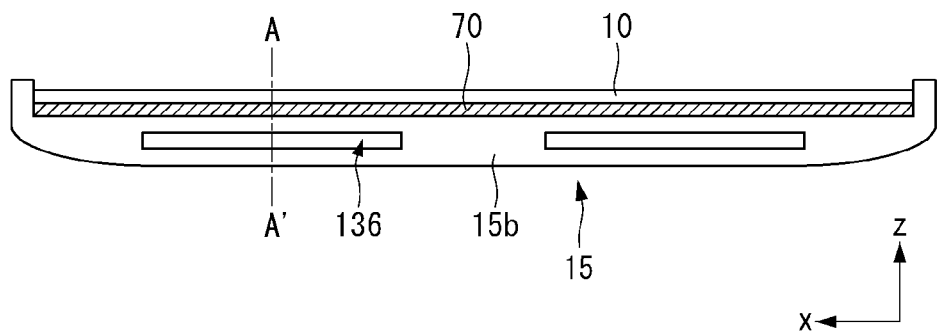
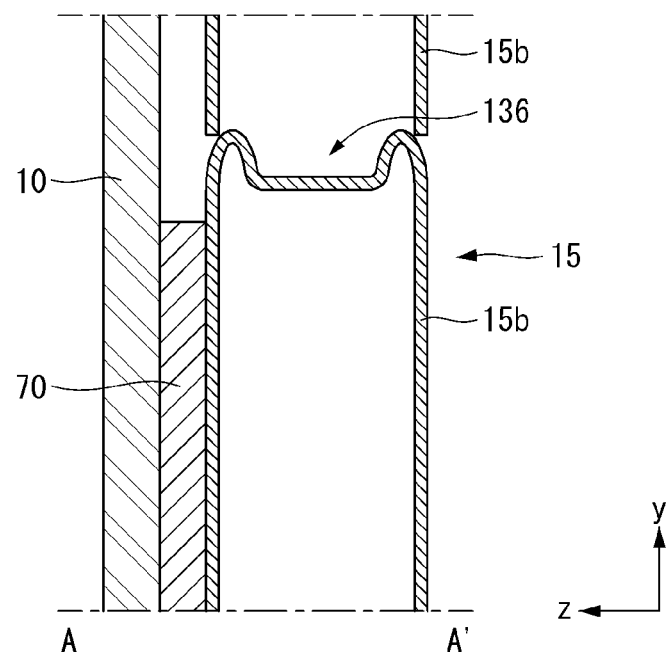

[FIG. 11]
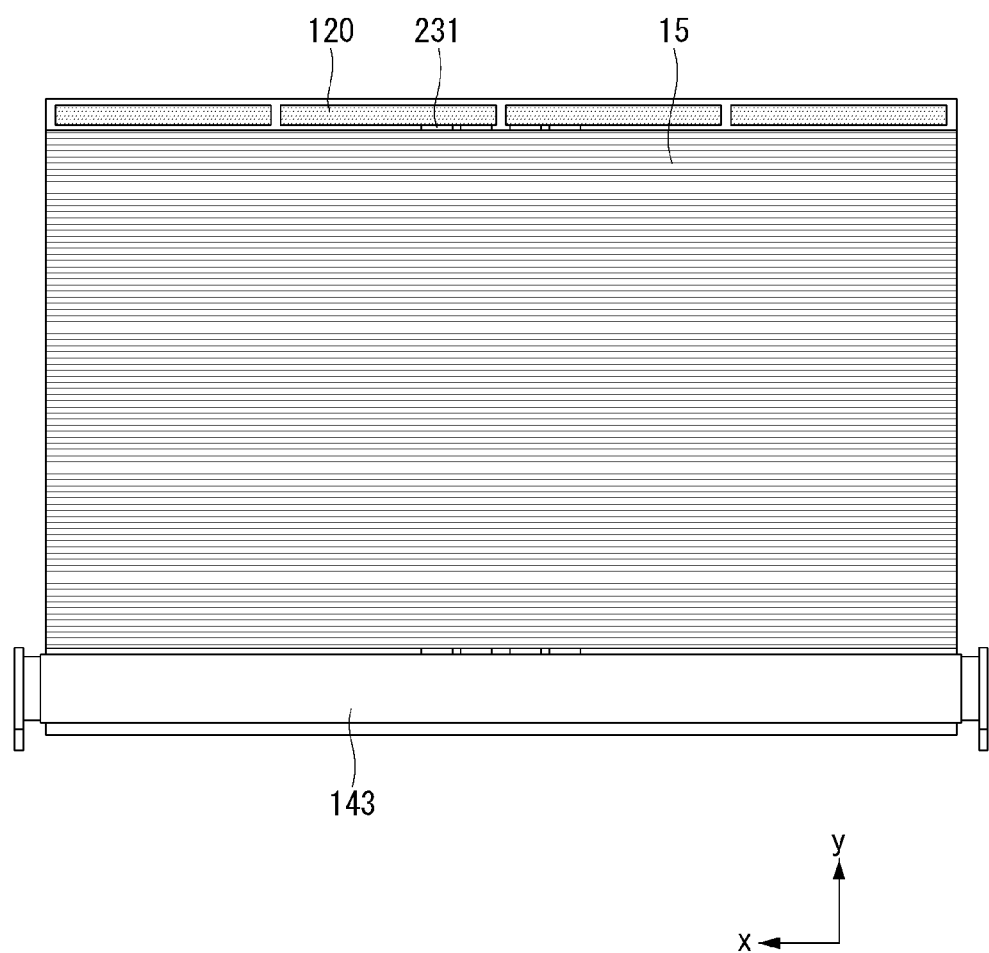

[FIG. 12]
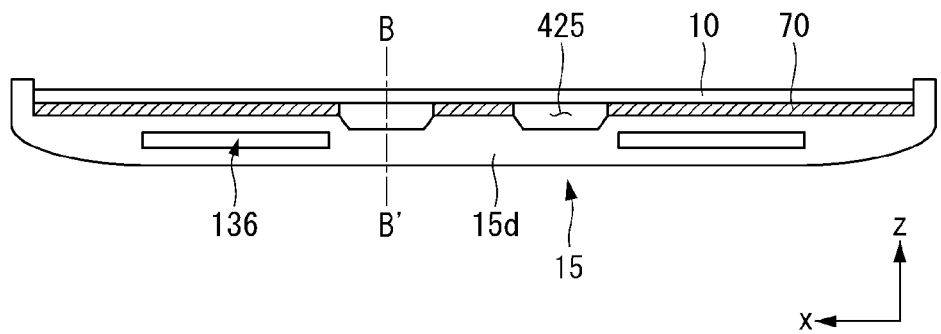
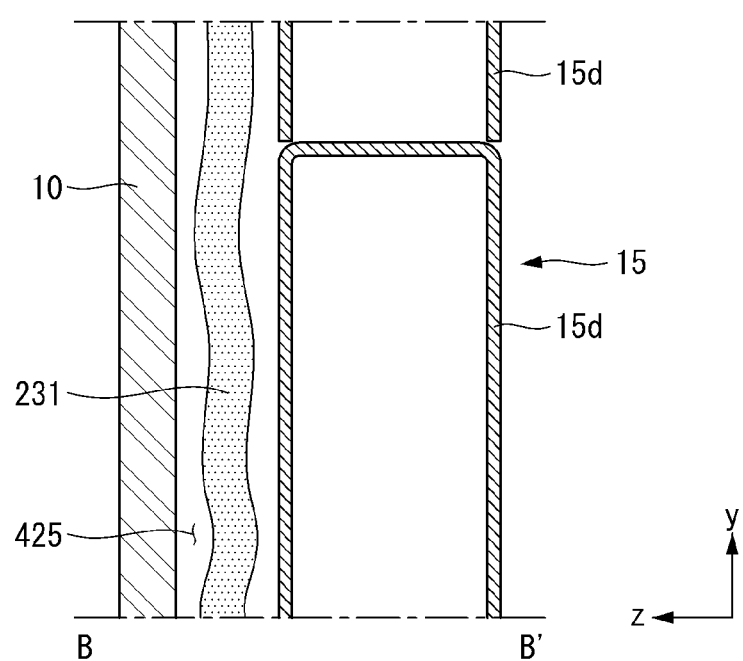

[FIG. 13]
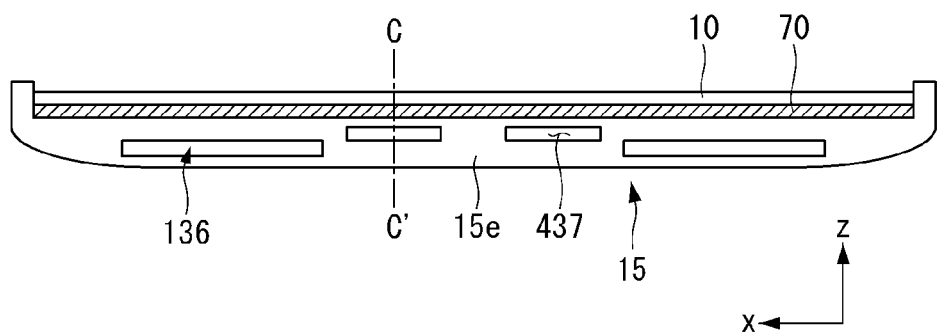
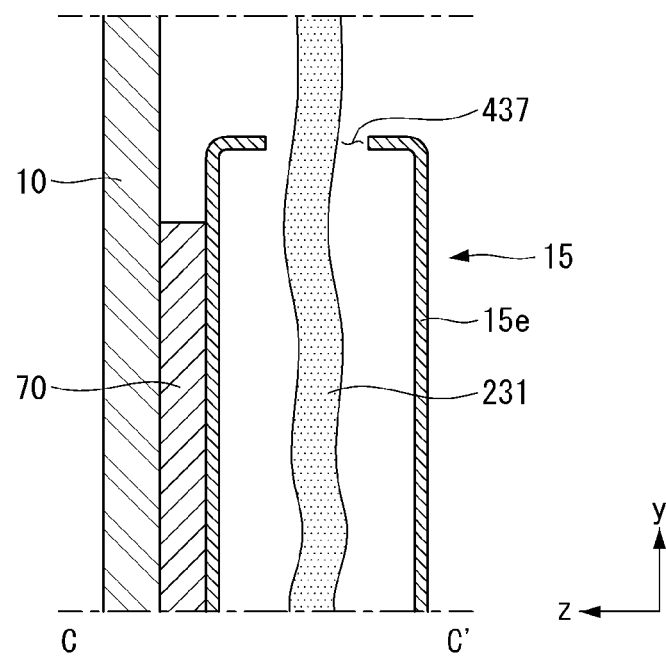

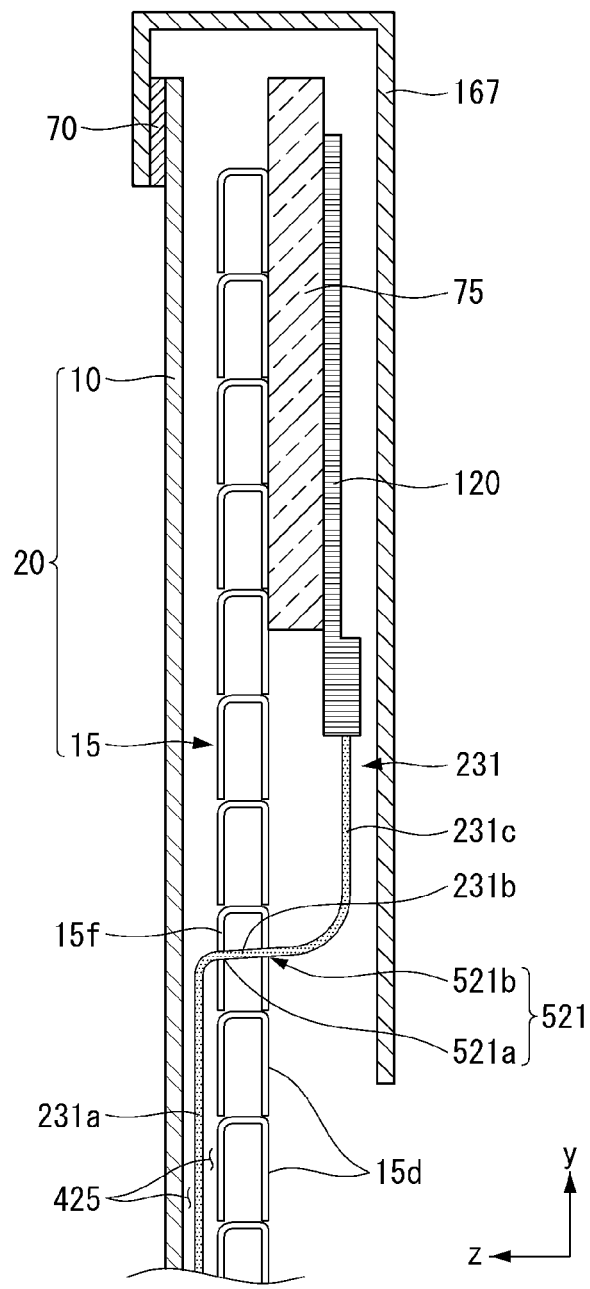
[FIG. 14]

[FIG. 15]
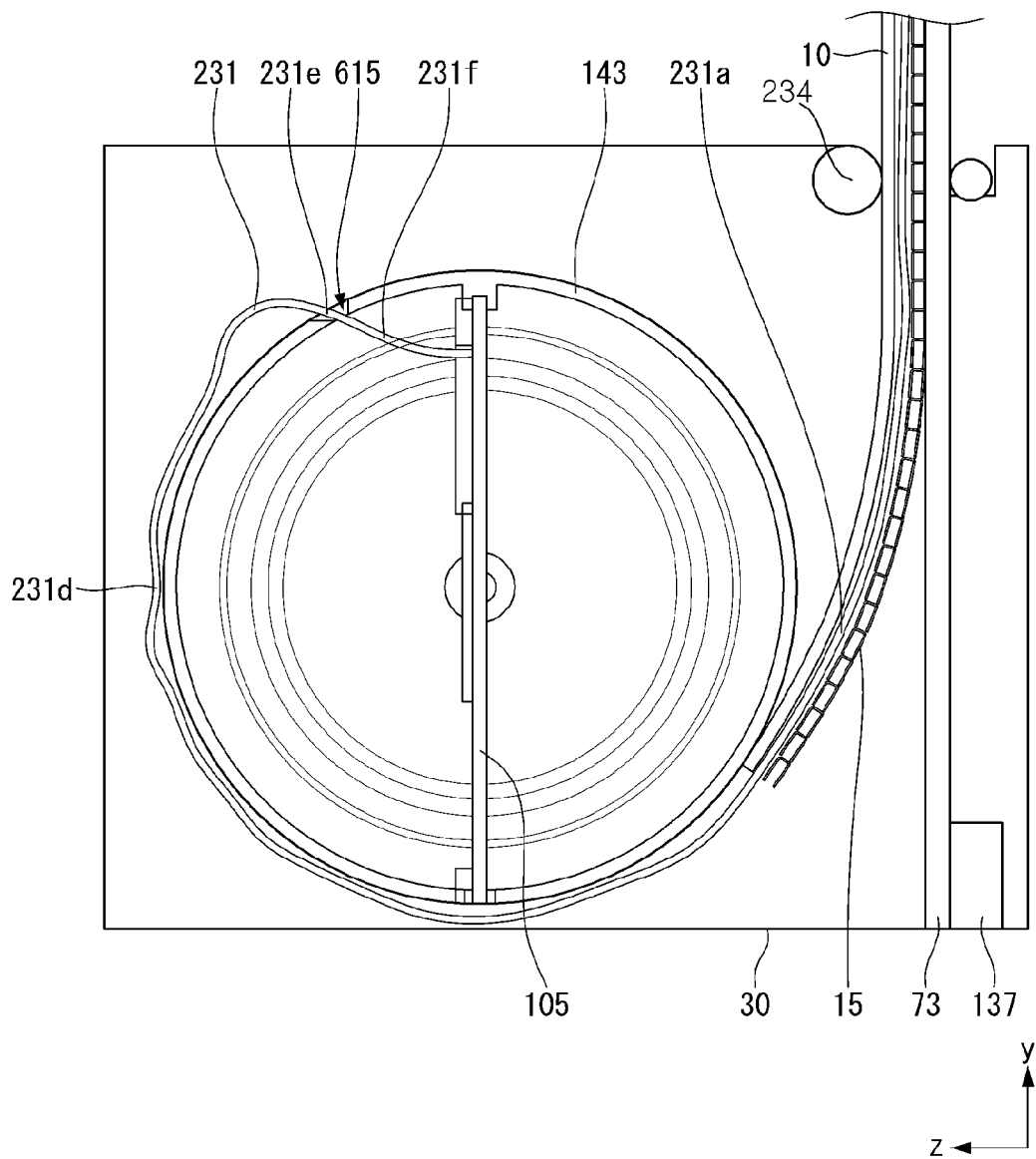

[FIG. 16]
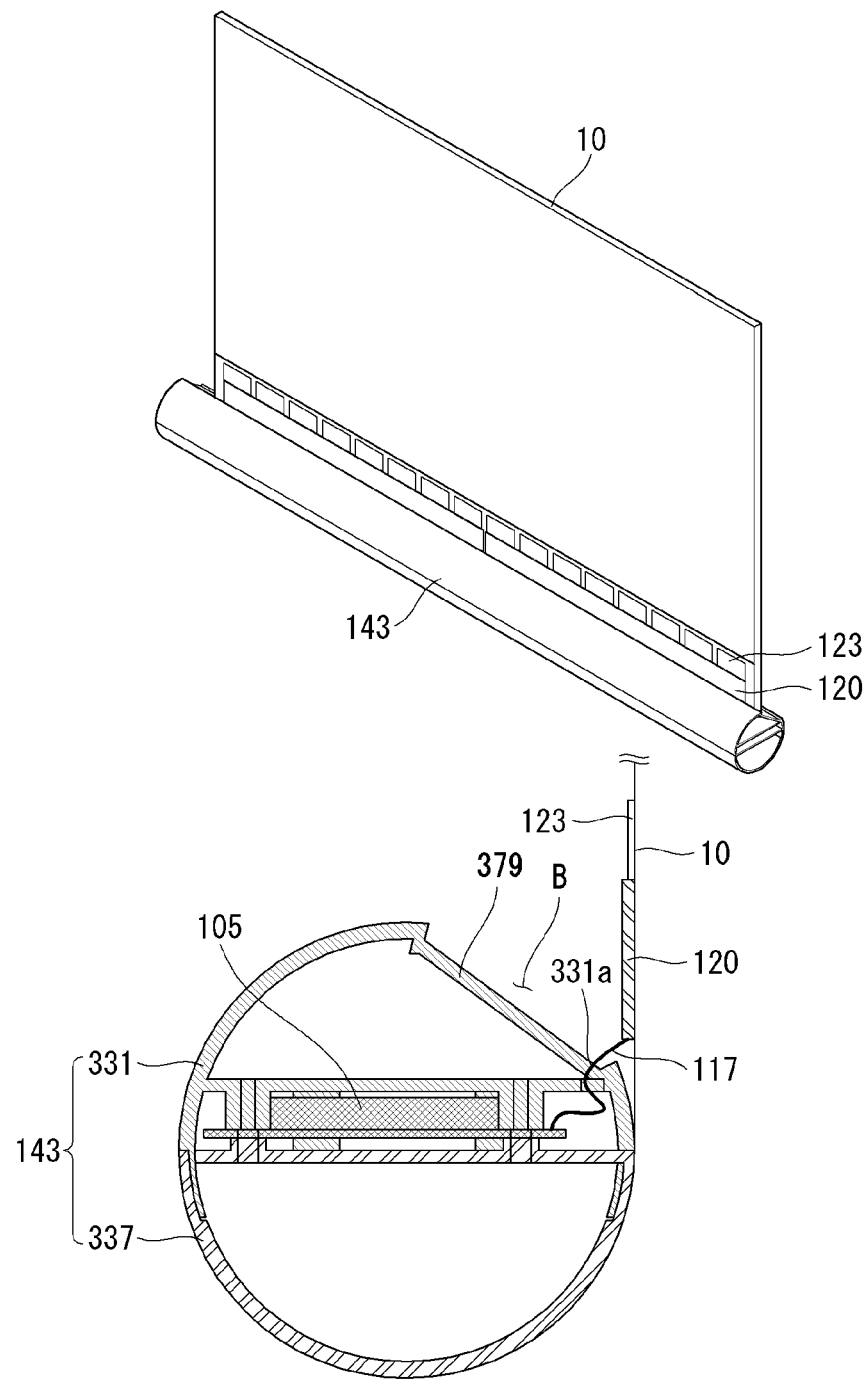

[FIG. 17]
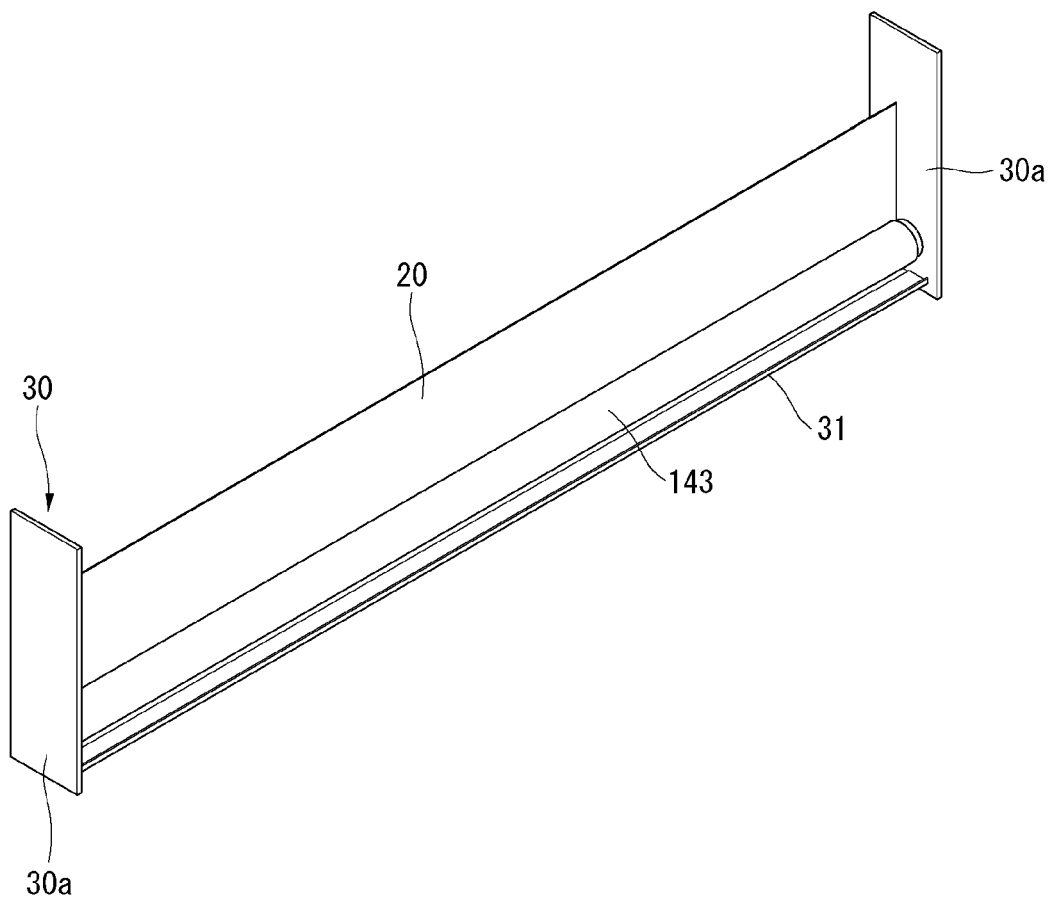

[FIG. 18]
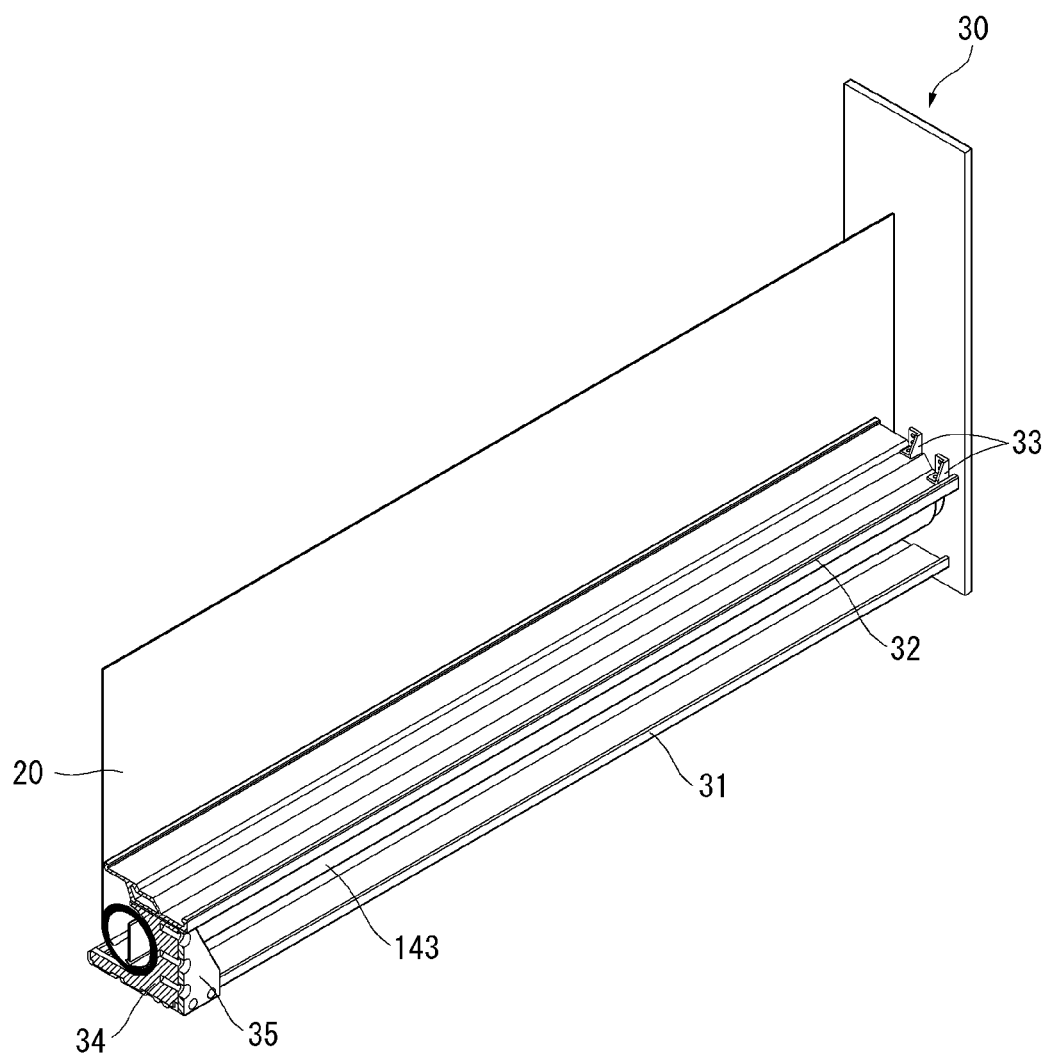

[FIG. 19]
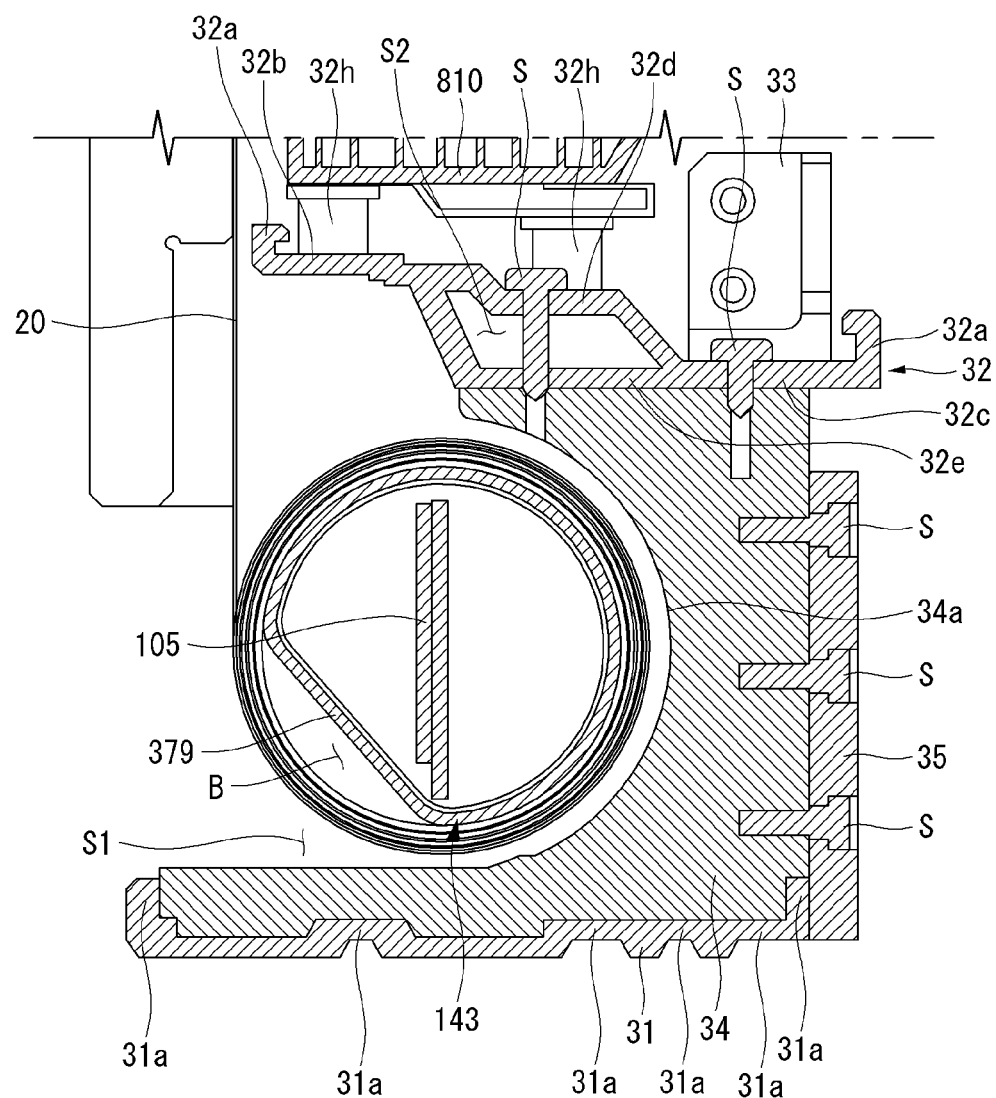

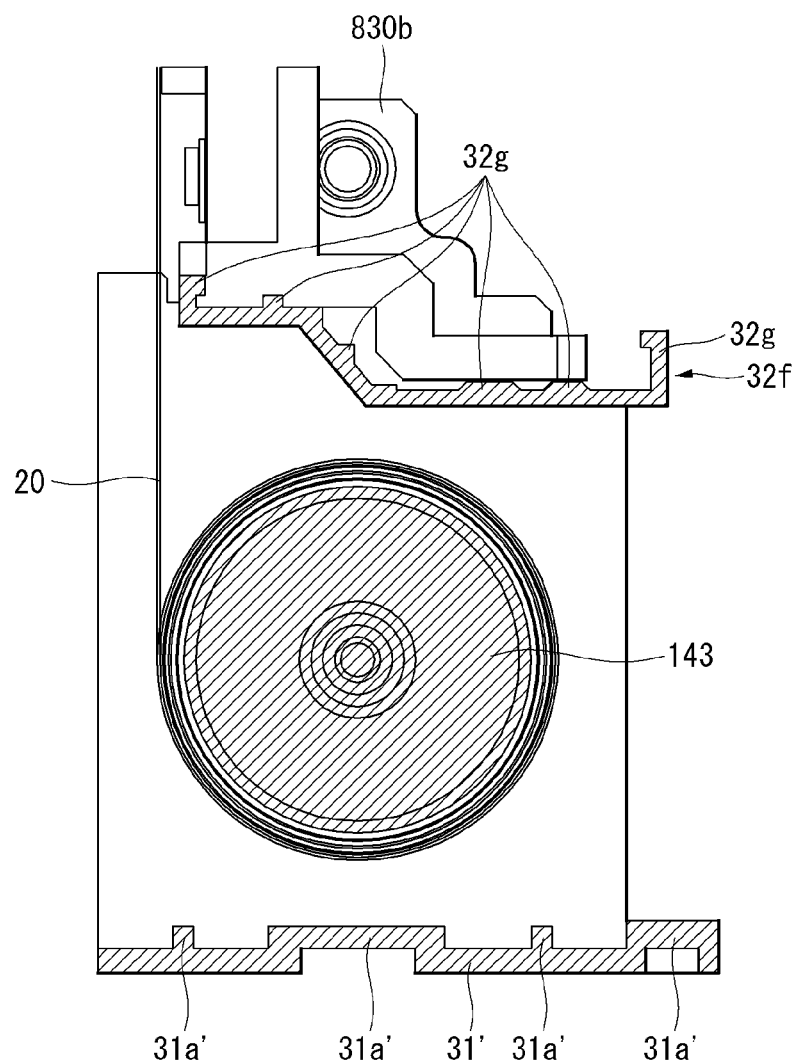
[FIG. 20]

[FIG. 21]
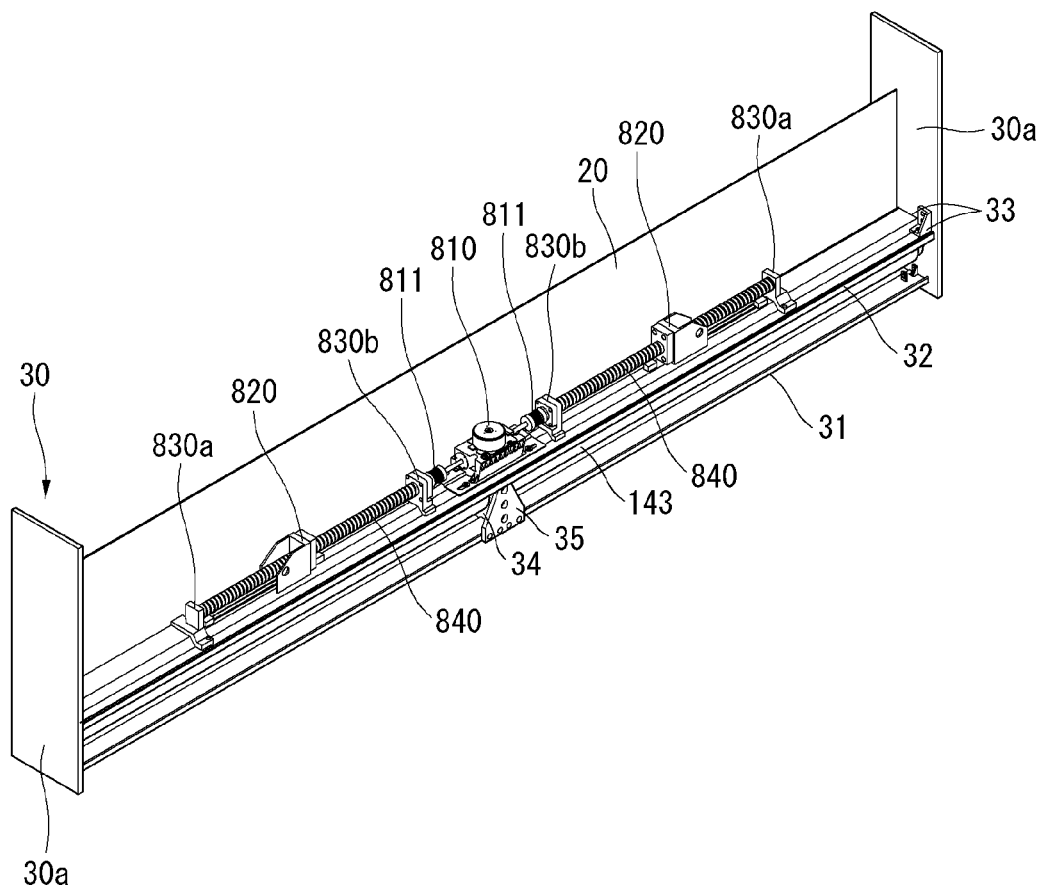

[FIG. 22]
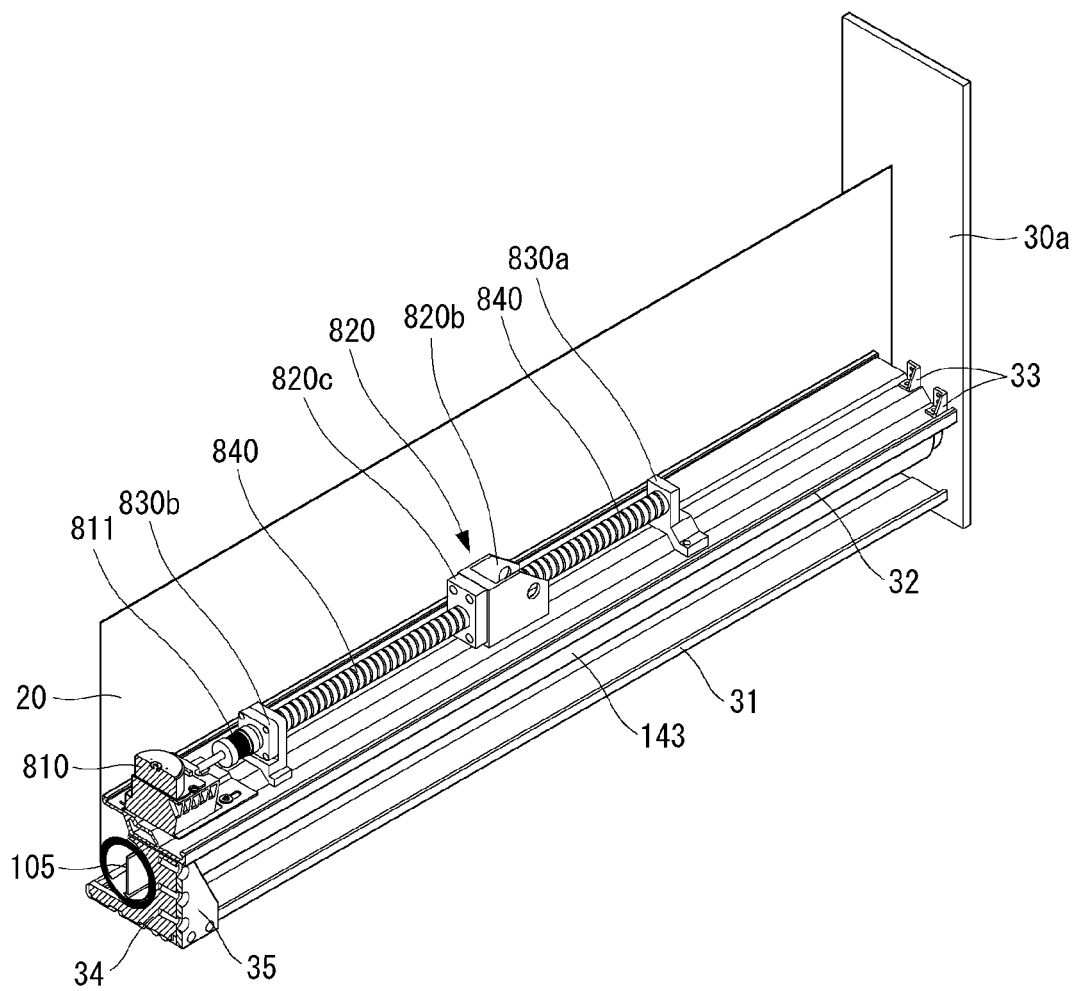

[FIG. 23]
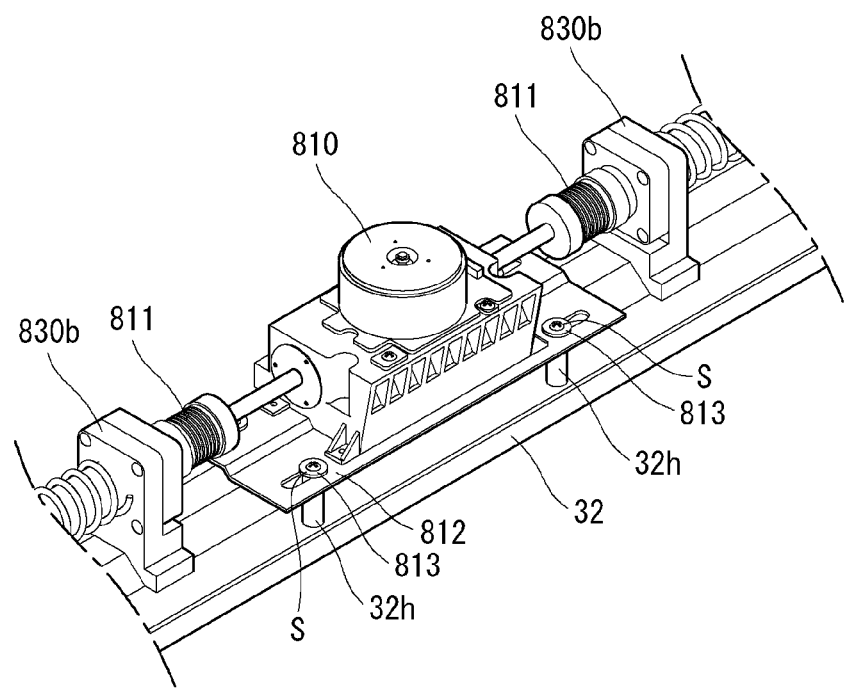

[FIG. 24]
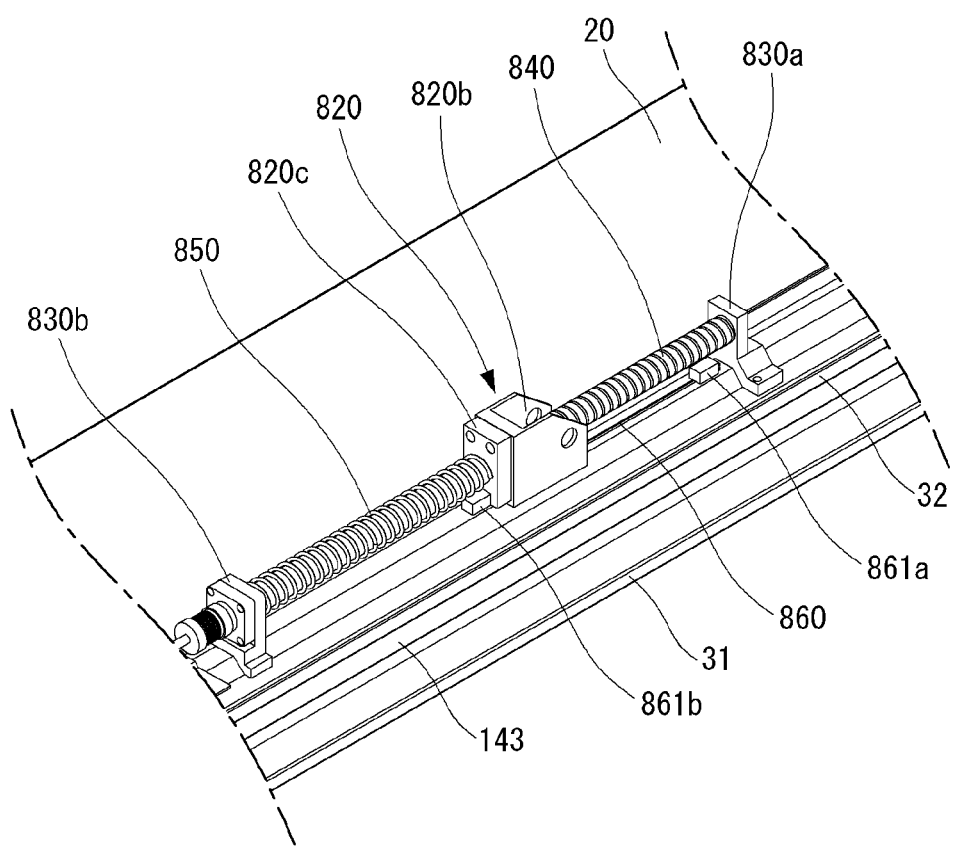

[FIG. 25]
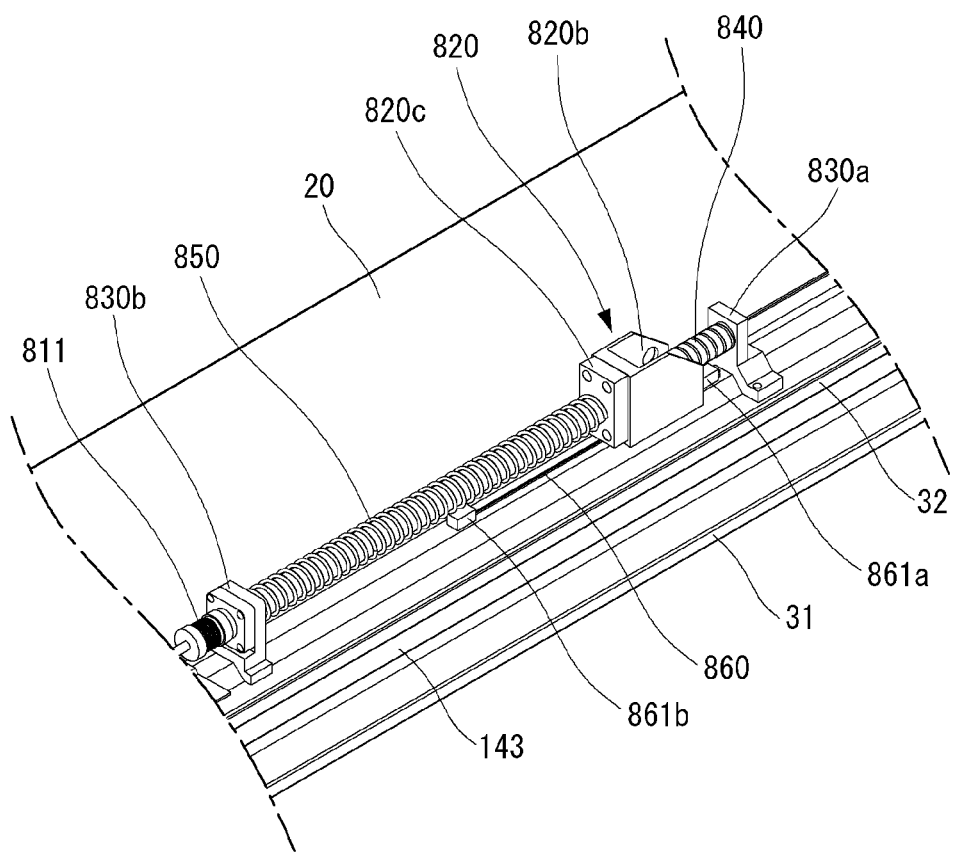

[FIG. 26]
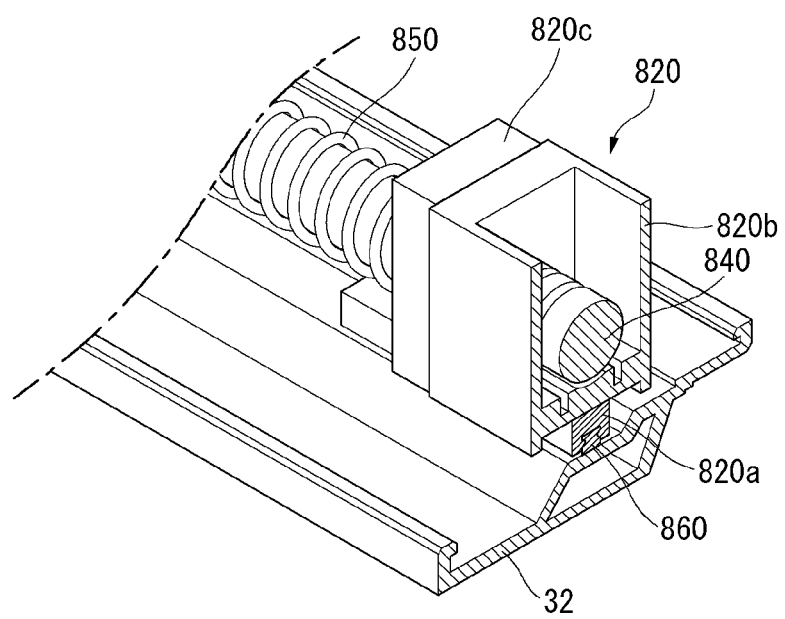

[FIG. 27]
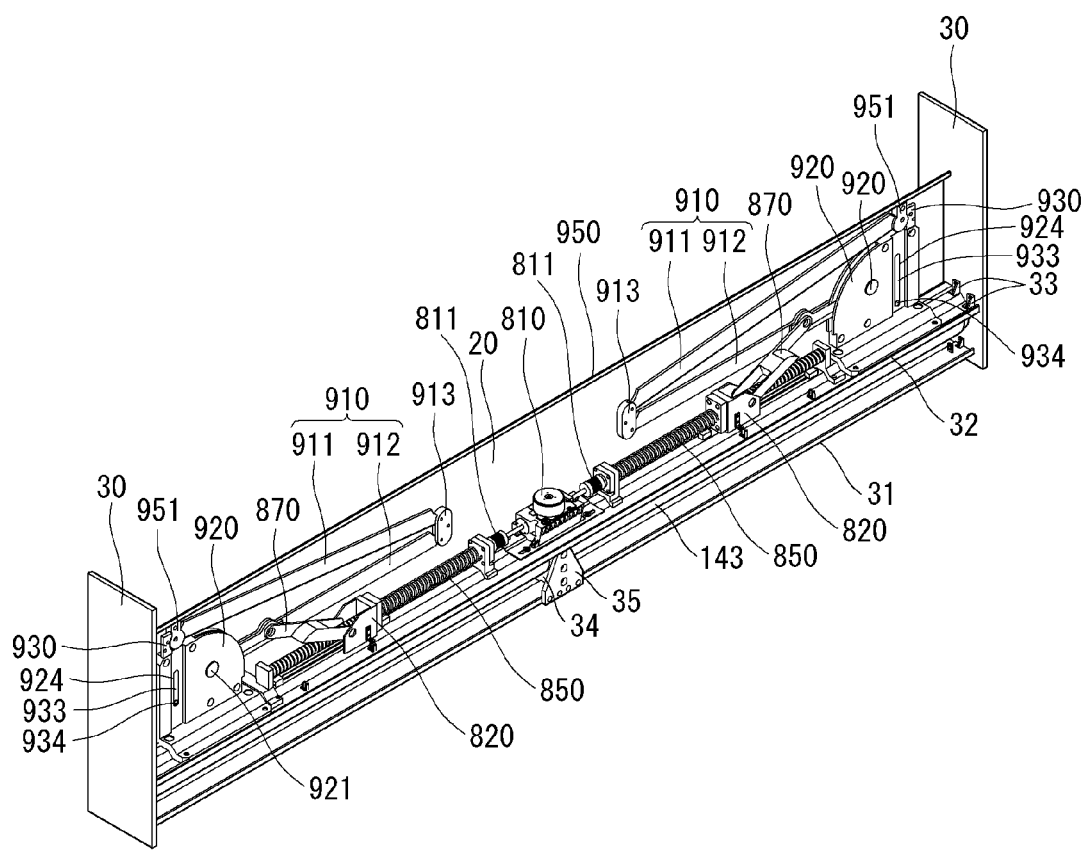

[FIG. 28]
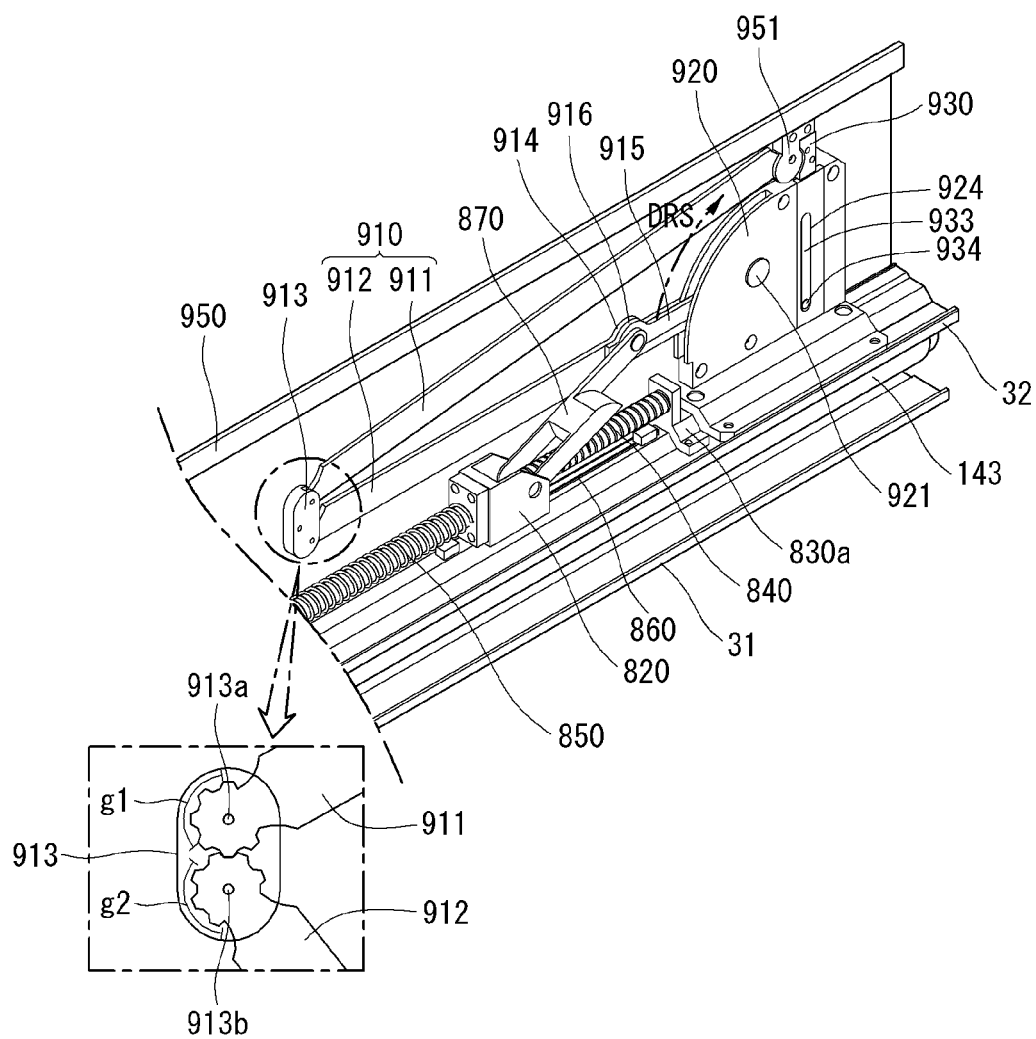

[FIG. 29]
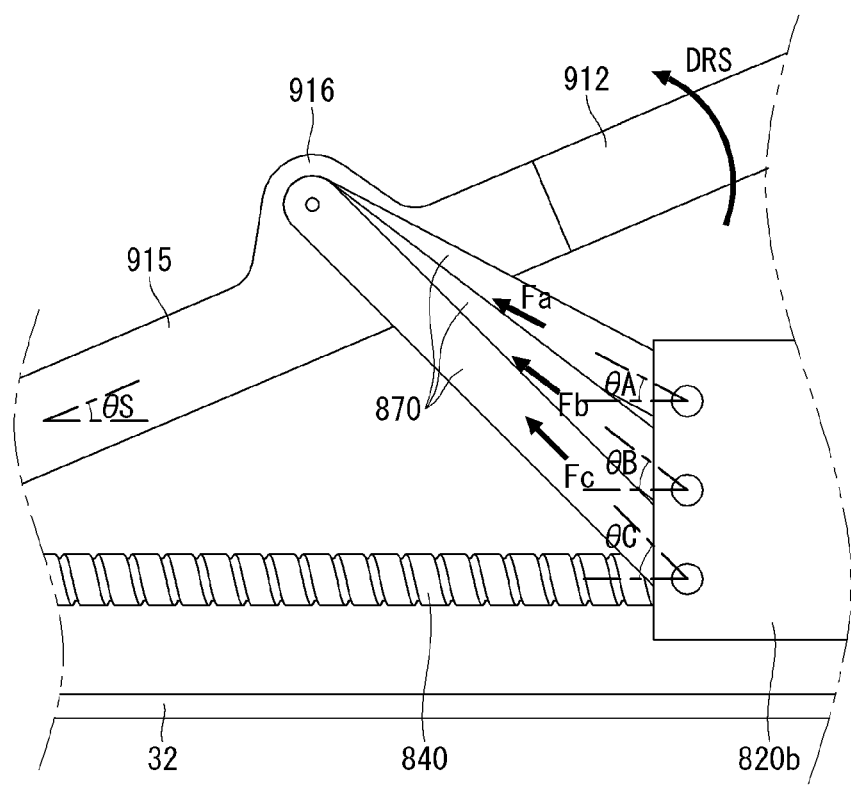

[FIG. 30]
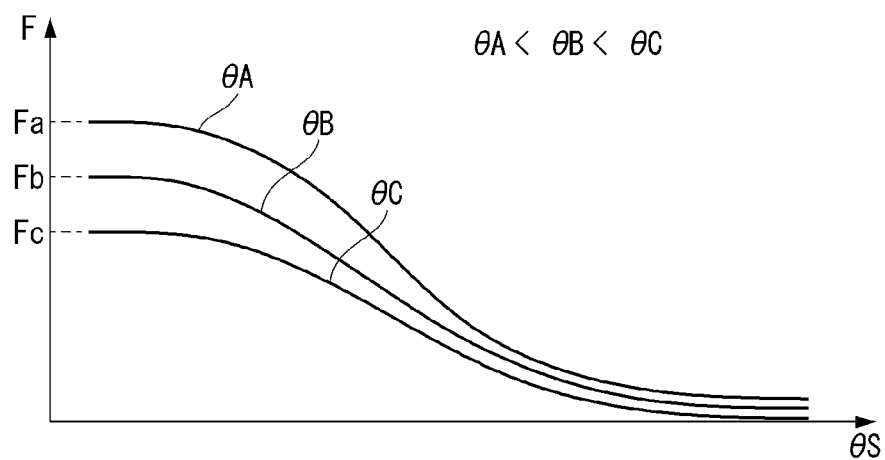

[FIG. 31]
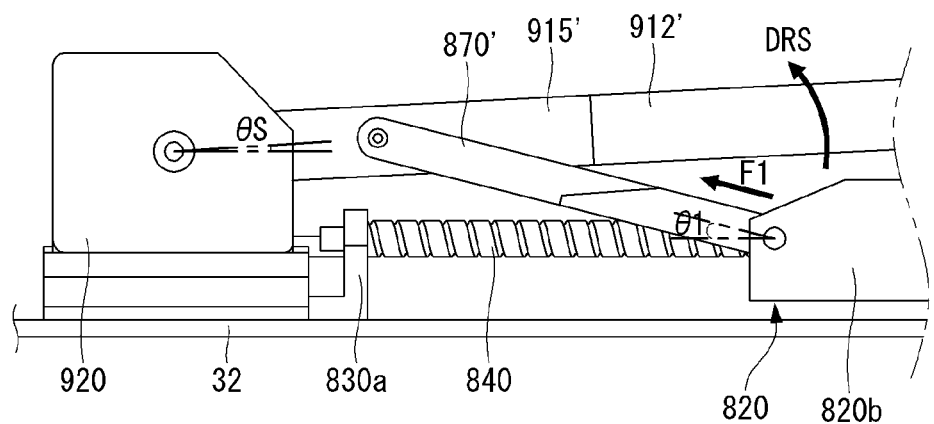

[FIG. 32]
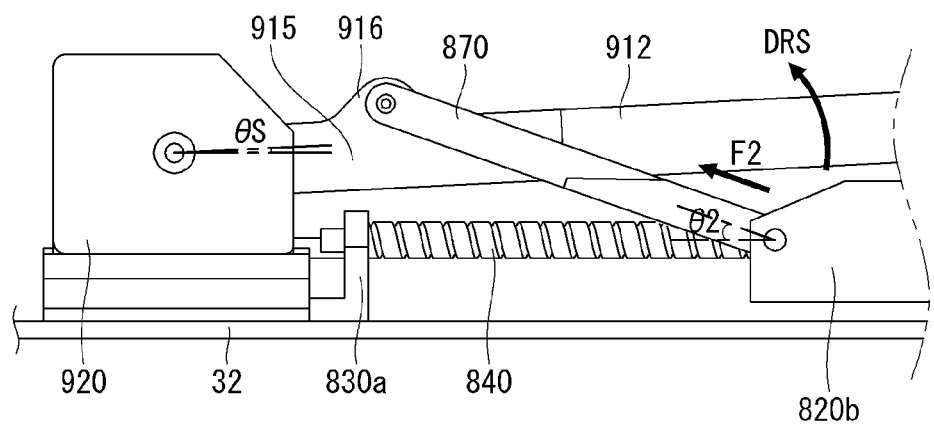

[FIG. 33]
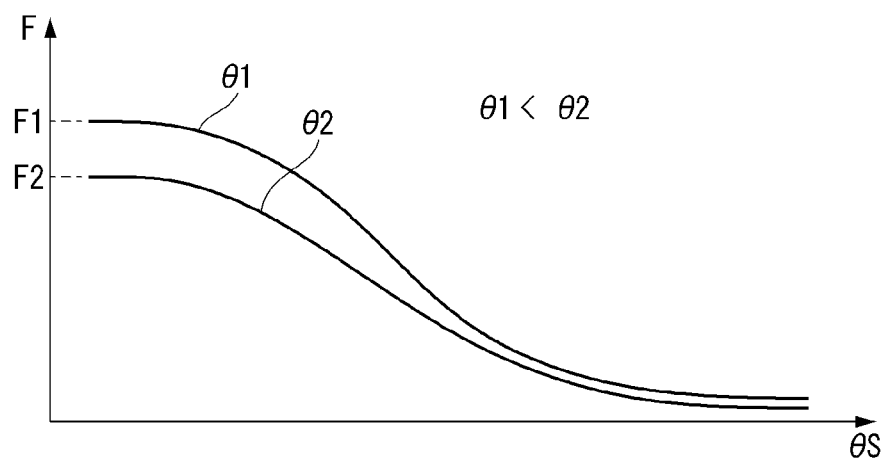

[FIG. 34]
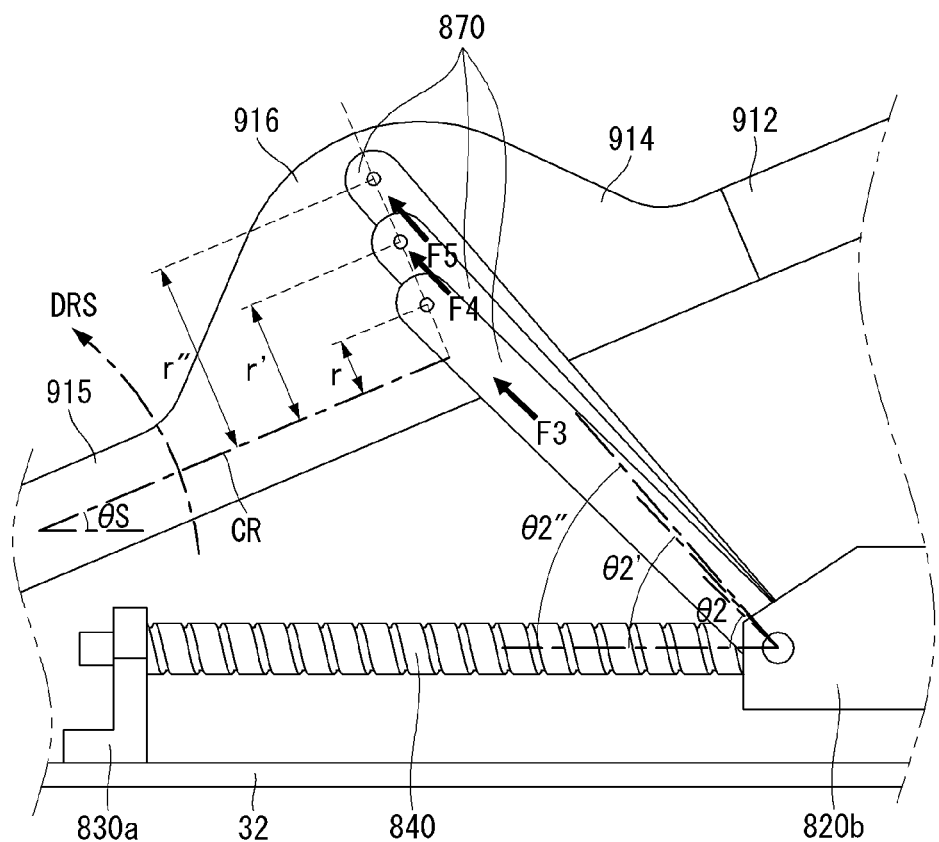

[FIG. 35]
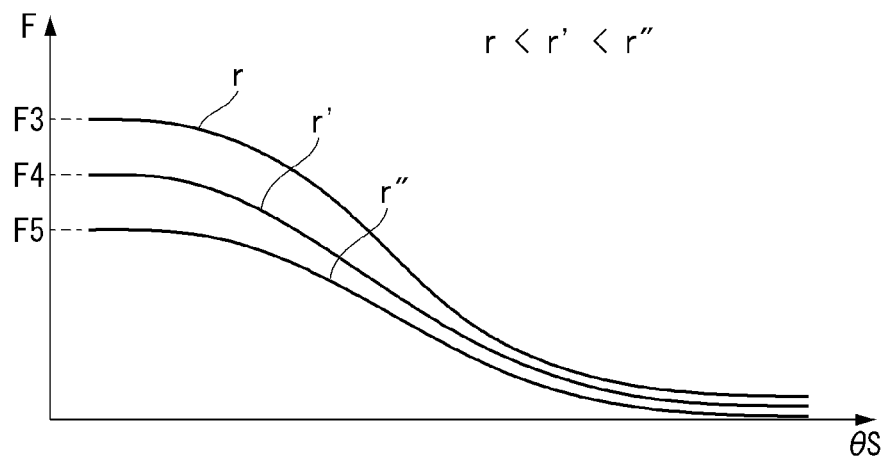

[FIG. 36]
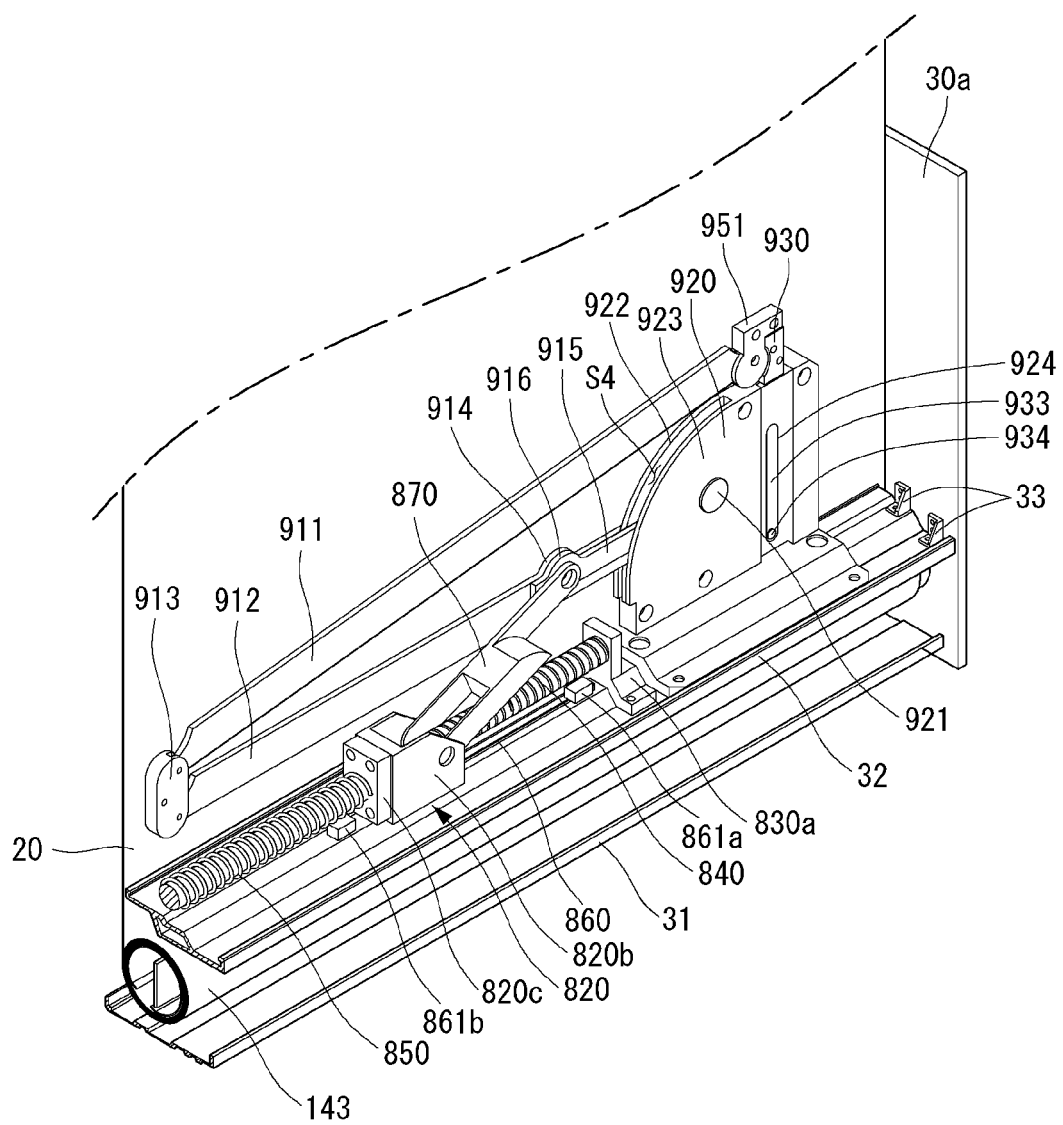

[FIG. 37]
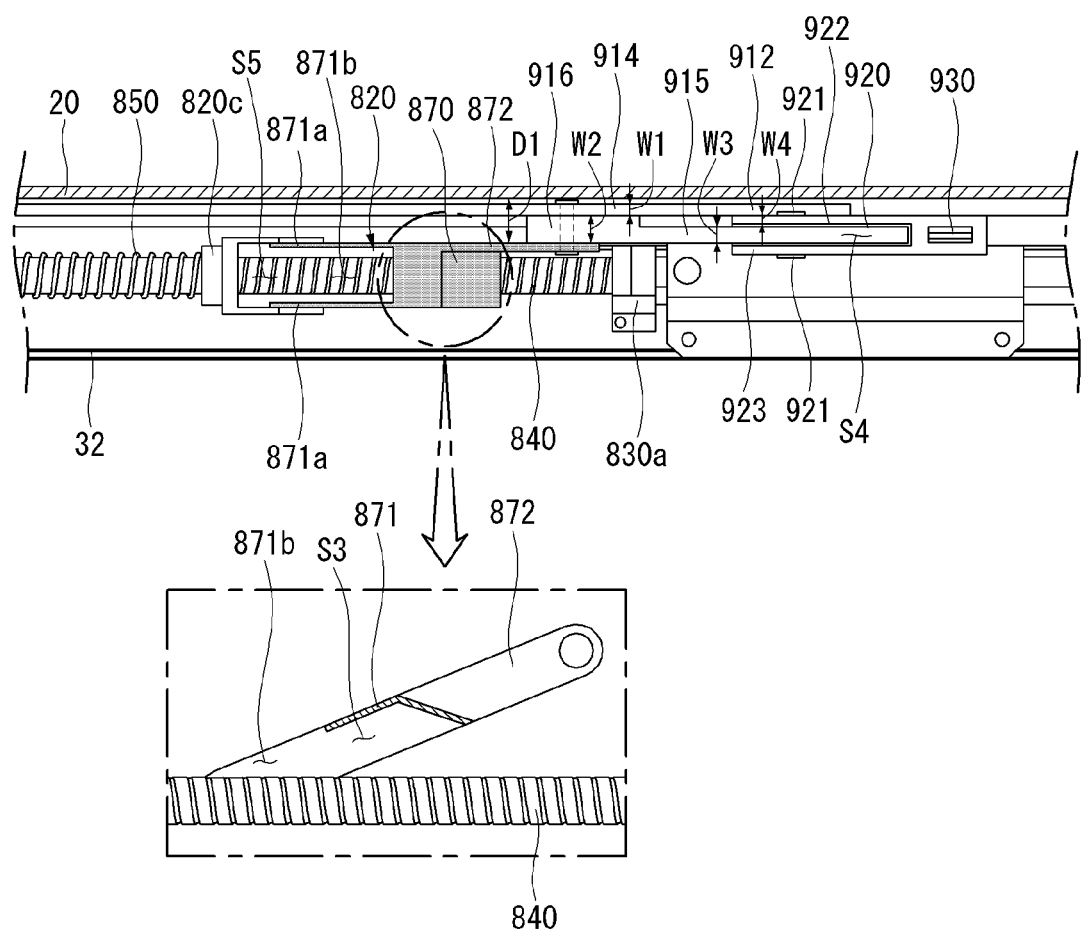

[FIG. 38]
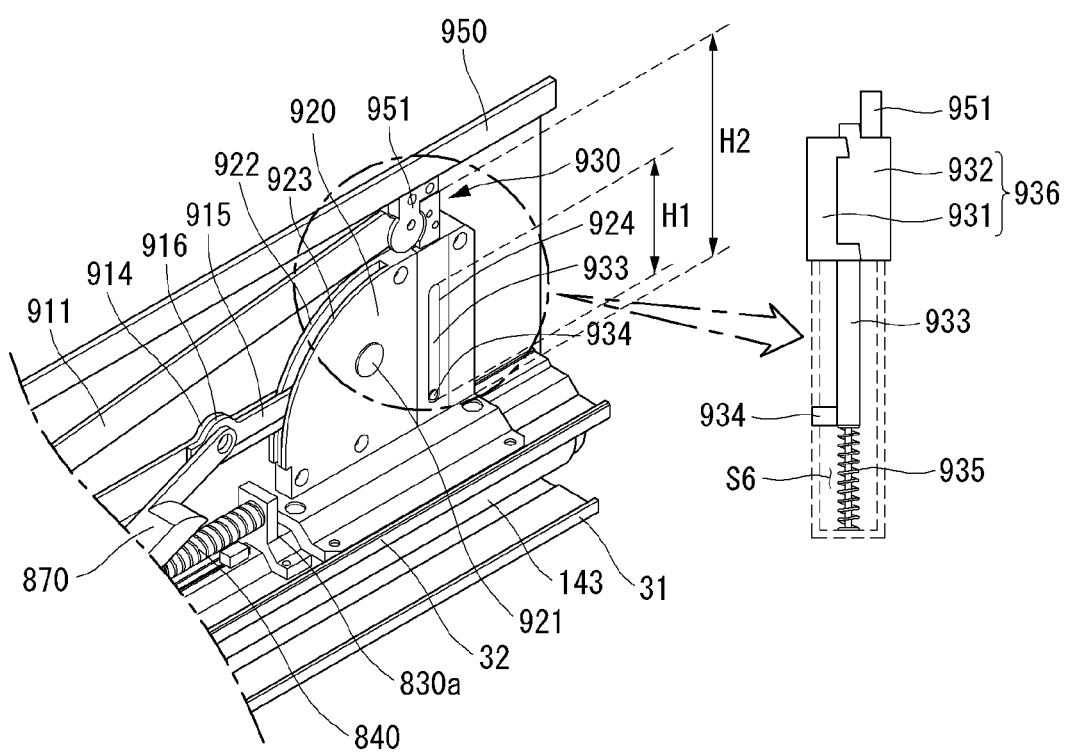

[FIG. 39]
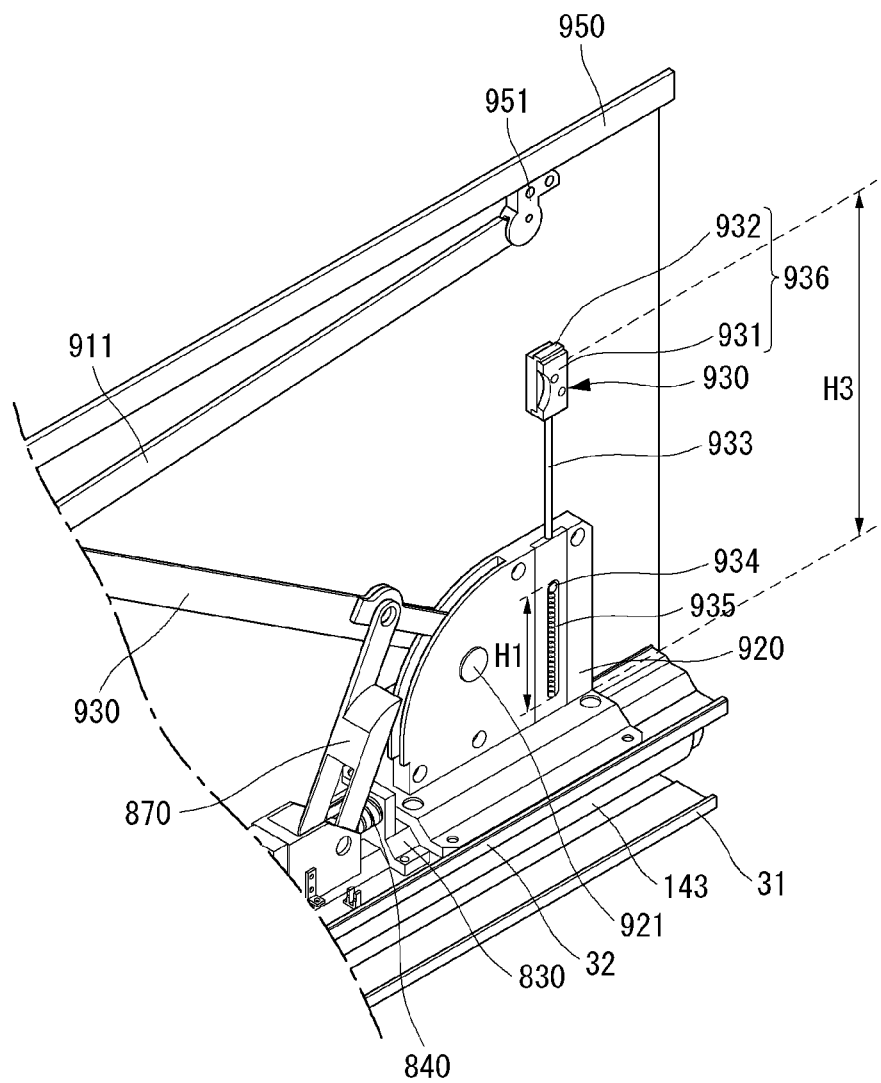

[FIG. 40]
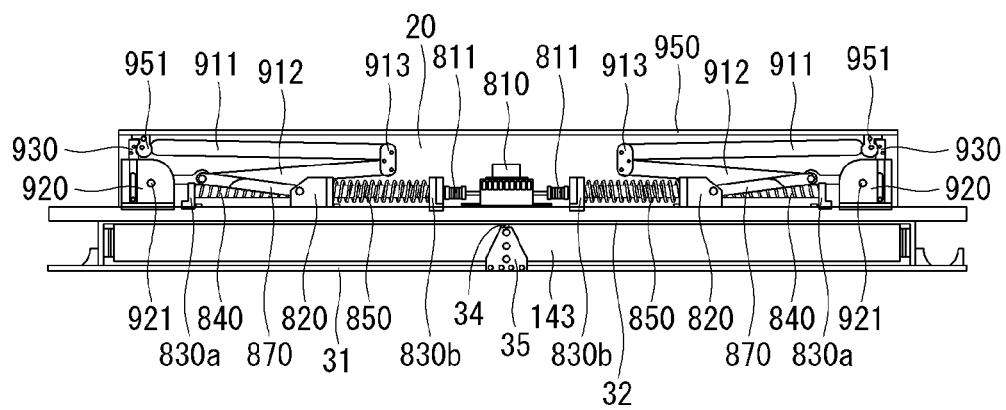

[FIG. 41]
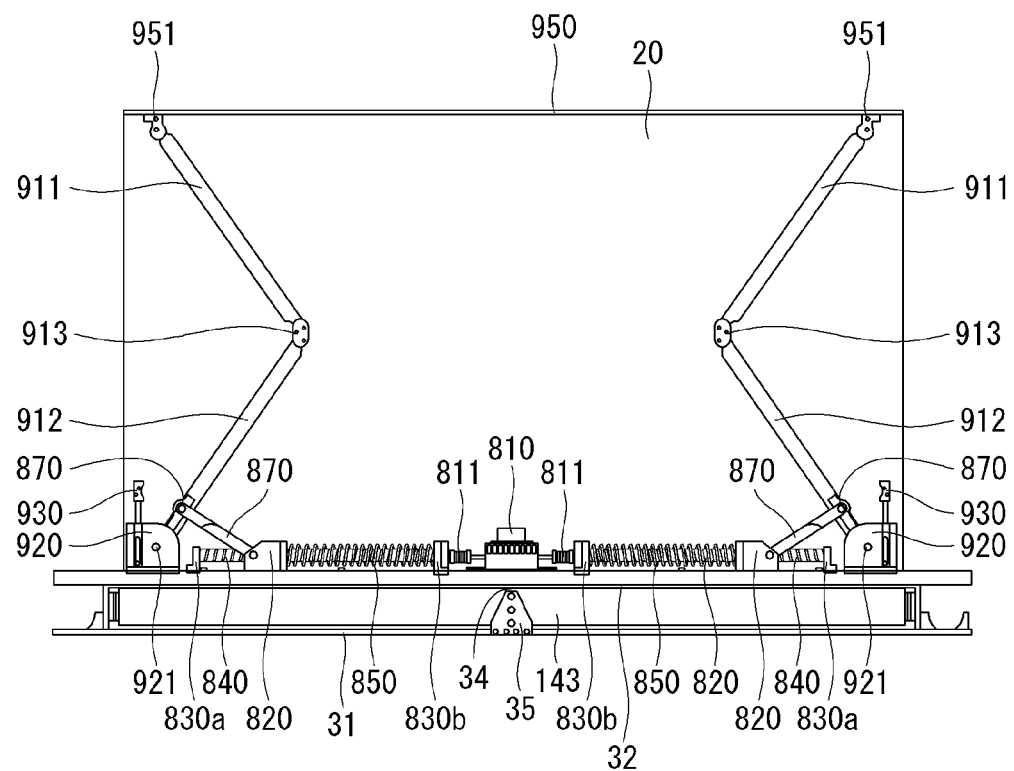

[FIG. 42]
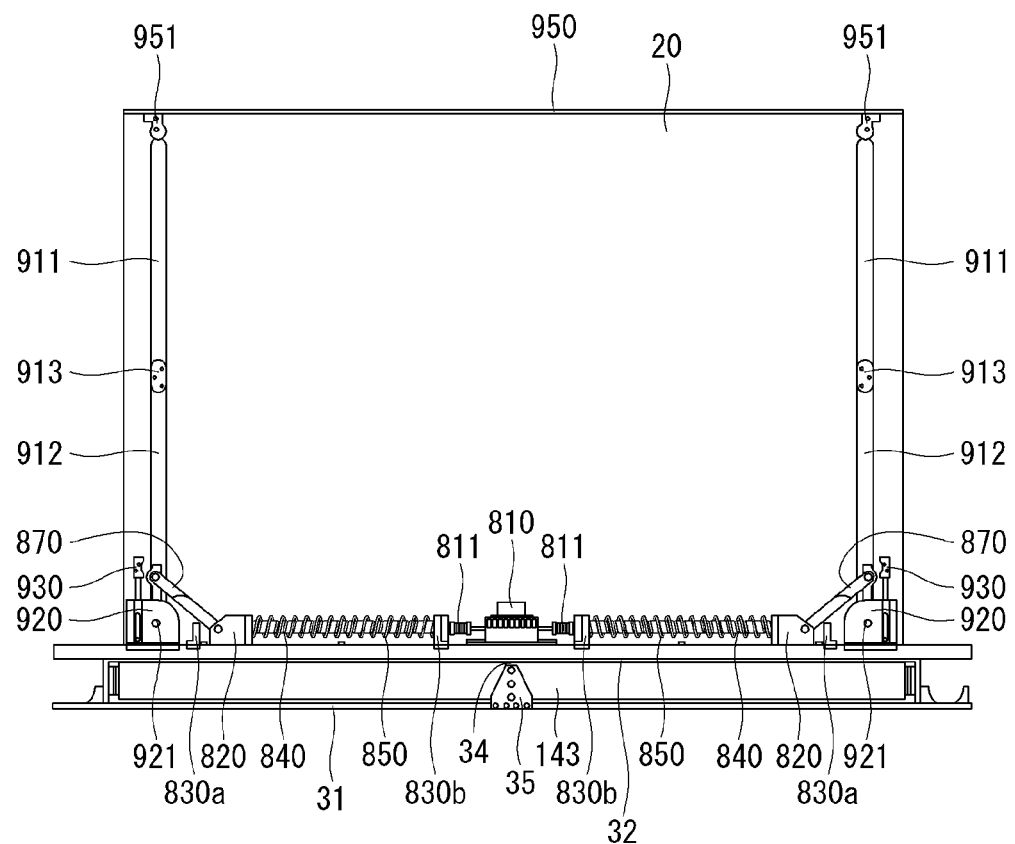

[FIG. 43]
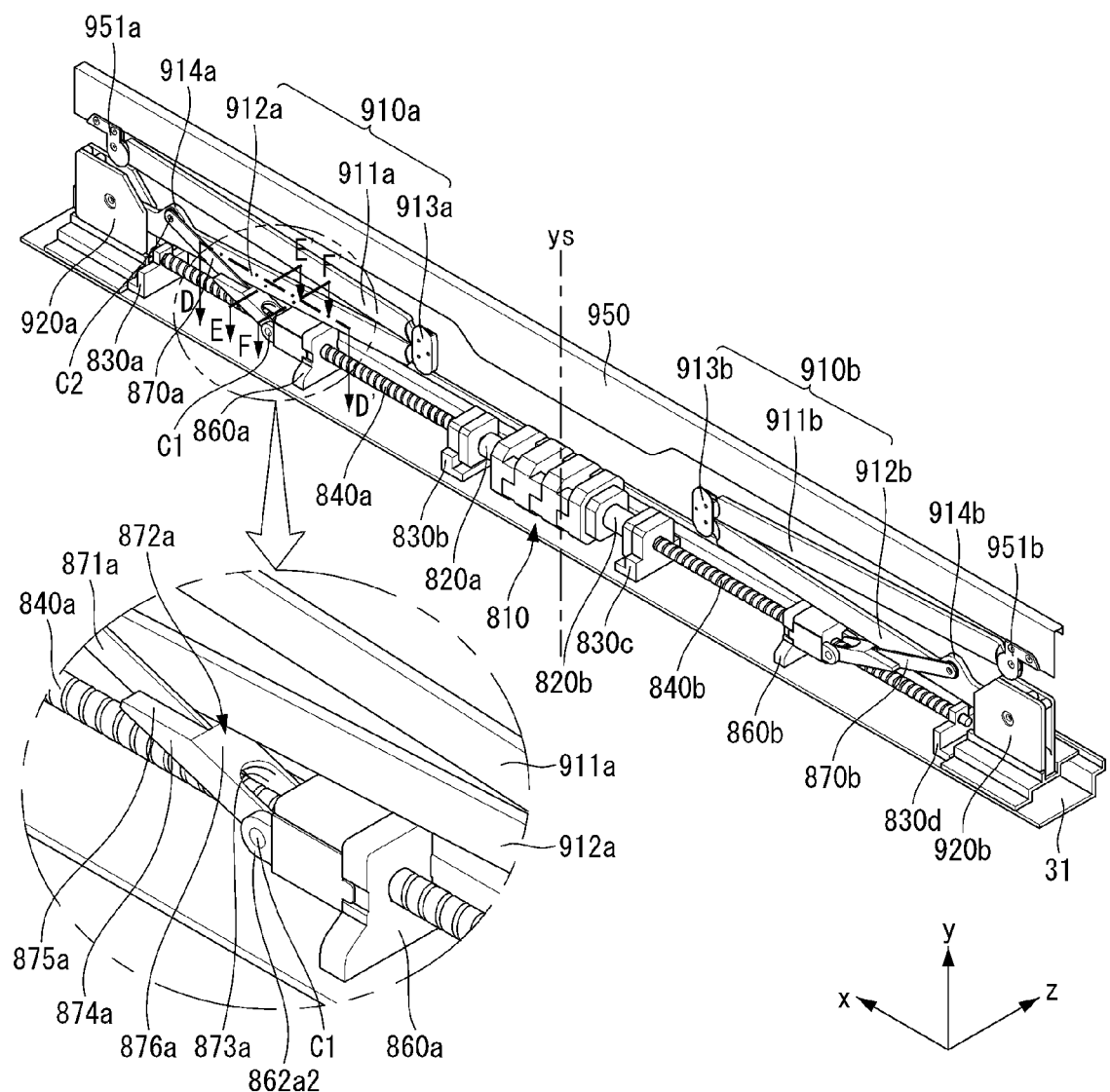

[FIG. 44]
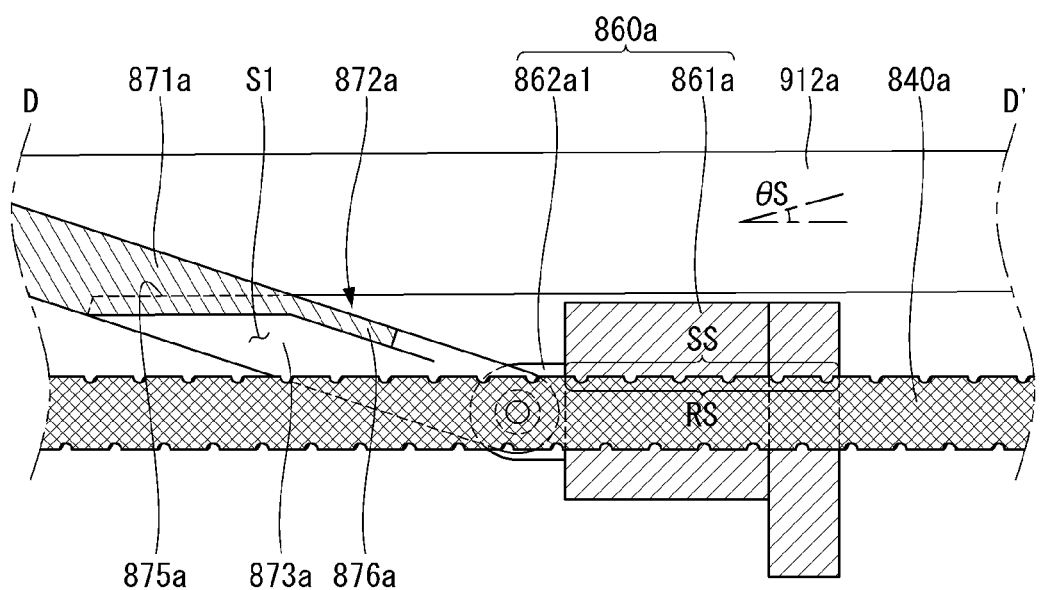

[FIG. 45]
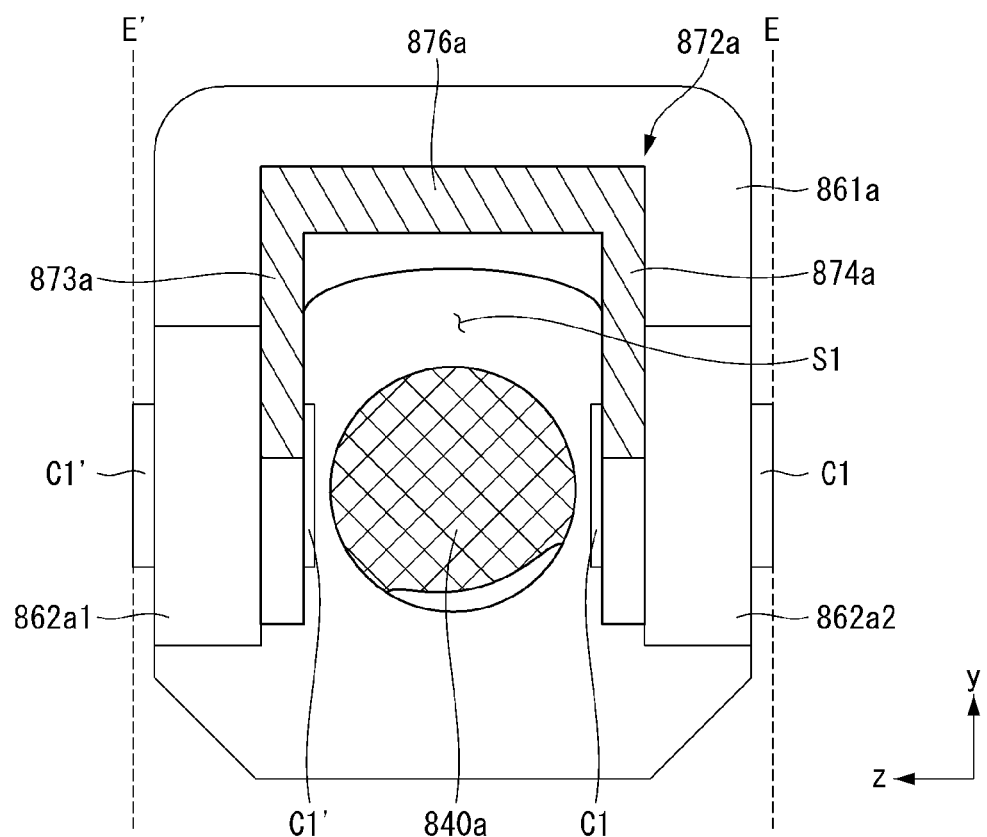

[FIG. 46]
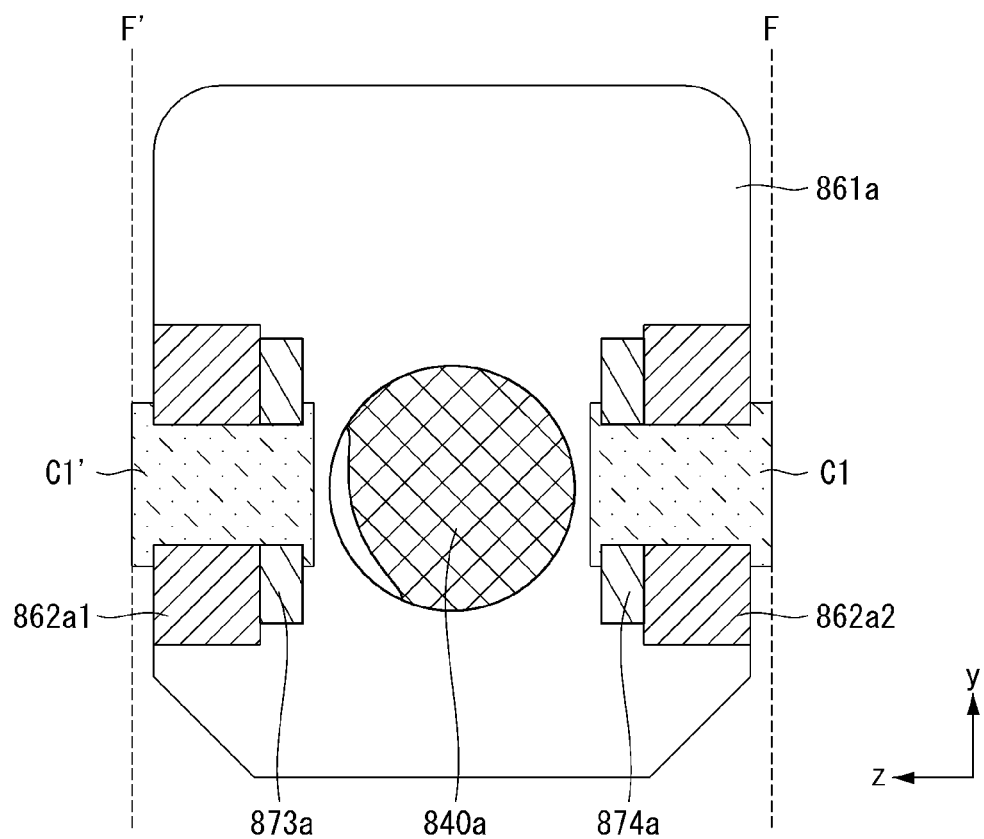

[FIG. 47]
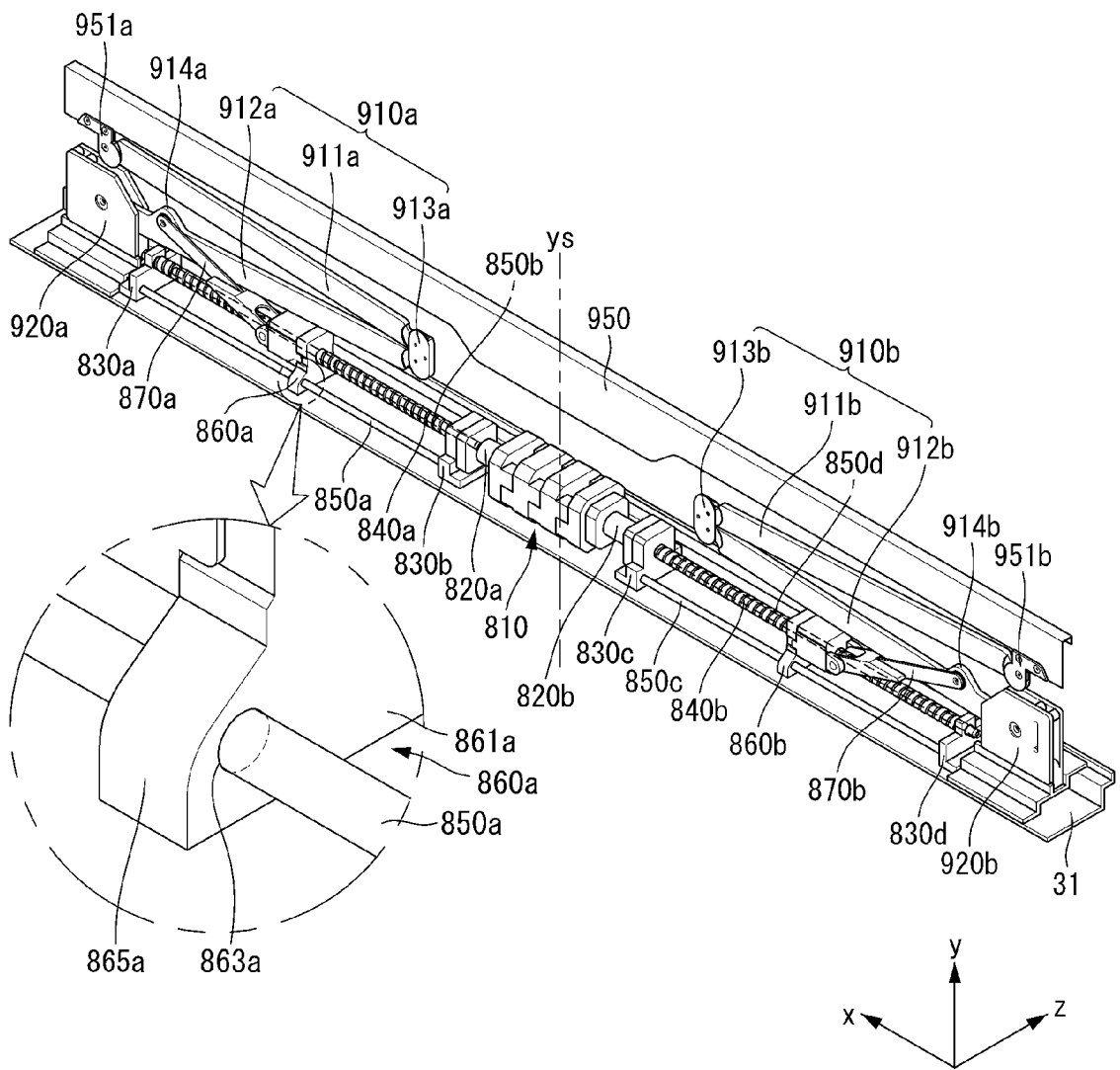

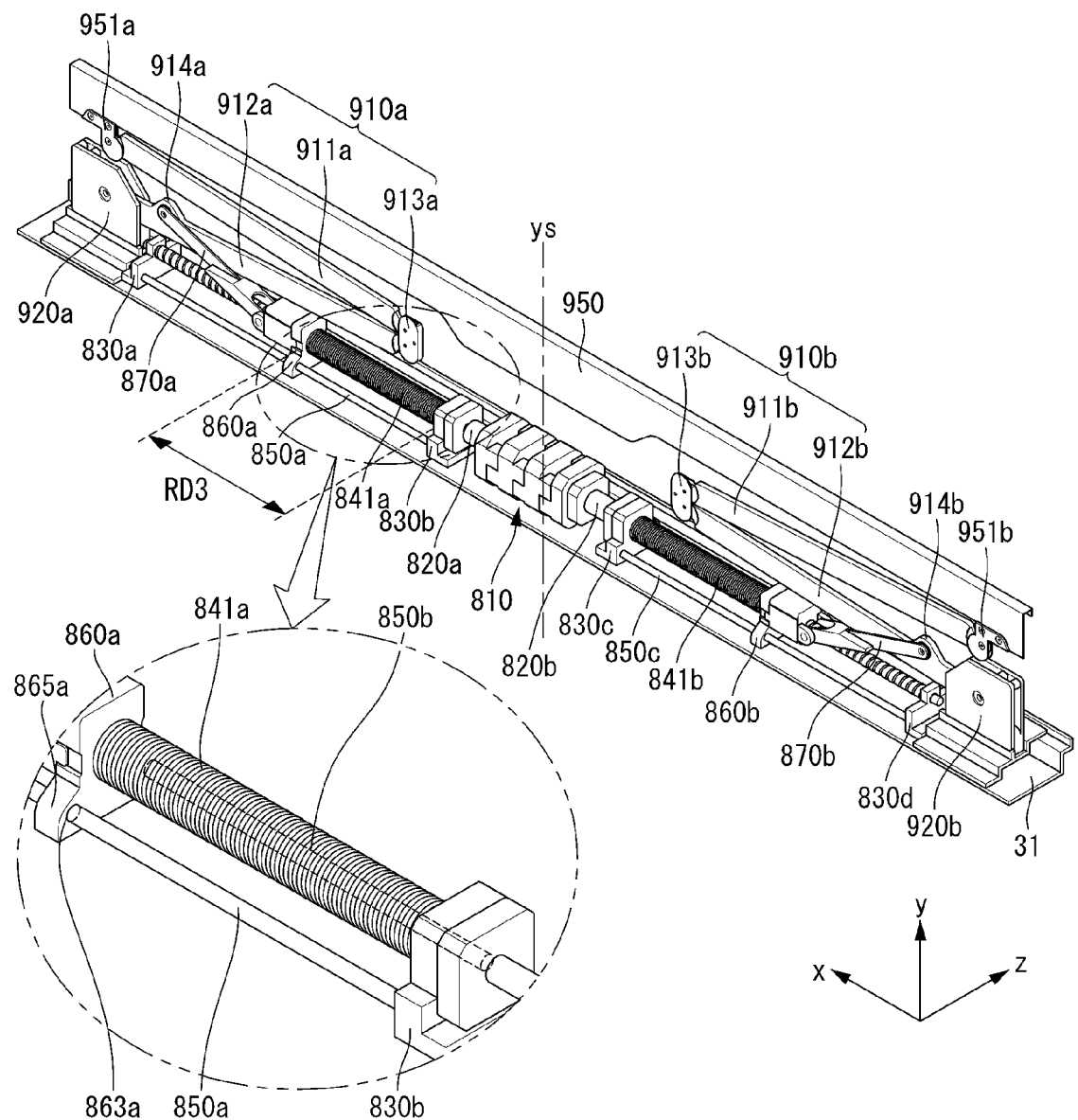
[FIG. 48]

[FIG. 49]
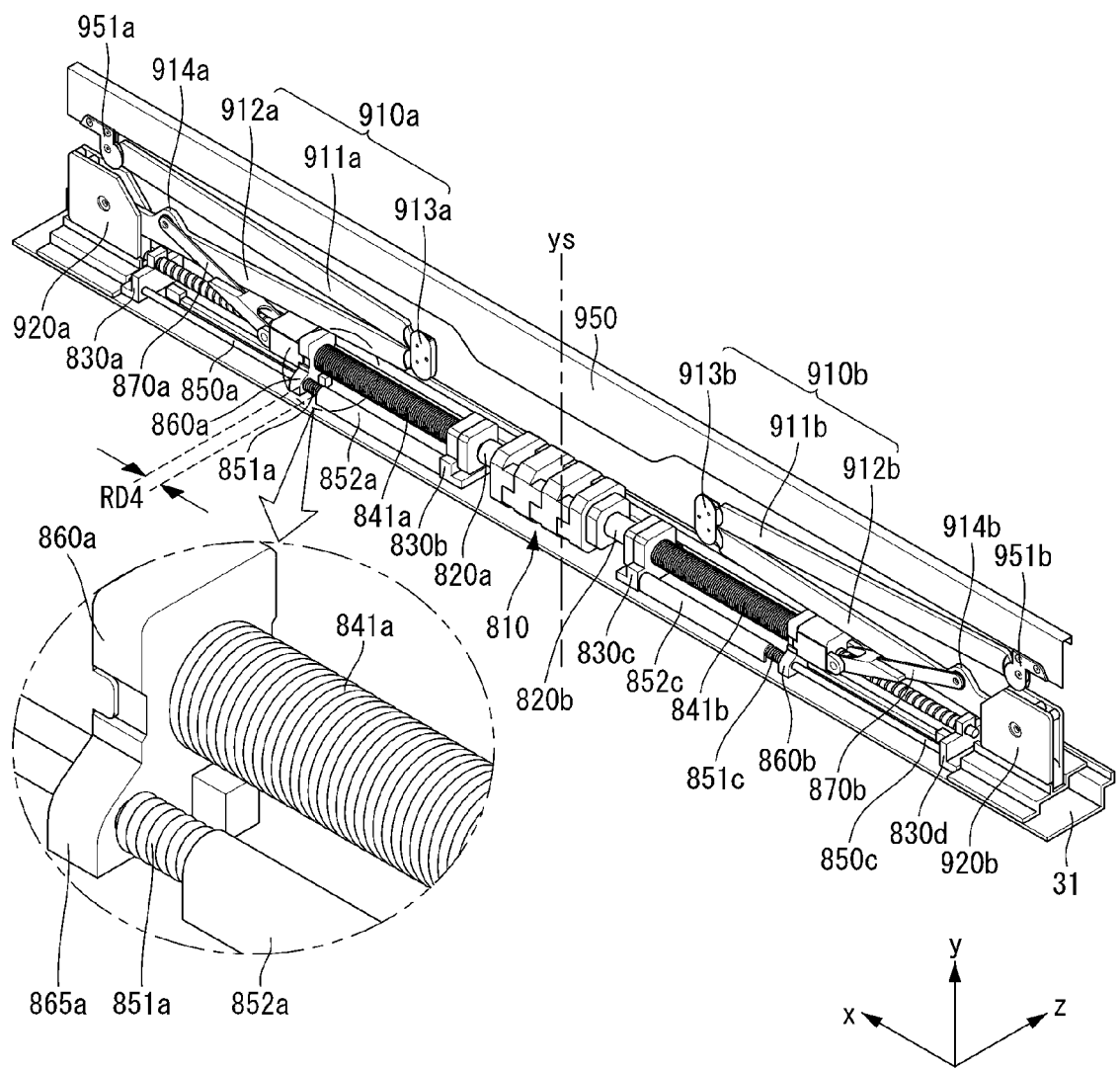

[FIG. 50]
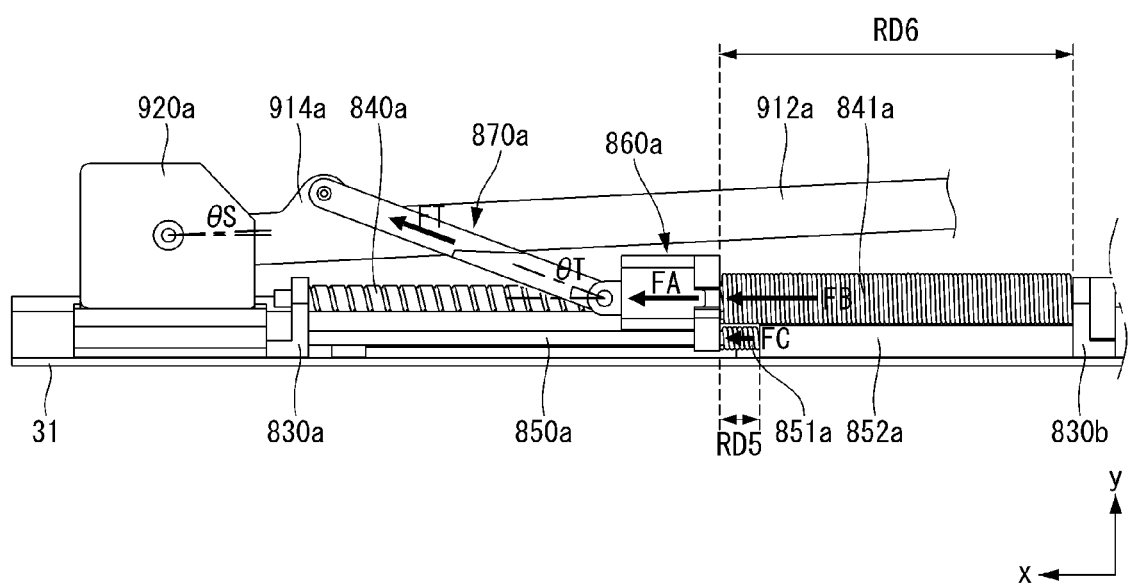

[FIG. 51]
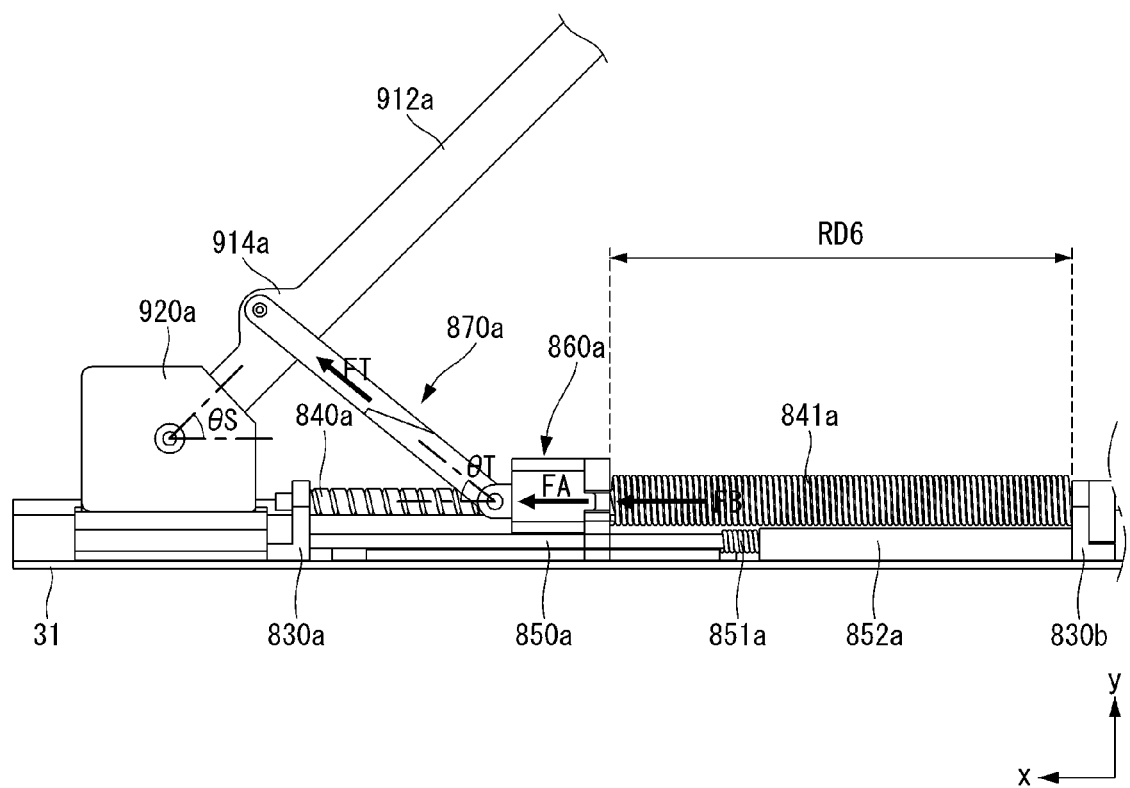

[FIG. 52]
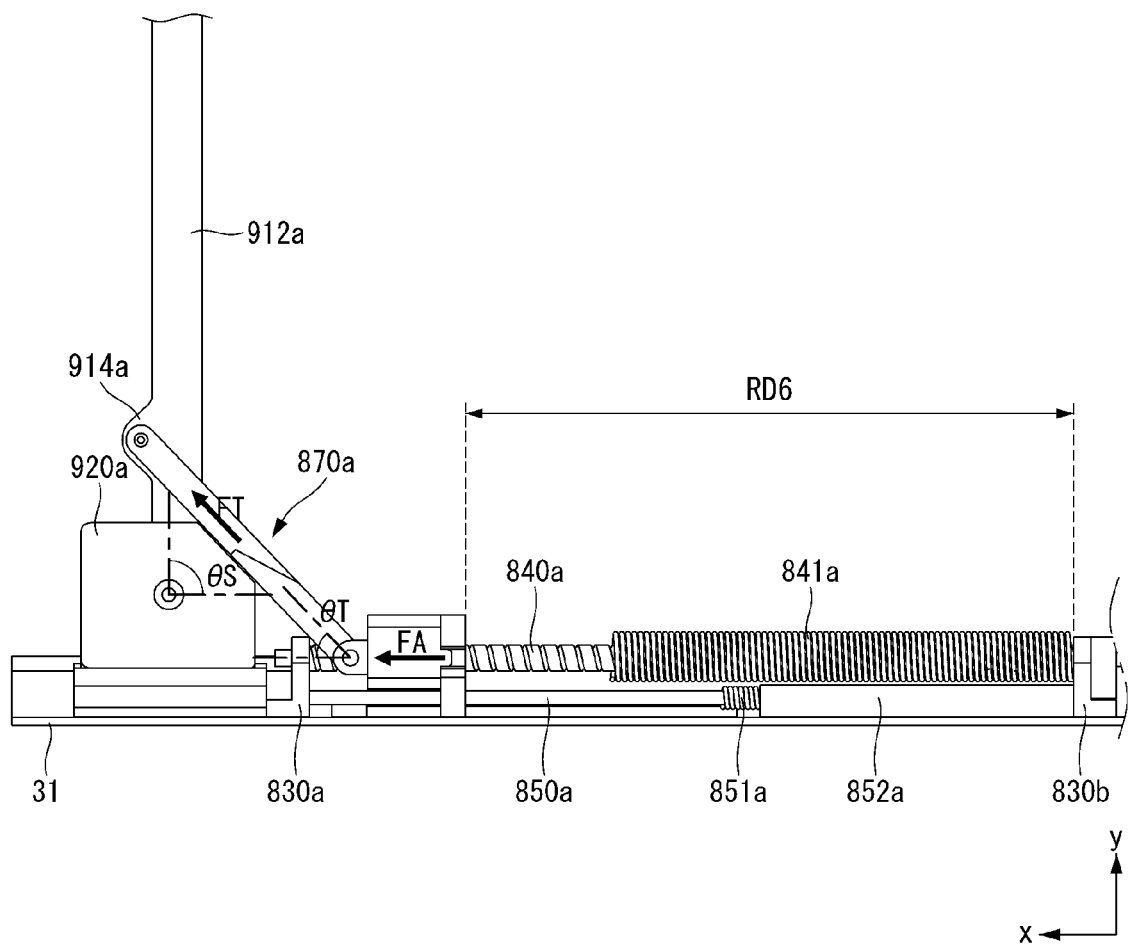

[FIG. 53]
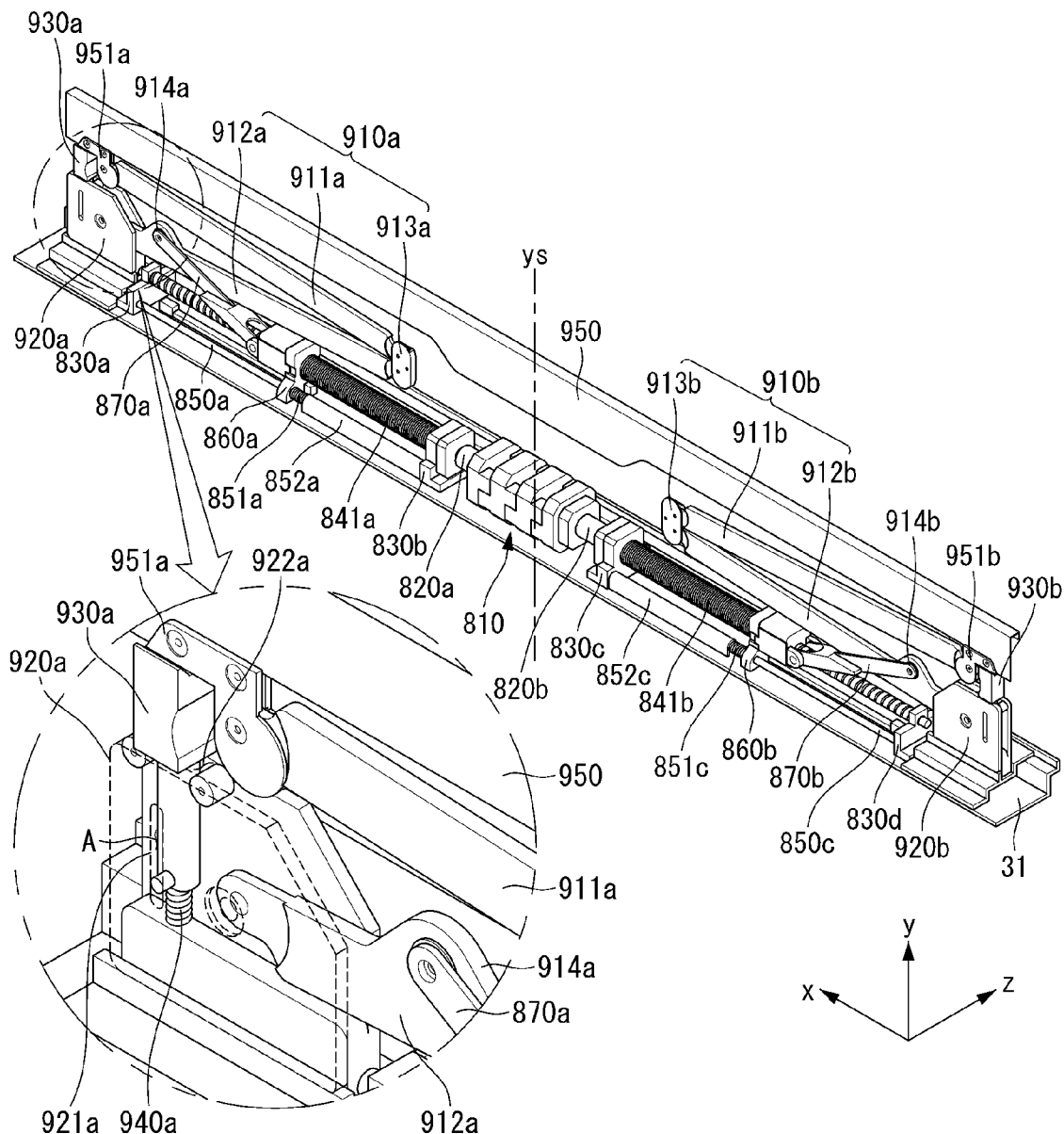

[FIG. 54]
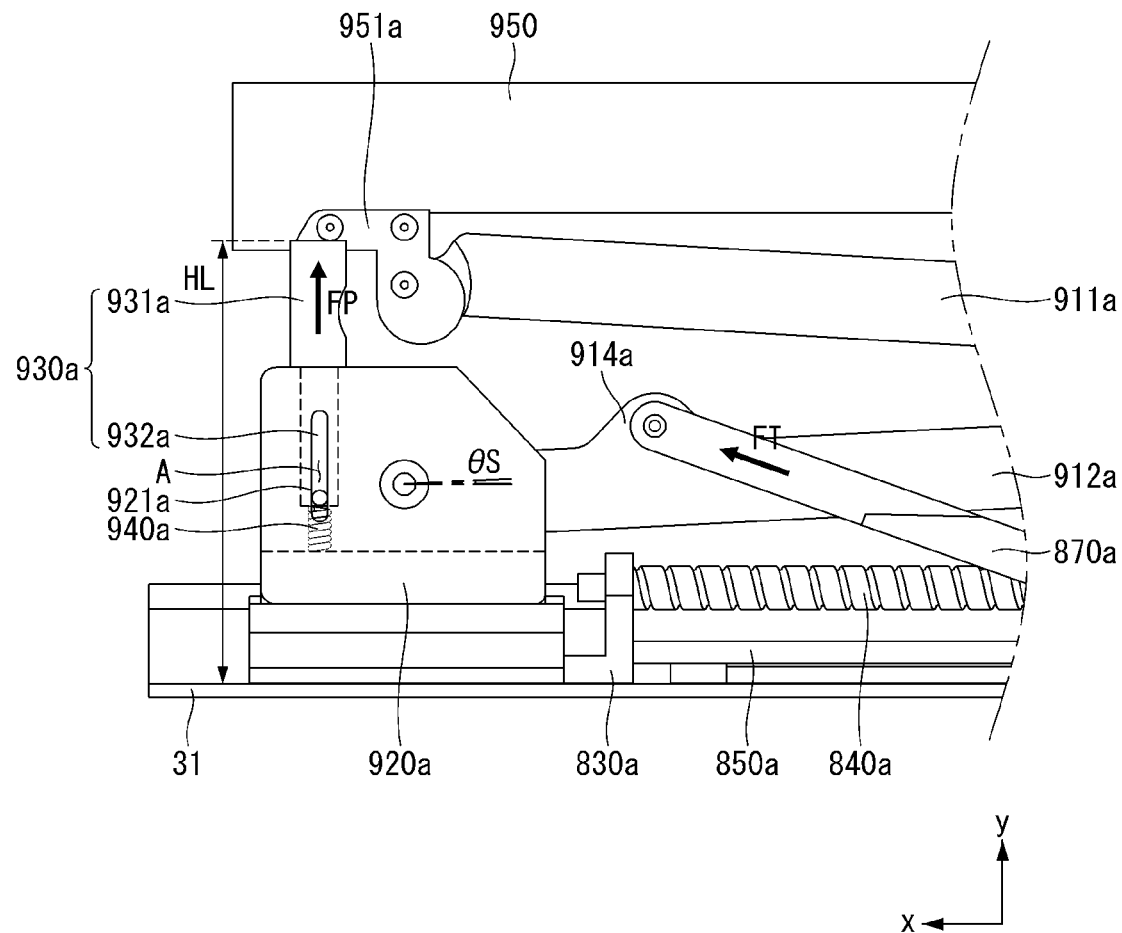

[FIG. 55]
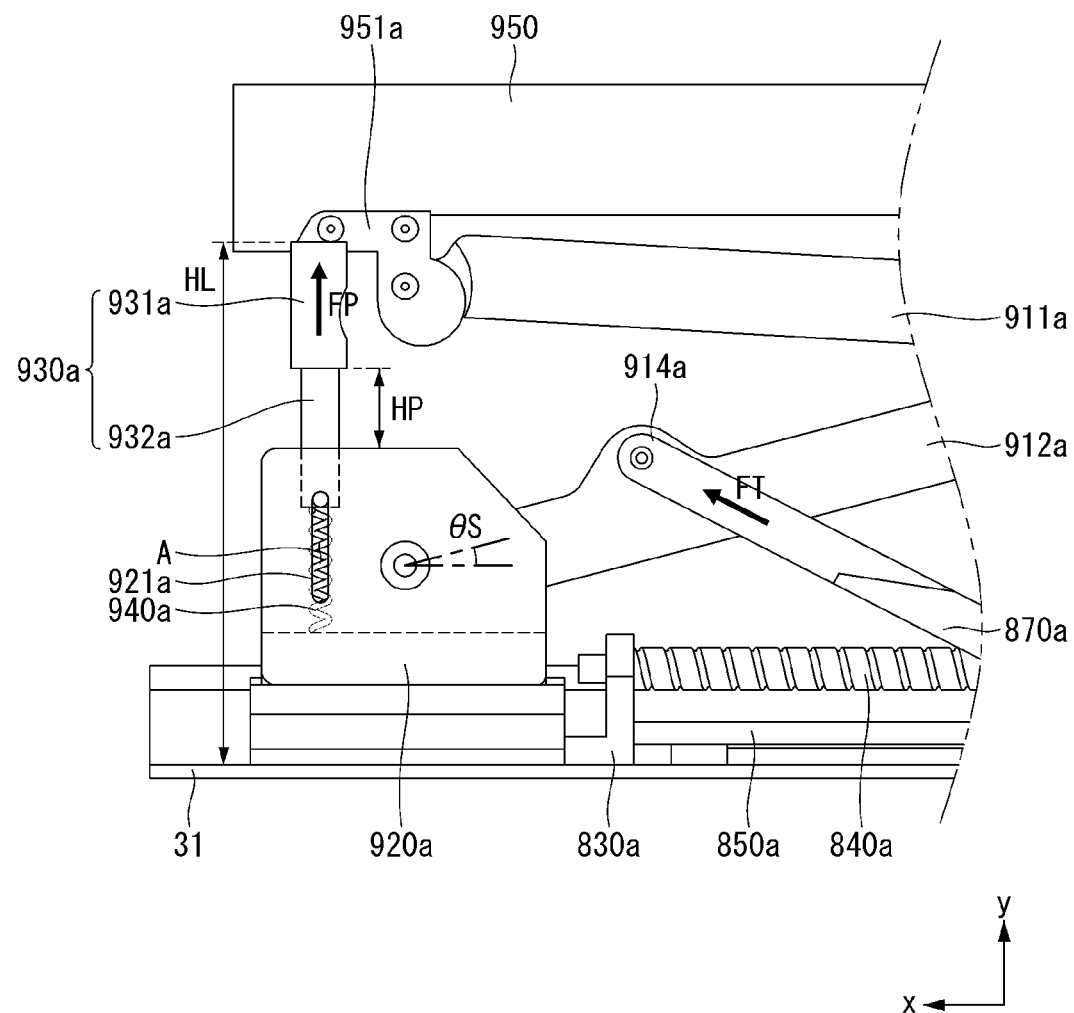

[FIG. 56]
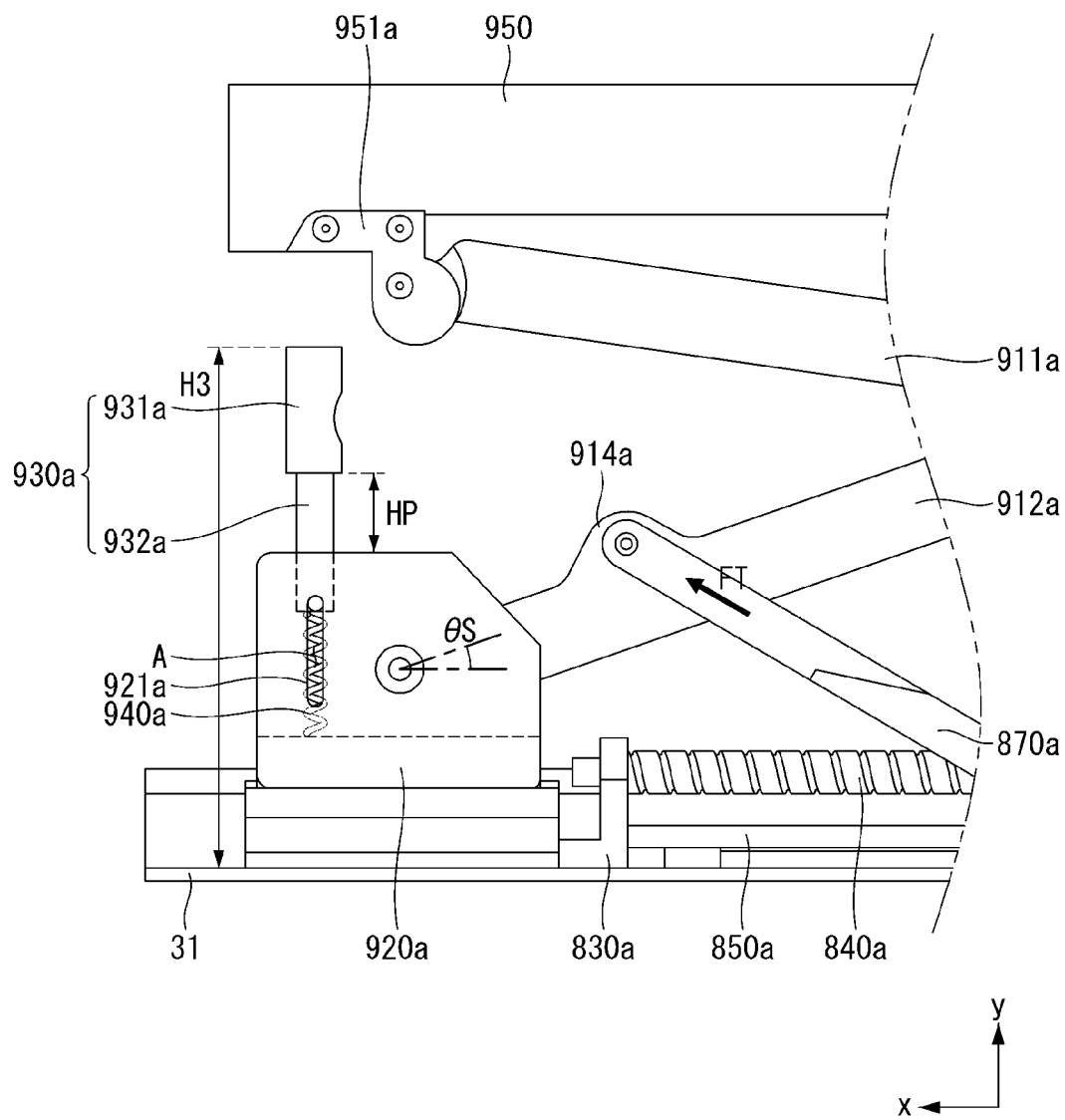

[FIG. 57]
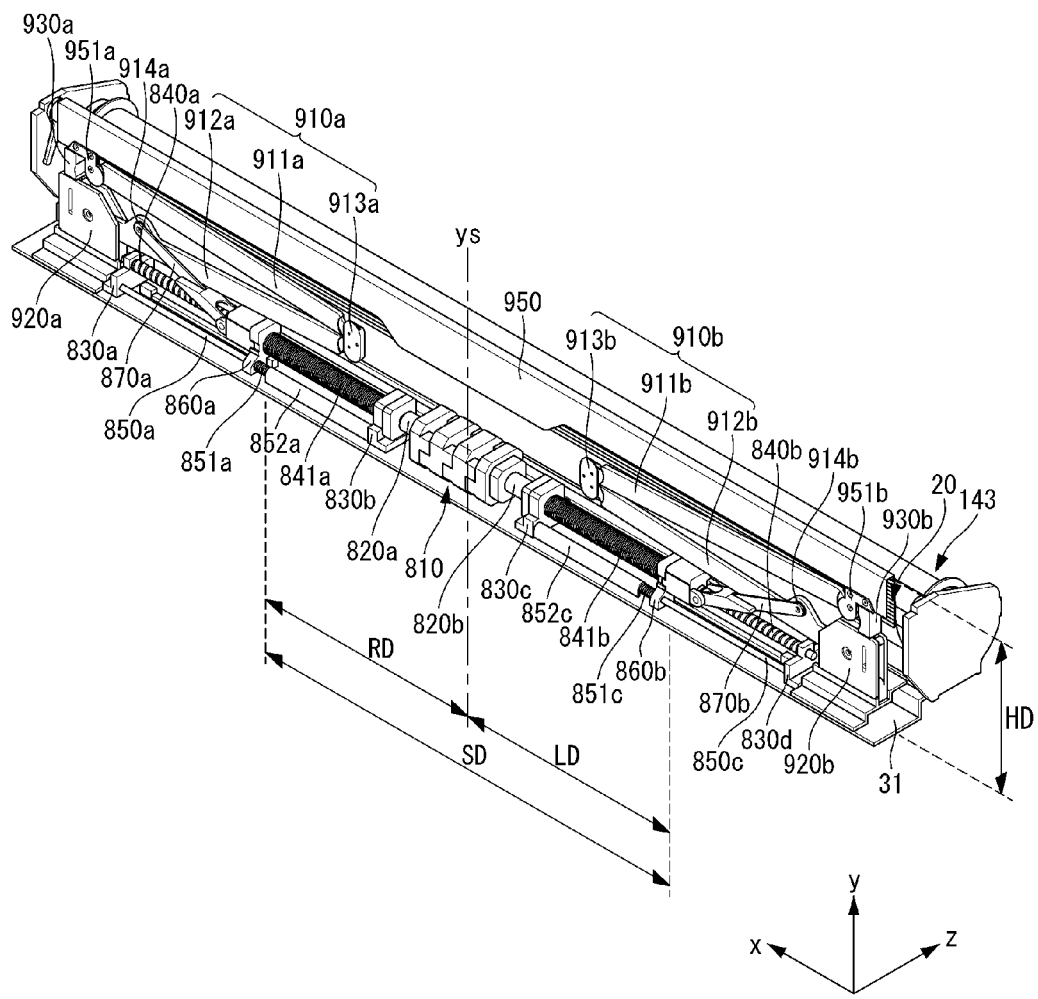

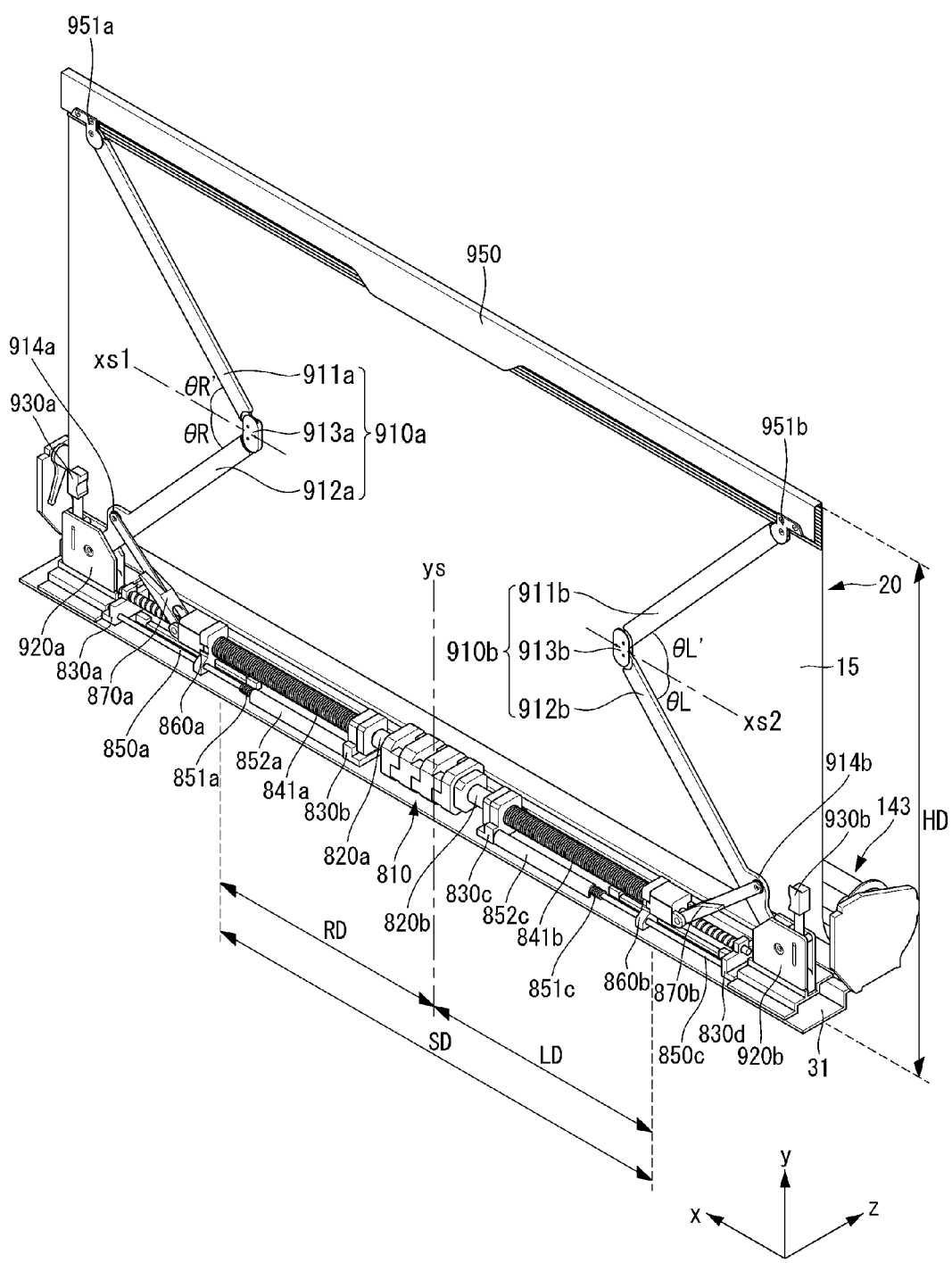
[FIG. 58]

[FIG. 59]
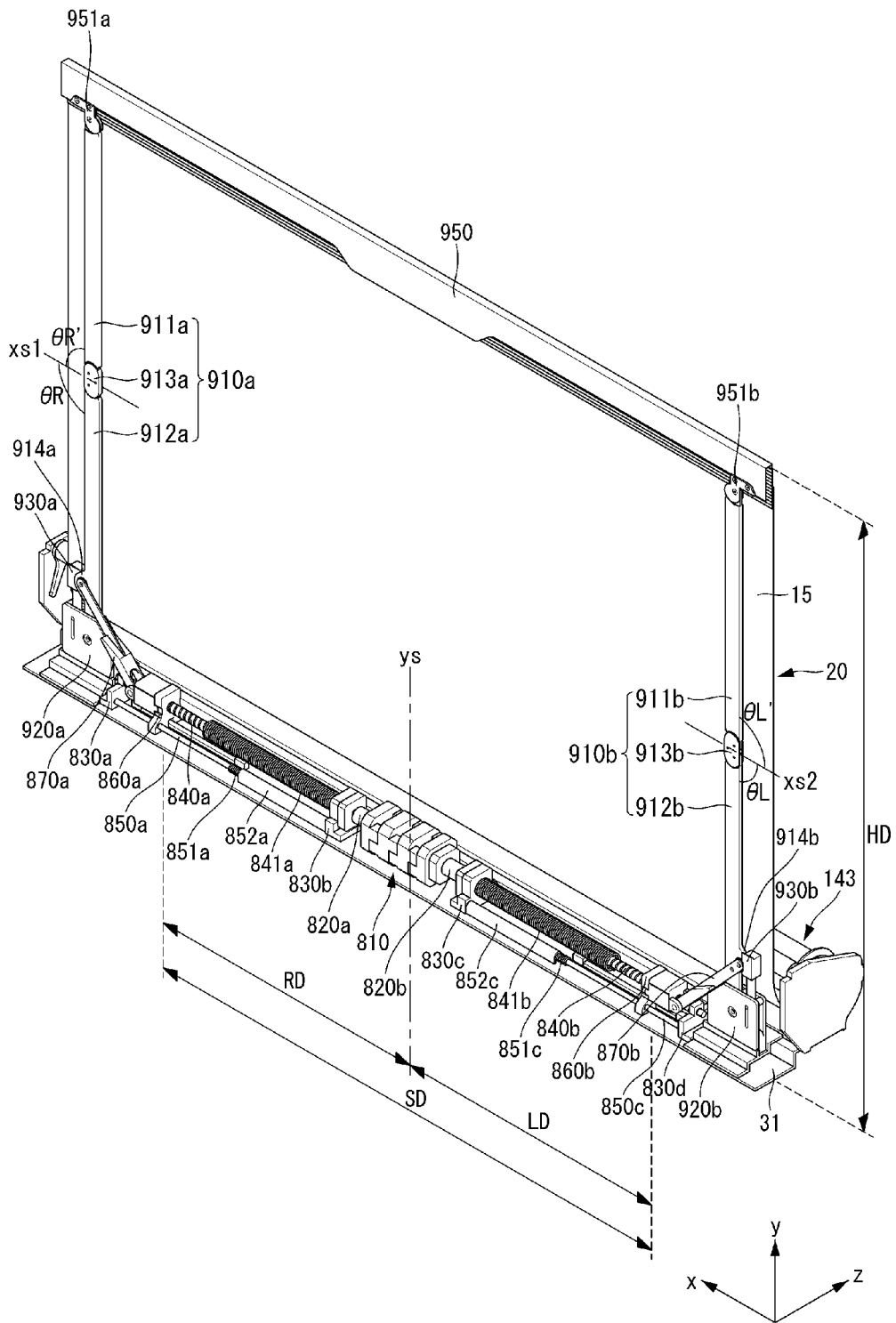

[FIG. 60]
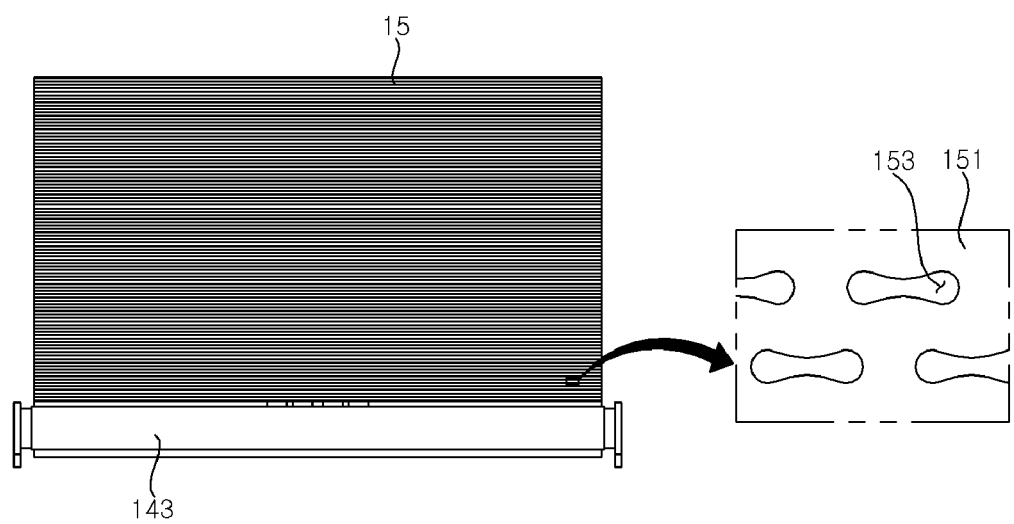

[FIG. 61]
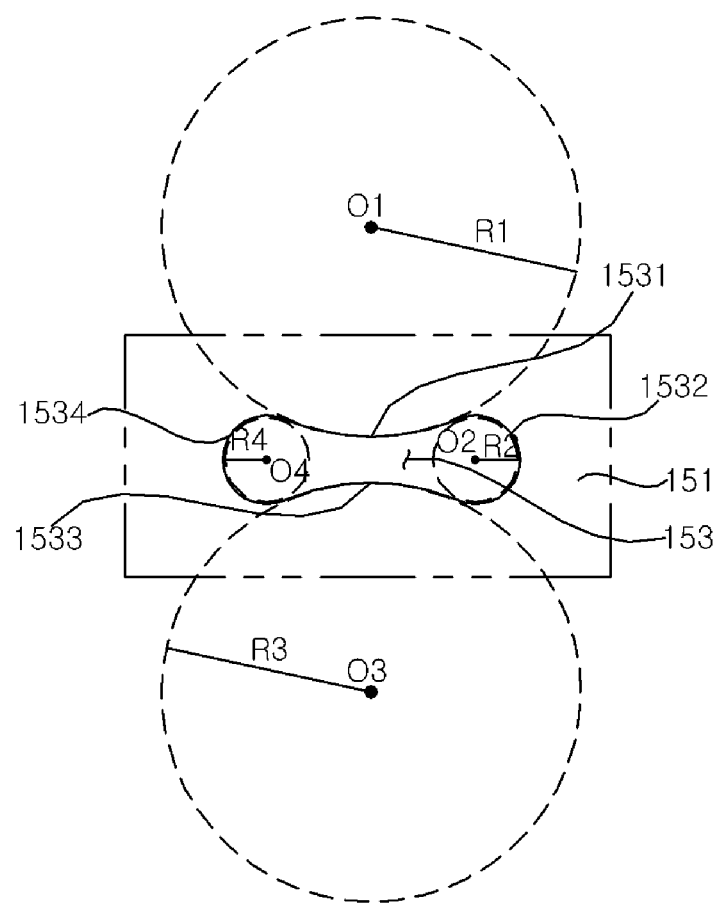

[FIG. 62]
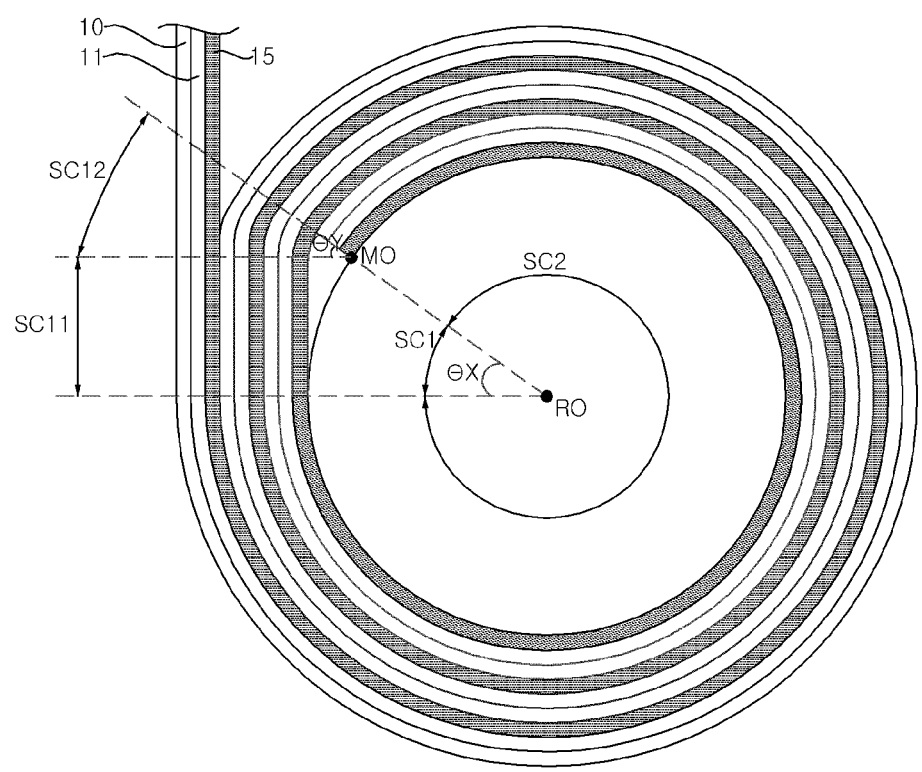

[FIG. 63]
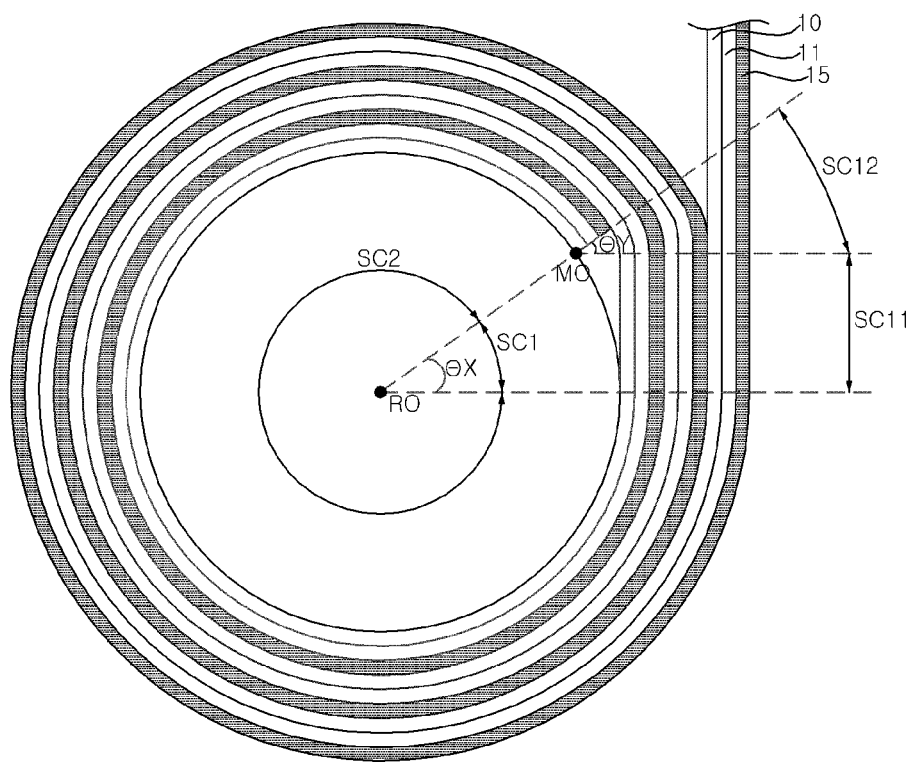

[FIG. 64]
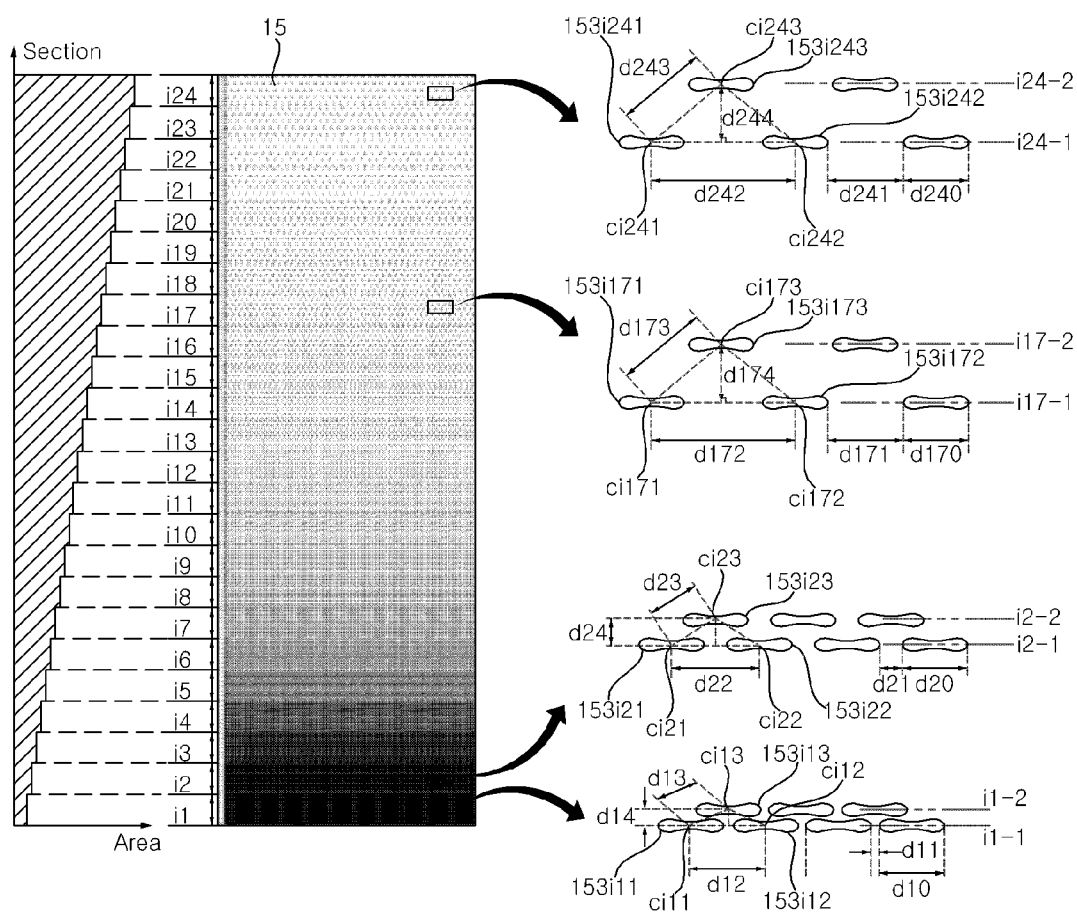

[FIG. 65]
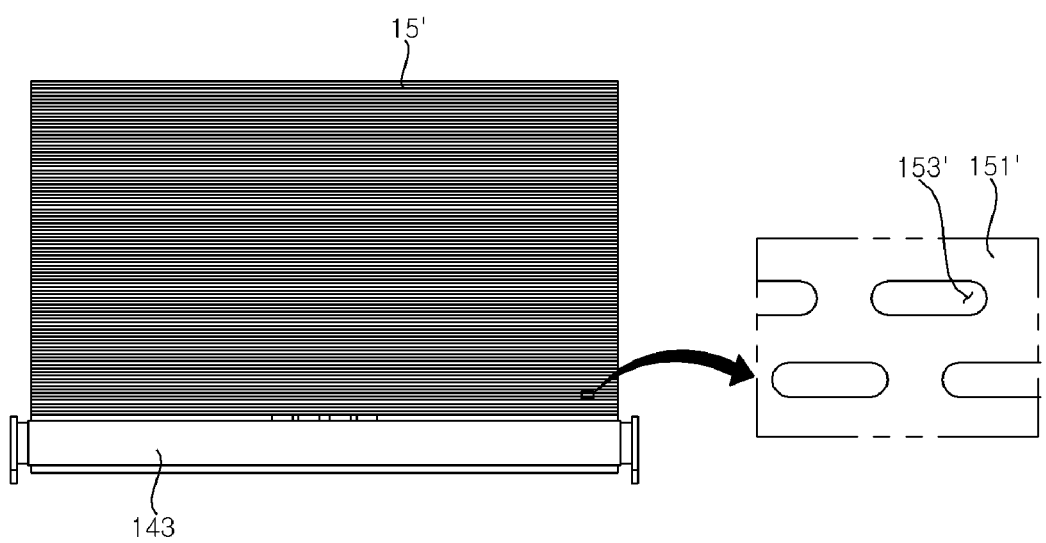

[FIG. 66]
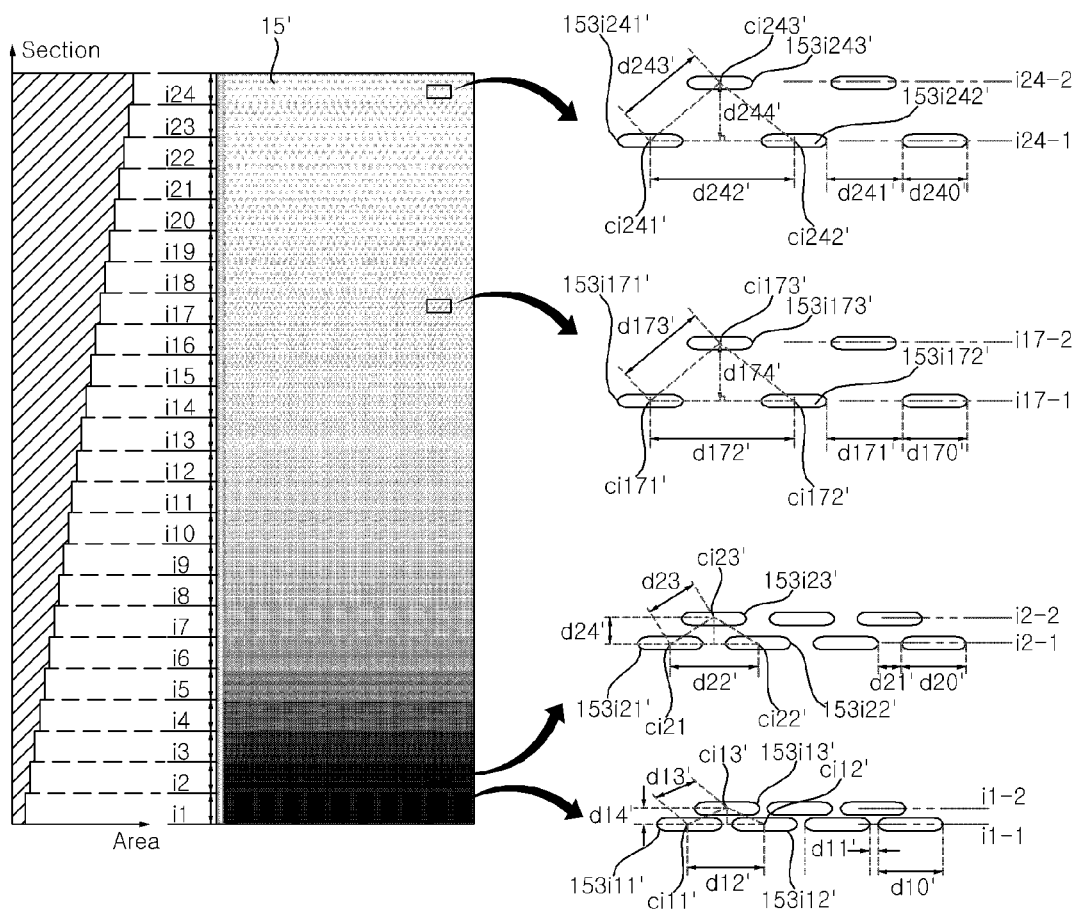

[FIG. 67]
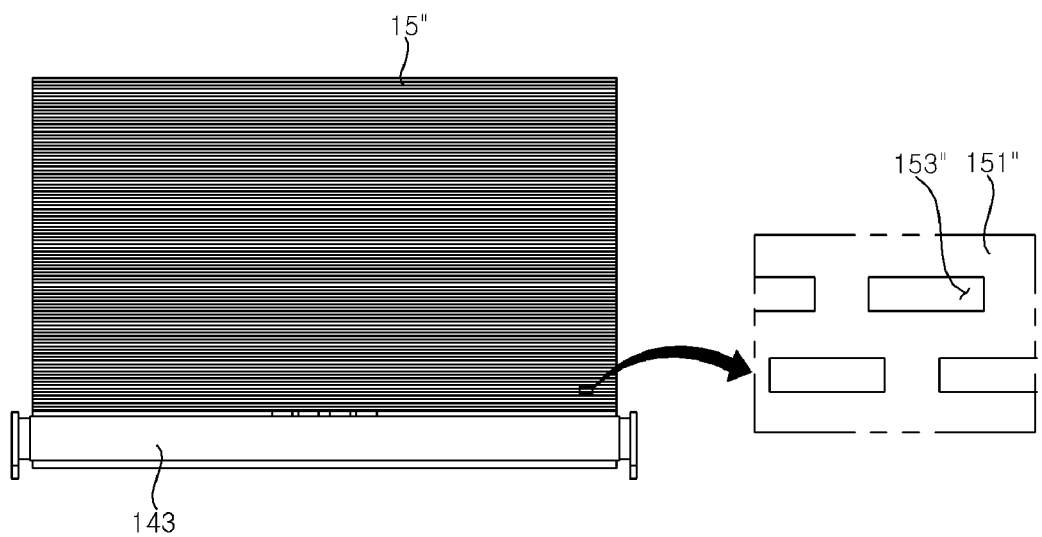

[FIG. 68]
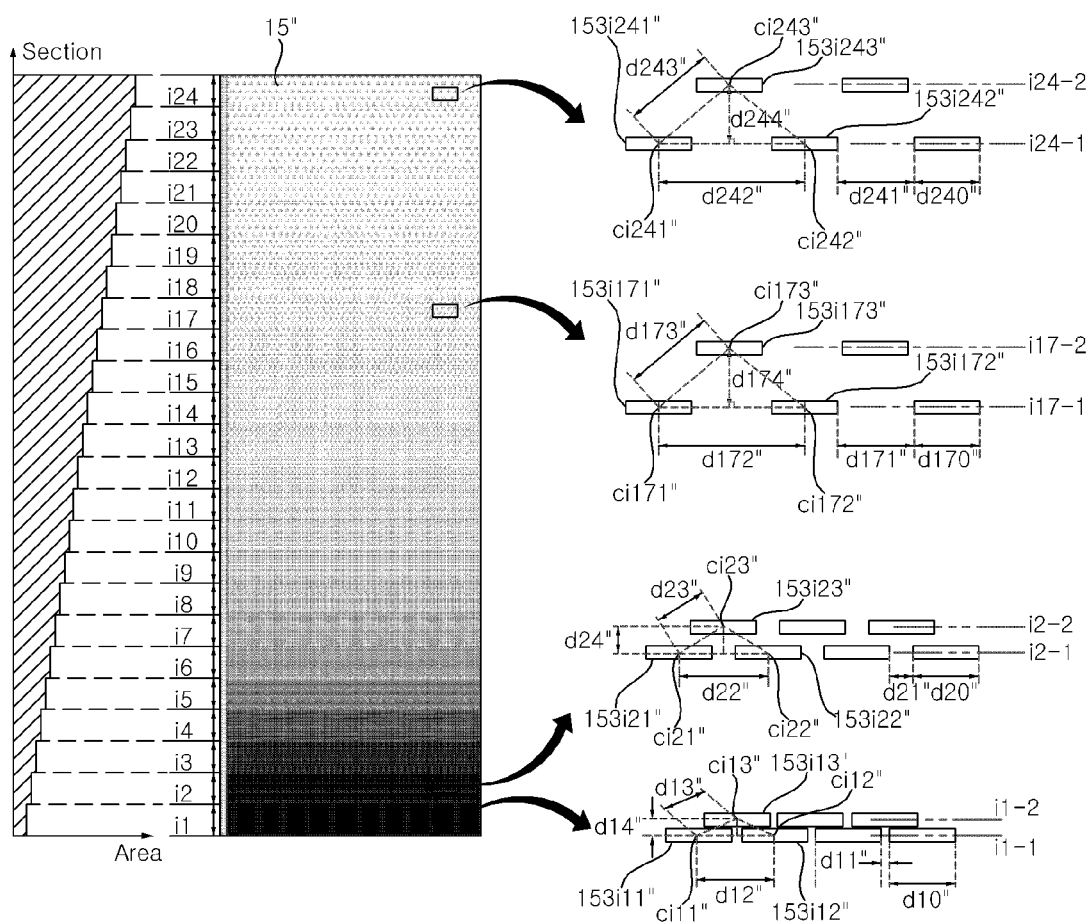

[FIG. 69]
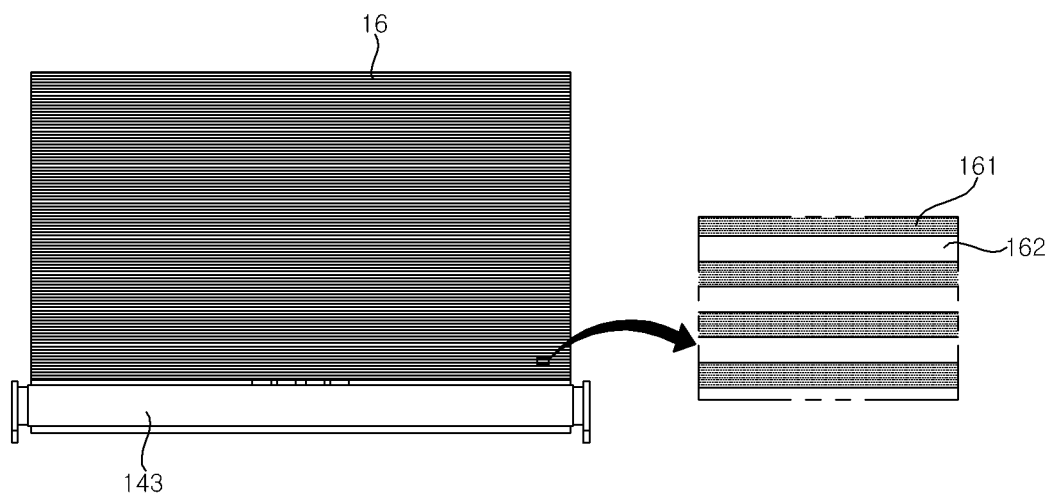

[FIG. 70]
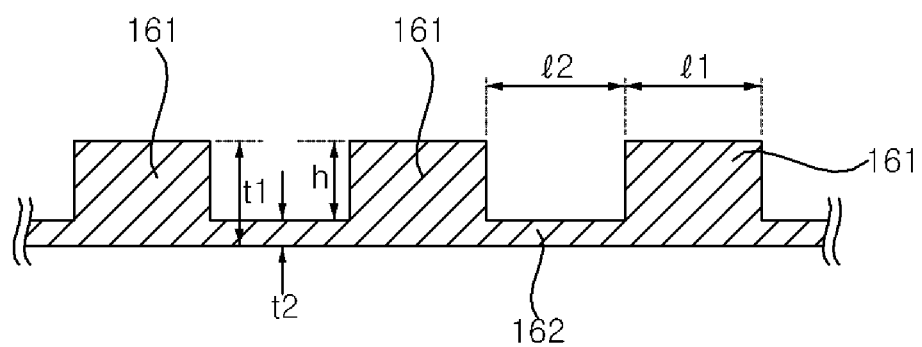

[FIG. 71]
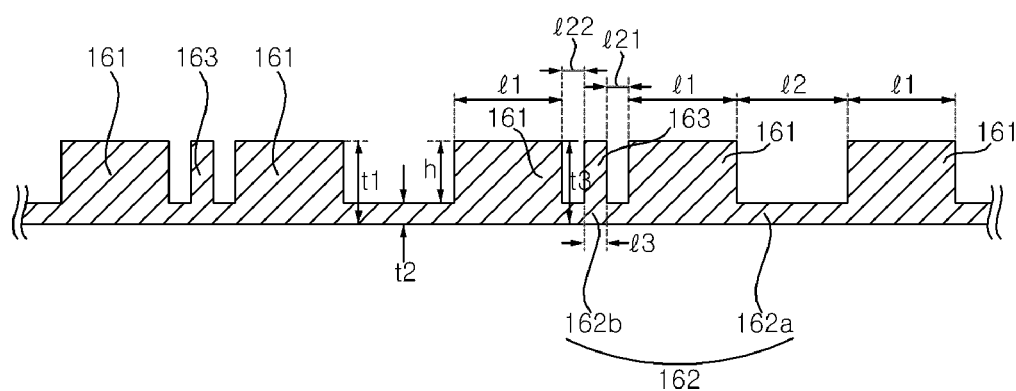

[FIG. 72]
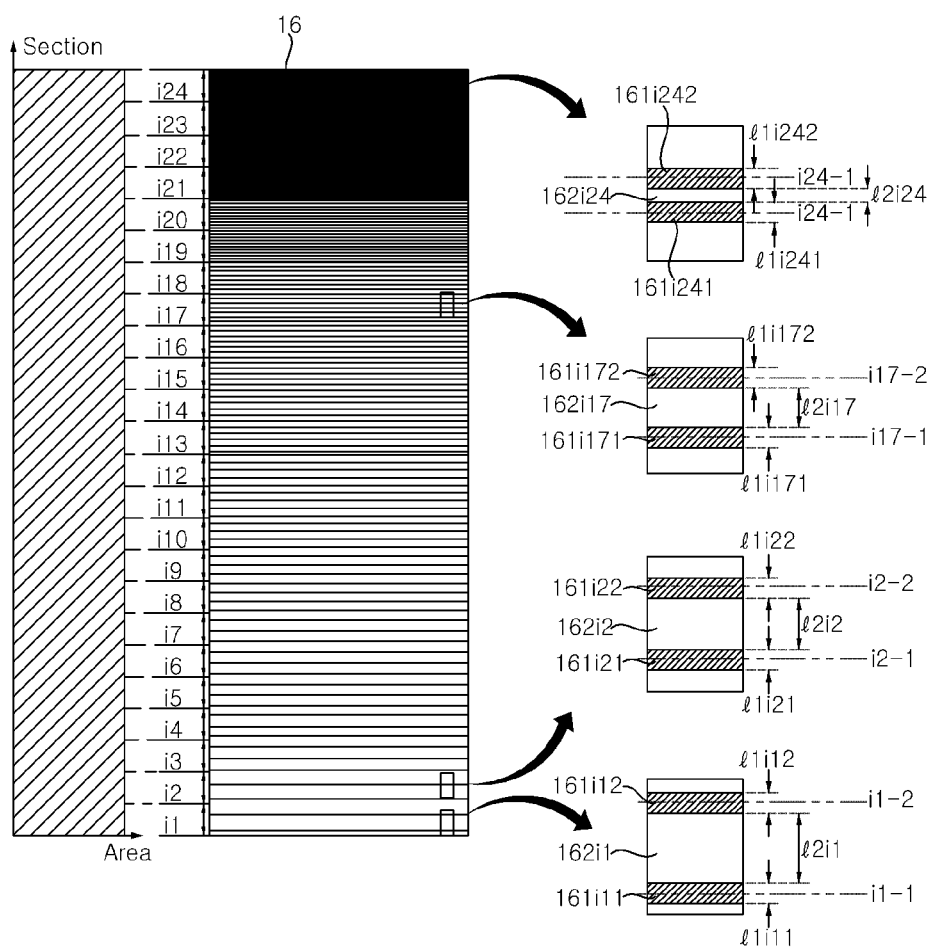

[FIG. 73]
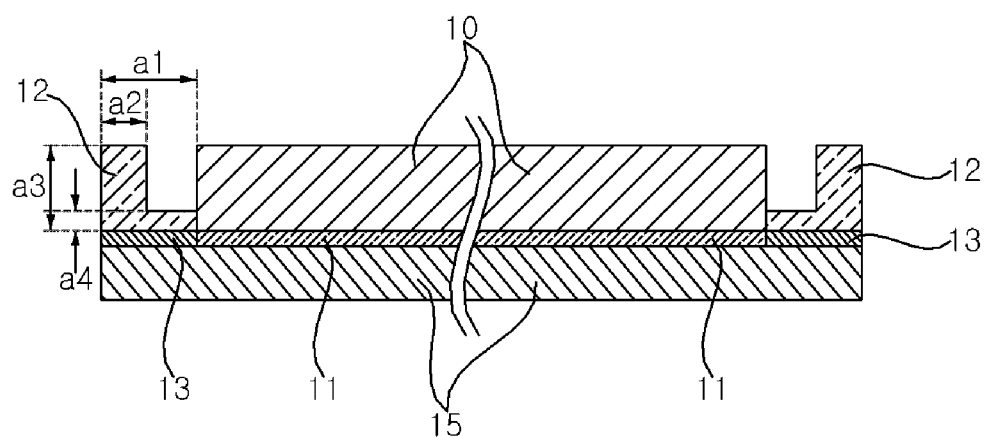

[FIG. 74]
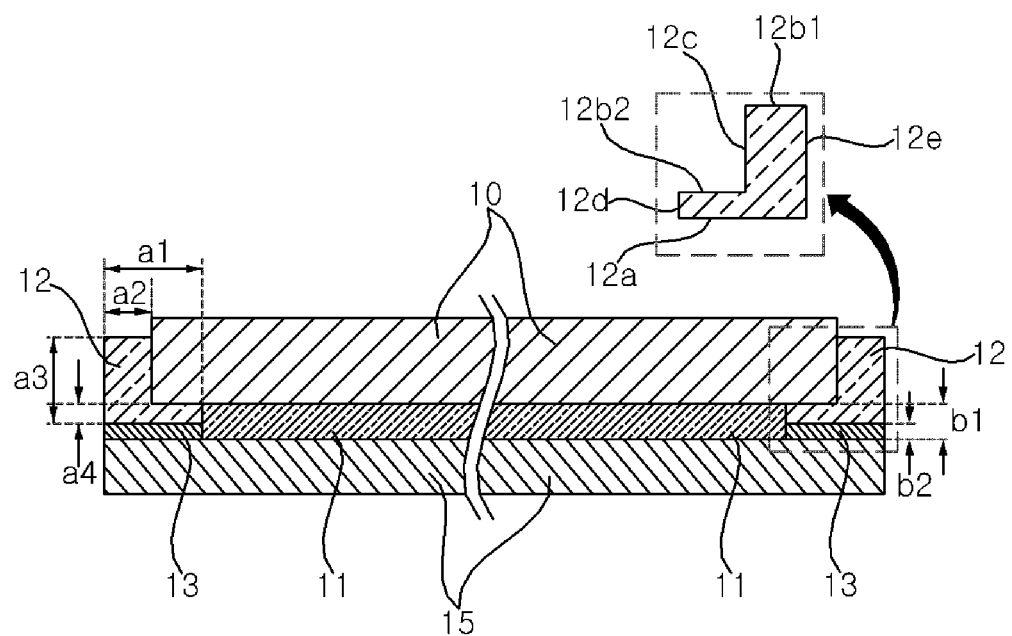

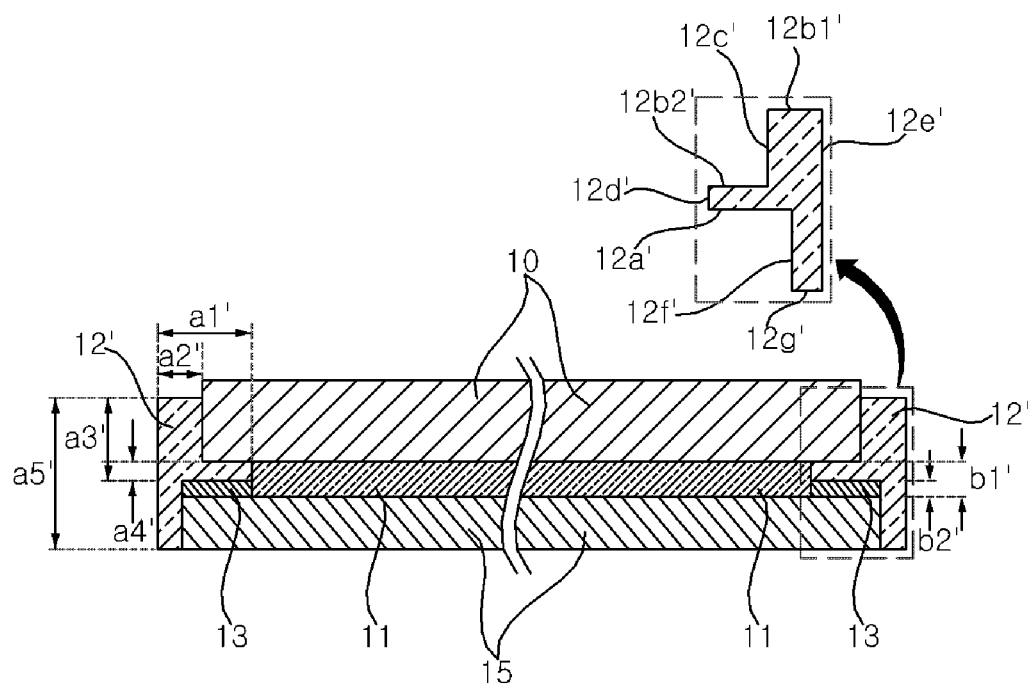
[FIG. 75]

[FIG. 76]
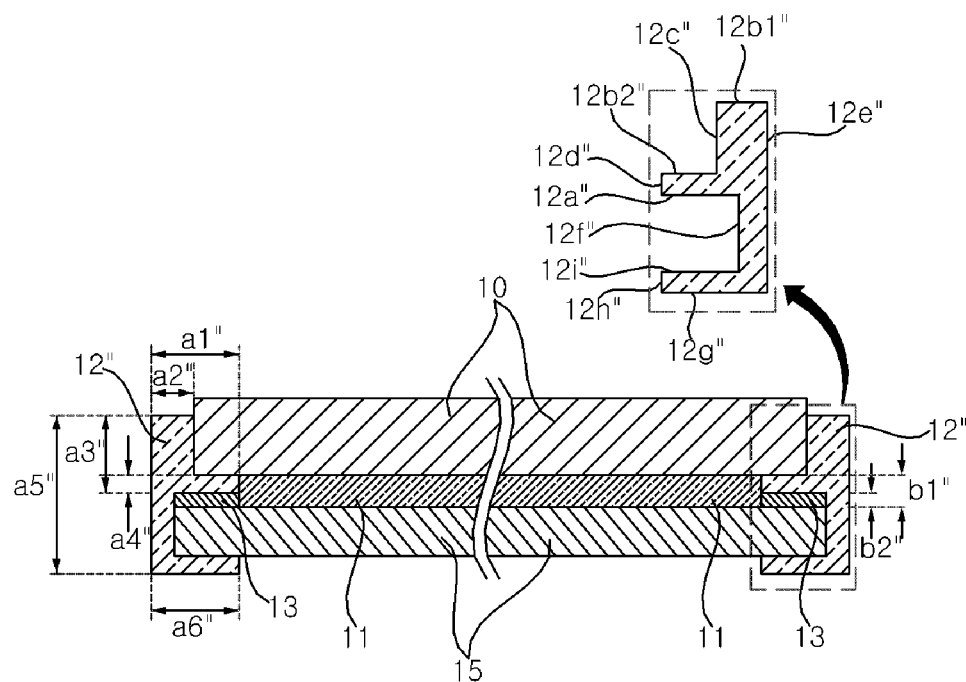

DISPLAY DEVICE

CROSS-REFERENCE TO RELATED APPLICATIONS

This application is the National Stage filing under 35 U.S.C. 371 of International Application No. PCT/KR2020/005044, filed on Apr. 14, 2020, the contents of which are all incorporated by reference herein in their entirety.

TECHNICAL FIELD

The present disclosure relates to a display device.

BACKGROUND ART

As the information society has developed, the demand for display device is increasing in various forms, and accordingly, in recent years, various display devices such as a liquid crystal display (LCD), plasma display panel (PDP), electroluminescent display (ELD), vacuum fluorescent display (VFD), and the like have been studied and used.

Among them, a display device using an organic light emitting diode (OLED) has excellent luminance and viewing angle characteristics in comparison with a liquid crystal display device and does not require a backlight unit, thereby being implemented in an ultrathin type.

In addition, a flexible display panel can be bent or wound around a roller. The flexible display panel may be used to implement a display device that unfolds on a roller or winds around the roller. Many studies have been made on a structure for winding a flexible display panel around a roller or unwinding the flexible display panel from the roller.

DISCLOSURE OF INVENTION

Technical Problem

An object of the present disclosure is to solve the above-described problems and other problems.

Another object may be to provide a display device capable of securing the rigidity of a flexible display panel.

Another object may be to provide a display device in which a cover sheet can be smoothly wound around or unwound from a roller together with a flexible display panel.

Another object may be to provide a display device capable of relieving a state where a stress applied to a cover sheet wound around the roller is concentrated on one part.

Another object may be to provide a display device capable of preventing a display panel from being damaged by an impact applied from a left or right direction.

Solution to Problem

In order to achieve the object, according to one aspect of the present disclosure, there is provided a display device including: a flexible display panel; a cover sheet which is located in a rearward direction of the display panel, and has a plurality of holes; and a roller which extends long, and around or from which the display panel and the cover sheet are wound or unwound, wherein the cover sheet includes: a first section which extends long along a longitudinal direction of the roller; and a second section which extends long along the longitudinal direction of the roller, and is disposed side by side with the first section in a direction intersecting with the longitudinal direction of the roller; wherein the plurality of holes include: a plurality of first holes which are located in the first section, and disposed at a first interval; and a plurality of second holes which are located in the second section, and disposed at a second interval different from the first interval.

Advantageous Effects of Invention

The effect of the display device according to the present disclosure will be described as follows.

According to at least one of embodiments of the present disclosure, it is possible to provide a display device capable of securing rigidity of a flexible display panel.

According to at least one of the embodiments of the present disclosure, it is possible to provide a display device in which a cover sheet can be smoothly wound around or unwound from a roller together with a flexible display panel.

Another object of the present disclosure is to provide a display device capable of relieving a state where a stress applied to a cover sheet wound around the roller is concentrated on one part.

Another object is to provide a display device capable of preventing a display panel from being damaged by an impact applied from a left or right direction.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

BRIEF DESCRIPTION OF DRAWINGS

FIGS. 1 to 76 are diagrams illustrating examples of a display device according to embodiments of the present disclosure.

MODE FOR CARRYING OUT INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if an embodiment is described with reference to a specific figure, if necessary, reference numeral not shown in the specific figure may be referred to, and reference numeral not shown in the specific figure is used when the reference numeral is shown in the other figures.

Referring to FIG. 1, a display device 100 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

The direction parallel to the longitudinal direction of the housing 30 may be referred to as a first direction DR1, +x axis direction, −x axis direction, a left direction, or a right direction. The direction in which the display unit 20 displays a screen may be referred to as +z axis, a forward direction, or the front. The direction opposite to the direction in which the display unit 20 displays the screen may be referred to as −z axis, a rearward direction, or the rear. A third direction DR3 may be parallel to +z axis direction or −z axis direction. The direction parallel to the height direction of the display device 100 may be referred to as a second direction DR2, +y axis direction, the −y axis direction, an upper direction, or a lower direction.

The third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction. A left and right direction LR may be parallel to the first direction DR1, and an up and down direction UD may be parallel to the second direction DR2.

Referring to FIG. 2, the display unit 20 may be entirely located inside the housing 30. At least a portion of the display unit 20 may be located outside the housing 30. The degree to which the display unit 20 is exposed to the outside of the housing 30 may be adjusted as necessary.

Referring to FIG. 3, the display unit 20 may include a display panel 10 and a plate 15. The display panel 10 may be flexible. For example, the display panel 10 may be an organic light emitting display (OLED).

The display panel 10 may have a front surface for displaying an image. The display panel 10 may have a rear surface facing the front surface. The front surface of the display panel 10 may be covered with a light transmissive material. For example, the light transmissive material may be synthetic resin or film.

The plate 15 may be coupled, fastened or attached to the rear surface of the display panel 10. The plate 15 may include a metal material. The plate 15 may be referred to as a module cover 15, a cover 15, a display panel cover 15, a panel cover 15, or an apron 15.

Referring to FIG. 4, the plate 15 may include a plurality of segments 15c. A magnet 64 may be located inside a recess 118 of the segment 15c. The recess 118 may be located on a surface of the segment 15c facing the display panel 10. The recess 118 may be located in the front surface of each segment 15c. Since the magnet 64 is accommodated inside the recess 118, the magnet 64 may not protrude from the segment 15c. The display panel 10 may be flat without being wrinkled even when it is in contact with the segment 15c.

Referring to FIG. 5, a plurality of magnets 64 may be located on a link 73. For example, at least one magnet 64 may be located on a first arm 73a and at least one magnet 64 may be located on a second arm 73b. The plurality of magnets 64 may be spaced apart from each other.

Referring to FIG. 6, one magnet 64 may be located on the first arm 73a and the second arm 73b, respectively. The magnet 64 may have a shape extended in the long side direction of the first arm 73a and the second arm 73b. Since the magnet 64 has a shape extended in the long side direction of the first arm 73a and the second arm 73b, the area of the portion where the link 73 is in close contact with the display panel and the module cover may be increased. Accordingly, the adhesion between the link 73 and the display panel and the module cover may be strengthened.

Referring to FIG. 7, the magnet 64 may be located in a depression 321 formed in the link 73. The depression 321 may have a shape recessed inward of the link 73. The magnet 64 may be coupled to the link 73 through at least one screw 187.

The width LHW in which the depression 321 is recessed inwardly of the link 73 may be equal to or larger than the thickness MGW of the magnet 64. If the thickness MGW of the magnet 64 is larger than the width LHW of the depression 321, the display panel 10 and the module cover 15 may not be in close contact with the link 73. In this case, the display panel 10 may be wrinkled or may not be flat.

A panel protector 97 may be located in the rear surface of the display panel 10. The panel protector 97 may prevent the display panel 10 from being damaged due to friction with the module cover 15. The panel protector 97 may include a metal material. The panel protector 97 may have a very thin thickness. For example, the panel protector 97 may have a thickness of about 0.1 mm.

Since the panel protector 97 contains a metal material, magnetic attraction between the panel protector 97 and the magnet 64 may occur. Accordingly, the module cover 15 located between the panel protector 97 and the link 73 may be in close contact with the magnet 64 even if it does not contain a metal material.

Referring to FIG. 8, the module cover 15 may be in close contact with the link 73 by an upper bar 75 of the upper side and a guide bar 234 of the lower side (see FIG. 15). A portion between the upper bar 75 and the guide bar 234 of the link 73 may not be in close contact with the module cover 15. Alternatively, the central portion of the link 73 may not be in close contact with the module cover 15. The central portion of the link 73 may be near an arm joint 152. In this case, the distance APRD1, APLD2 between the module cover 15 and the link 73 may not be constant. In this case, the display panel 10 may be bent or twisted.

Referring to FIG. 9, when the magnet 64 is located in the depression 321 of the link 73, the magnet 64 attracts the panel protector 97, so that the module cover 15 can also be in close contact with the magnet at the same time. That is, the central portion of the link 73 may be in close contact with the module cover 15.

Referring to FIG. 10, a bead 136 may be formed in the upper surface of the segment 15b. The bead 136 may have a shape recessed inwardly of segment 15b. The bead 136 may have a shape recessed in the −y axis direction. For example, the bead 136 may be formed by pressing the segment 15b. A plurality of beads 136 may be formed on the segment 15b. The plurality of beads 136 may be spaced apart from each other. The bead 136 may enhance the rigidity of segment 15b. The bead 136 can prevent the shape of the segment 15b from being deformed due to an external impact. The segment 15b may be fixed to the rear of the display panel 10 by an adhesive member 70. The panel protector 97 (see FIG. 8) may be disposed between the adhesive member 70 and the display panel 10. For example, the adhesive member 70 may be a double-sided tape.

Referring to FIG. 11, a source PCB 120 may be located above the module cover 15. In the case of roll-up or roll-down, the position of the source PCB 120 may be changed with the movement of the module cover 15. A FFC cable 231 may be located in the central portion of the module cover 15 based on the first direction. The FFC cable 231 may be located in both ends of the module cover 15 based on the first direction.

Referring to FIG. 12, the segment 15d may include a depression 425 recessed in the −z axis direction. The depression 425 may form a space between the display panel 10 and the module cover 15.

The FFC cable 231 may be accommodated in a space formed by the depression 425. In addition, the depression 425 may improve the rigidity of the segment 15d.

The bead 136 may be located on the segment 15d excluding a portion where the depression 425 is located. The bead 136 may not be located in the portion where the depression 425 is located because the thickness of the segment 15d in the third direction becomes thinner.

Referring to FIG. 13, a penetrating portion 437 may be located in the central portion of the segment 15e based on the first direction. The penetrating portion 437 may penetrate the central portion of the segment 15e in the second direction. That is, the penetrating portion 437 may be a hole located in the segment 15e. The penetrating portion 437 may be a portion where the FFC cable 231 is located. Since the penetrating portion 437 is formed in the segment 15e, the thickness of the segment 15e may be reduced in comparison with the case where the FFC cable 231 is located in the depression 425.

The bead 136 may be located on the segment 15e excluding a portion where the penetrating portion 437 is located. In the portion where the penetrating portion 437 is located, the bead 136 may not be located because the thickness of the segment 15e in the third direction becomes thinner.

Referring to FIG. 14, a top case 167 may cover the source PCB 120 and the upper bar 75 as well as the display panel 10 and the module cover 15. One surface of the upper bar 75 may be coupled to the rear surface of the module cover 15, and the other surface thereof may be coupled to the source PCB 120. The upper bar 75 may be fixed to the module cover 15 to support the source PCB 120.

The lower end of the FFC cable 231 may be connected to a timing controller board 105 (see FIG. 15) inside a panel roller 143 (see FIG. 15). The FFC cable 231 may be wound around or unwound from the panel roller 143 together with the display unit 20.

A portion of the FFC cable 231 may be located between the display panel 10 and the module cover 15. A portion of the FFC cable 231 located between the display panel 10 and the module cover 15 may be referred to as a first portion 231a. The first portion 231a may be located in the depression 425 formed by the plurality of segments 15d. Alternatively, the first portion 231a may be accommodated in the depression 425 formed by the plurality of segments 15d.

A portion of the FFC cable 231 may penetrate the segment 15f. A portion of the FFC cable 231 that passes through the segment 15f may be referred to as a second portion 231b. The segment 15f may include a first hole 521a formed in the front surface and a second hole 521b formed in the rear surface. The first hole 521a and the second hole 521b may be connected to each other to form a single hole 521. The hole 521 may penetrate the segment 15f in the third direction. The second portion 231b may penetrate the hole 521. The hole 521 may be referred to as a connection hole 521.

The upper end of the FFC cable 231 may be electrically connected to the source PCB 120. A part of the FFC cable 231 may be located in the rear surface of the module cover 15. A portion of the FFC cable 231 located in the rear surface of the module cover 15 may be referred to as a third portion 231c. The third portion 231c may be electrically connected to the source PCB 120.

The third portion 231c may be covered by the top case 167. Accordingly, the third portion 231c may not be exposed to the outside.

Referring to FIG. 15, the FFC cable 231 may be connected to the timing controller board 105 mounted in the panel roller 143. A penetrating hole 615 may be formed on the panel roller 143, and the FFC cable 231 may be connected to the timing controller board 105 through the penetrating hole 615.

The penetrating hole 615 may be located in one side of the panel roller 143 and may penetrate an outer circumferential portion of the panel roller 143. The FFC cable 231 may be connected to one side of the timing controller board 105 through the penetrating hole 615.

Even when the FFC cable 231 is located in the outer circumference of the panel roller 143, it may maintain the connection with the timing controller board 105 due to the penetrating hole 615. Accordingly, the FFC cable 231 may rotate together with the panel roller 143 to prevent twisting.

A part of the FFC cable 231 may be wound around the panel roller 143. A portion of the FFC cable 231 wound around the panel roller 143 may be referred to as a fourth portion 231d. The fourth portion 231d may be in contact with the outer circumferential surface of the panel roller 143.

A part of the FFC cable 231 may pass through the penetrating hole 615. A portion of the FFC cable 231 passing through the penetrating hole 615 may be referred to as a fifth portion 231e.

The lower end of the FFC cable 231 may be electrically connected to the timing controller board 105. A part of the FFC cable 231 may be located inside the panel roller 143. A portion of the FFC cable 231 located inside the panel roller 143 may be referred to as a sixth portion 231f. The sixth portion 231f may be electrically connected to the timing controller board 105.

Referring to FIG. 16, the lower end of the display panel 10 may be connected to the roller 143. The display panel 10 may be wound around or unwound from the roller 143. The front surface of the display panel 10 may be coupled to the plurality of source PCBs 120. The plurality of source PCBs 120 may be spaced apart from each other.

A source chip on film (COF) 123 may connect the display panel 10 and the source PCB 120. The source COF 123 may be located in the front surface of the display panel 10. The roller 143 may include a first part 331 and a second part 337. The first part 331 and the second part 337 may be fastened by a screw. The timing controller board 105 may be mounted in the roller 143.

The source PCB 120 may be electrically connected to the timing controller board 105. The timing controller board 105 may send digital video data and the timing control signal to the source PCB 120.

The cable 117 may electrically connect the source PCB 120 and the timing controller board 105. For example, the cable 117 may be a flexible flat cable (FFC). The cable 117 may penetrate the hole 331a. The hole 331a may be formed in a seating portion 379 or the first part 331. The cable 117 may be located between the display panel 10 and the second part 337.

The seating portion 379 may be formed in an outer circumference of the first part 331. The seating portion 379 may be formed by stepping a portion of the outer circumference of the first part 331. The seating portion 379 may form a space B. When the display unit 20 is wound around the roller 143, the source PCB 120 may be accommodated in the seating portion 379. Since the source PCB 120 is accommodated in the seating portion 379, the source PCB 120 may not be twisted or bent, and durability may be improved.

The cable 117 may electrically connect the timing controller board 105 and the source PCB 120.

Referring to FIG. 17, the roller 143 wound around with the display unit 20 may be installed in a first base 31. The first base 31 may be a bottom surface of the housing 30. The roller 143 may be extended along the longitudinal direction of the housing 30. The first base 31 may be connected to the side surface 30a of the housing 30.

Referring to FIGS. 18 and 19, the beam 31a may be formed in the first base 31. The beam 31a may improve the bending or torsional rigidity of the first base 31. Many components may be installed in the first base 31, and the first base 31 can receive a large load. Since the rigidity of the first base 31 is improved, sagging due to the load can be prevented. For example, the beam 31a may be formed by a pressing process.

The second base 32 may be spaced upward from the first base 31. The space S1 may be formed in the first base 31 and the second base 32. The roller 143 wound around with the display unit 20 may be accommodated in the space S1. The roller 143 may be located between the first base 31 and the second base 32.

The second base 32 may be connected to the side surface 30a of the housing 30. The bracket 33 may be fastened to the upper surface of the first base 31. The bracket 33 may be fastened to the side surface 30a of the housing 30.

The beam 32a may be formed in the second base 32. The beam 32a may improve the bending or torsional rigidity of the second base 32. For example, the beam 32a may be formed by a press process.

A third part 32d may be connected to the first part 32b and the second part 32c. A fourth part 32e may be connected to the first part 32b and the second part 32c. A space S2 may be formed between the third part 32d and the fourth part 32e. Accordingly, bending or torsional rigidity of the second base 32 may be improved. The third part 32d may be referred to as a reinforcing rib 32d or a rib 32d. The fourth part 32e may be referred to as a reinforcing rib 32e or a rib 32e.

Many components can be installed in the second base 32 and the second base 32 can receive a large load. As the rigidity of the second base 32 is improved, sagging due to the load can be prevented.

A first reinforcing plate 34 may be located between the first base 31 and the second base 32. The first reinforcing plate 34 and the second base 32 may be fastened by a screw. The first reinforcing plate 34 may support the second base 32. The first reinforcing plate 34 may prevent sagging of the second base 32. The first reinforcing plate 34 may be located in the central portion of the first base 31 or in the central portion of the second base 32. The first reinforcing plate 34 may include a curved portion 34a. The curved portion 34a may be formed along the roller 143. The curved portion 34a may not be in contact with the roller 143 or the display unit 20 wound around the roller 143. The curved portion 34a may maintain a certain distance from the roller 143 so as not to interfere with the rotation of the roller 143.

A second reinforcing plate 35 may be fastened to the first base 31 and the first reinforcing plate 34. The second reinforcing plate 35 may support the first reinforcing plate 34. The second reinforcing plate 35 may be located behind the first reinforcing plate 34. The second reinforcing plate 35 may be located behind the first base 31. The second reinforcing plate 35 may be located perpendicular to the first base 31. The second reinforcing plate 35 may be fastened to the beam 31a of the first base 31. The second base 32 may face the front surface or rear surface of the housing 30.

Referring to FIG. 20, the second base 32f may not form a space. When the load that the second base 32f receives is not large, the second base 32f may have sufficient rigidity by including the beam 32g. The first base 31' may include a beam 31a'.

Referring to FIGS. 21 and 22, a motor assembly 810 may be installed in the second base 32. Drive shaft of the motor assembly 810 may be formed in both sides. The right driving shaft and the left driving shaft of the motor assembly 810 may rotate in the same direction. Alternatively, the right driving shaft and the left driving shaft of the motor assembly 810 may rotate in opposite directions.

The motor assembly 810 may include a plurality of motors. The plurality of motors may be connected in series with each other. The motor assembly 810 may output a high torque by connecting a plurality of motors in series.

A lead screw 840 may be located in the left side and the right side of the motor assembly 810, respectively. The motor assembly 810 may be connected to the lead screw 840. A coupling 811 may connect the lead screw 840 and the drive shaft of the motor assembly 810.

The lead screw 840 may be threaded along the longitudinal direction. The direction of the threads formed in the right lead screw 840 and the direction of the threads formed in the left lead screw 840 may be opposite to each other. The direction of the threads formed in the right lead screw 840 and the direction of the threads formed in the left lead screw 840 may be the same. The pitches of the left lead screw 840 and the right lead screw 840 may be the same.

The bearing 830a, 830b may be installed in the second base 32. The bearing 830a, 830b may support both sides of the lead screw 840. The bearing 830a, 830b may include an inner bearing 830b located close to the motor assembly 810 and an outer bearing 830a located far from the motor assembly 810. The lead screw 840 may be stably rotated by the bearing 830a, 830b.

The slide 820 may be engaged with the lead screw 840. The slide 820 may move forward or rearward in the longitudinal direction of the lead screw 840 according to the rotation of the lead screw 840. The slide 820 may move between the outer bearing 830a and the inner bearing 830b. The slide 820 may be located in the left lead screw 840 and the right lead screw 840, respectively. The left slide 820 may be engaged with the left lead screw 840. The right slide 820 may be engaged with the right lead screw 840.

The left slide 820 and the right slide 820 may be located symmetrically with respect to the motor assembly 810. Due to the driving of the motor assembly 810, the left slide 820 and the right slide 820 may move far away or approach from each other by the same distance.

Referring to FIG. 23, the motor assembly 810 may include a plate 812. The plate 812 may be referred to as a mount plate 812 or a motor mount plate 812. A coupling portion 32h may be formed in an upper surface of second base 32. The plate 812 may be fastened to the coupling portion 32h through a screw S. The motor assembly 810 may be spaced apart from the top surface of the second base 32. A washer 813 may be located between the top surface of the plate 812 and the screw S. The washer 813 may include a rubber material. The washer 813 may reduce vibration generated in the motor assembly 810. The washer 813 may improve driving stability of the display device 100.

Referring to FIG. 24, a guide rail 860 may be installed in the second base 32. The guide rail 860 may be located in parallel with the lead screw 840. The slide 820 may be engaged with the guide rail 860. A first stopper 861b may be located in one side of the guide rail 860, and a second stopper 861a may be located in the other side of the guide rail 860. The range in which the slide 820 can move may be limited to between the first stopper 861b and the second stopper 861a.

A spring 850 may wrap the lead screw 840. The lead screw 840 may penetrate the spring 850. The spring 850 may be located between the inner bearing 830b and the slide 820. One side of the spring 850 may contact the inner bearing 830b, and the other side of the spring 850 may contact the slide 820. The spring 850 may provide an elastic force to the slide 820.

When the slide 820 is caught in the first stopper 861b, the spring 850 may be maximally compressed. When the slide 820 is caught in the first stopper 861b, the length of the spring 850 may be minimized. When the slide 820 is caught in the first stopper 861b, the distance between the slide 820 and the inner bearing 830b may be minimized.

Referring to FIG. 25, when the slide 820 is caught in the second stopper 861a, the spring 850 may be maximally tensioned. When the slide 820 is caught in the second stopper 861b, the length of the spring 850 may be maximized. When the slide 820 is caught in the second stopper 861a, the distance between the slide 820 and the inner bearing 830b may be maximized.

Referring to FIG. 26, the first part 820a may be engaged with the guide rail 860. The first part 820a may move along the guide rail 860. Movement of the first part 820a in the longitudinal direction of the guide rail 860 may be restricted. The second part 820b may be located above the first part 820a. The first part 820a and the second part 820b may be fastened through a screw. The second part 820b may be spaced apart from the guide rail 860. The lead screw 840 may penetrate the second part 820b. For example, the second part 820b may include a male thread that engages with a female thread of the lead screw 840. Accordingly, even if the lead screw 840 is rotated, the slide 820 can be stably moved forward or rearward along the guide rail 860 without rotating.

The third part 820c may be coupled to one side of the second part 820b. The third part 820c may contact the spring 850. The third part 820c may be provided with an elastic force from the spring 850.

Referring to FIGS. 27 and 28, a link mount 920 may be installed in the second base 32. One side of a second arm 912 may be pivotably connected to a link mount 920. The other side of the second arm 912 may be pivotably connected to a joint 913. The other side of the second arm 912 may be pivotably connected to a second axis 913b. One side of a rod 870 may be pivotably connected to the slide 820. The other side of the rod 870 may be pivotably connected to the second arm 912 or a third arm 915. One side of the third arm 915 may be pivotably connected to the link mount 920. The other side of the third arm 915 may be pivotably connected to the other side of the rod 870. The link mount 920 may include a shaft 921. The second arm 912 or the third arm 915 may be pivotably connected to the shaft 921.

A link bracket 951 may be referred to as a link cap 951. The link bracket 951 may be coupled to a top case 950. The top case 950 may be referred to as a case top 950, an upper bar 950, a top 950, or a bar 950. The top case 950 may be located in an upper end of the display unit 20. The display unit 20 may be fixed to the top case 950.

One side of a first arm 911 may be pivotably connected to the joint 913. One side of the first arm 911 may be pivotably connected to a first shaft 913a. The other side of the first arm 911 may be pivotably connected to the link bracket 951 or the top case 950.

A gear g1 may be formed in one side of the first arm 911. A gear g2 may be formed in the other side of the second arm 912. The gear g1 of the first arm 911 and the gear g2 of the second arm 912 may be engaged with each other.

When the slide 820 approaches the outer bearing 830a, the second arm 912 or the third arm 915 may stand up. At this time, the direction in which the second arm 912 or the third arm 915 stands may be referred to as a standing direction DRS.

The second arm 912 may include a protrusion 914 protruding in the standing direction DRS. The protrusion 914 may be referred to as a connection part 914. The third arm 915 may include a protrusion 916 protruding in the standing direction DRS. The protrusion 916 may be referred to as a connection part 916. The protrusion 914 of the second arm 912 and the protrusion 916 of the third arm 915 may face or contact each other. The other side of the rod 870 may be fastened to the protrusion 914 of the second arm 912 or the protrusion 916 of the third arm 915.

A link 910 may include a first arm 911, a second arm 912, a third arm 915, and/or a joint 913.

Referring to FIGS. 29 and 30, an angle formed by the second arm 912 or the third arm 915 with respect to the second base 32 may be referred to as theta S. When the rod 870 is connected to the upper side of the second part 820b, an angle between the rod 870 and the second base 32 may be referred to as theta A, and the minimum force for the rod 870 to stand the second arm 912 or the third arm 915 may be referred to as Fa. When the rod 870 is connected to the middle of the second part 820b, an angle between the rod 870 and the second base 32 may be referred to as theta B, and the minimum force for the rod 870 to stand the second arm 912 or the third arm 915 may be referred to as Fb. When the rod 870 is connected to the lower side of the second part 820b, an angle between the rod 870 and the second base 32 may be referred to as theta C, and the minimum force for the rod 870 to stand the second arm 912 or the third arm 915 may be referred to as Fc.

A relationship of theta A<theta B<theta C can be established for the same theta S. In addition, a relationship of Fc<Fb<Fa may be established for the same theta S. If an angle formed by the second arm 912 or the third arm 915 with respect to the second base 32 is the same, the force required to stand up the second arm 912 or the third arm 915 can become smaller as the angle formed by the rod 870 and the second base 32 increases. The rod 870 may be connected to the lower side of the second part 820b to reduce the load applied on the motor assembly 810.

Referring to FIG. 31, the rod 870' may not be connected to the protrusion of the second arm 912' or the protrusion of the third arm 915'. When the angle formed by the second arm 912' or the third arm 915' with respect to the second base 32 is theta S, the angle formed by the rod 870' and the second base 32 is referred to as theta 1, and the minimum force for the rod 870' to stand up the second arm 912' or the third arm 915' may be referred to as F1.

Referring to FIG. 32, the rod 870 may be connected to the protrusion 914 of the second arm 912 or the protrusion 916 of the third arm 915. When the angle formed by the second arm 912 or the third arm 915 with respect to the second base 32 is theta S, the angle formed by the rod 870 and the second base 32 may be referred to as theta 2, and the minimum force for the rod 870 to stand the second arm 912 or the third arm 915 may be referred to as F2.

Referring to FIG. 33, when theta S is the same, theta 2 may be greater than theta 1. If Theta S is the same, F1 can be greater than F2. If the angle formed by the second arm 912, 912' and the second base 32 is the same, the force required to stand up the second arm 912, 912' may become smaller as the angle formed by the rod 870, 870' and the second base 32 becomes larger. The rod 870 may be connected to the protrusion 914, 916 to stand up the second arm 912 with less force than a case where the rod 870' is not connected to the protrusion. The rod 870 may be connected to the 914, 916 to reduce the load applied on the motor assembly 810.

Referring to FIG. 34, the second arm 912 or the third arm 915 may have a central axis CR. When the rod 870 is fastened to the second arm 912 by a distance r away from the central axis CR, the angle formed by the rod 870 and the second base 32 may be referred to as theta 2, and the minimum force for the 870 to stand the second arm 912 or the third arm 915 may be referred to as F3. When the rod 870 is fastened to the second arm 912 by a distance r' away from the central axis CR, the angle formed by the rod 870 and the second base 32 may be referred to as theta 2', and the minimum force for the rod 870 to stand the second arm 912 or the third arm 915 may be referred to as F4. When the rod 870 is fastened to the second arm 912 by a distance r" away from the central axis CR, the angle formed by the rod 870 and the second base 32 may be referred to as theta 2", and the minimum force for the rod 870 to stand the second arm 912 or the third arm 915 may be referred to as F5.

Referring to FIG. 35, when theta S is the same, theta 2" may be greater than theta 2', and theta 2' may be greater than theta 2. When theta S is the same, F3 may be greater than F4, and F4 may be greater than F5. As the rod 870 is fastened away from the central axis CR, the force required to stand the second arm 912 may be smaller. Since the rod 870 is fastened away from the central axis CR, the load on the motor assembly 810 may be reduced.

Referring to FIG. 36, the first arm 911 and the second arm 912 may be in contact with or close to the rear surface of the display unit 20. Since the first arm 911 and the second arm 912 are in contact with or close to the rear surface of the display unit 20, the display unit 20 may be stably wound around or unwound from a roller. The link mount 920 may include a first part 922 and a second part 923. The first part 922 and the second part 923 may face each other. A space S4 may be formed between the first part 922 and the second part 923. The first part 922 may face the display unit 20. The first part 922 may be located closer to the display unit 20 than the second part 923. The second arm 912 may be pivotably connected to the front surface of the first part 922. A part of the third arm 915 may be accommodated in the space S4 and pivotably connected to the first part 922 or the second part 923.

Referring to FIG. 37, the rod 870 may include a first part 871 and a second part 872. The first part 871 may include a connection part 871a in one side thereof. The second part 872 of the slide 820 may form a space S5 therein. The connection part 871a may be inserted into the space S5. The connection part 871a may be pivotably connected to the second part 820b (see FIG. 36) of the slide 820. The other side of the first part 871 may be connected to one side of the second part 872. The other side of the second part 872 may be pivotably connected to the second arm 912 or the third arm 915. The first part 871 may form a space S3 therein. The first part 871 may include a hole 871b. The lead screw 840 may be accommodated in the hole 871b or the space S3.

The distance between the second part 872 and the display unit 20 may be D1. The second arm 912 may have a thickness W1. A portion of the third arm 915 accommodated in the space S4 may have a thickness W3. The thickness W3 may be equal to the distance between the first part 922 and the second part 923. A portion of the third arm 915 that is not accommodated in the space S4 may have a thickness W2. The first part 922 may have a thickness W4. The thickness W2 may be greater than the thickness W3. The thickness W2 may be equal to the sum of the thickness W3 and the thickness W4. D1 may be the sum of the thickness W1 and the thickness W2.

The second arm 912 may be located in contact with or close to the rear surface of the display unit 20, and the third arm 915 may be located between the second arm 912 and the second part 872. The second part 872 can stably transmit power for standing the second arm 912 due to the third arm 915. The second part 872 may be connected to the first part 871 by moving forward with respect to the axis of rotation of the lead screw 840, so as to stably stand the second arm 912 or the third arm 915. Thus, the play between the second arm 912 and the second part 872 may be minimized.

Referring to FIG. 38, a pusher 930 may be installed in the link mount 920. The pusher 930 may be referred to as a lifter 930. A second part 932 may be fastened to the first part 931. The second part 932 may be in contact with or separated from the link bracket 951. The second part 932 may be made of a material having high elasticity. The first part 931 may be made of a material having a lower elasticity than the second part 932. The first part 931 may be made of a material having a higher rigidity than the second part 932. The first part 931 and the second part 932 may be collectively referred to as a head 936. The head 936 may be located above the link mount 920.

A third part 933 may be connected to the first part 931. Alternatively, the third part 933 may be extended downward from the first part 931. The third part 933 may be referred to as a tail 933. A fourth part 934 may protrude from the third part 933. The link mount 920 may form a space S6, and the third part 933 may be accommodated in the space S6. The space S6 may be opened upward. The space S6 in which the third part 933 is accommodated may be adjacent to the space S4 (see FIG. 37) in which the third arm 915 is accommodated. The second part 932 of the link mount 920 may include a hole 924. The hole 924 may be a long hole formed in the vertical direction. The length of the hole 924 may be H1. The fourth part 934 may be inserted into the hole 924. The spring 935 may be accommodated in the space S6. The spring 935 may be located below the third part 933. The spring 935 may provide an elastic force in the direction perpendicular to the third part 933.

The head 936 may be larger than the diameter of the space S6. When the head 936 is caught in the upper end of the space S6, the height of the head 936 from the second base 32 may be minimized. The minimum height of the head 936 may be referred to as H2. When the height of the head 936 is minimized, the fourth part 934 may be caught in the lower end of the space S6. When the height of the head 936 is minimized, the spring 935 may be maximally compressed. When the height of the head 936 is minimized, the elastic force provided by the spring 935 may be maximized. When the height of the head 936 is minimized, the height of the top case 950 may be maximized.

The pusher 930 may provide elastic force to the link bracket 951, while being in contact with the link bracket 951. Thus, the load applied on the motor assembly 810 to stand up the link 910 may be reduced.

Referring to FIG. 39, when the link 910 stands up sufficiently, the pusher 930 may be separated from the link bracket 951. When the pusher 930 is separated from the link bracket 951, the height of the head 936 from the second base 32 may be maximized. The maximum height of the head 936 may be referred to as H3. When the height of the head 936 is maximized, the fourth part 934 may be caught in the upper end of the hole 924 (see FIG. 38). If the height of the head 936 is maximized, the spring 935 may be maximally tensioned. When the height of the head 936 is maximized, the elastic force provided by the spring 935 may be minimized. The maximum height H3 of the head 936 may be substantially equal to the sum of the minimum height H2 of the head 936 and the length H1 of the hole.

Referring to FIG. 40, the display unit 20 may be in a state of being maximally wound around the roller 143. The display device 100 may be symmetrical with respect to the motor assembly 810. The height of the top case 950 may be minimized. The slide 820 may be in a position closest to the inner bearing 830b. The slide 820 may be in a state of being caught in the first stopper 861b. The spring 850 may be in a maximally compressed state. The pusher 930 may be in contact with the link bracket 951. The height of the pusher 930 may be minimized.

Referring to FIG. 41, about half of the display unit 20 may be in a state of being wound around the roller 143. The display device 100 may be symmetrical with respect to the motor assembly 810. About half of the display unit 20 may be in a state of being unwound from the roller 143. The slide 820 may be located between the first stopper 861b and the second stopper 861a. The pusher 930 may be separated from the link bracket 951. The height of the pusher 930 may be maximized.

Referring to FIG. 42, the display unit 20 may be in a state of being maximally unwound from the roller 143. The display device 100 may be symmetrical with respect to the motor assembly 810. The height of the top case 950 may be maximized. The slide 820 may be in a position closest to the outer bearing 830a. The slide 820 may be in a state of being caught in the second stopper 861a. The spring 850 may be in a state of maximum tension. The pusher 930 may be separated from the link bracket 951. The height of the pusher 930 may be maximized.

Referring to FIGS. 43 to 46, a link mount 920a, 920b may be installed in the base 31. The link mount 920a, 920b may include a right link mount 920a spaced to the right from a first right bearing 830a and a left link mount 920b spaced to the left from a second left bearing 830d.

A link 910a, 910b may be connected to the link mount 920a, 920b. The link 910a, 910b may include a right link 910a connected to the right link mount 920a and a left link 910b connected to the left link mount 920b.

The right link 910a may be referred to as a first link. The left link 910b may be referred to as a second link. The right link mount 920a may be referred to as a first link mount 920a. The left link mount 920b may be referred to as a second link mount 920b.

The link 910a, 910b may include a first arm 911a, 911b, a second arm 912a, 912b, and an arm joint 913a, 913b. One side of the second arm 912a, 912b may be rotatably connected to the link mount 920a, 920b. The other side of the second arm 912a, 912b may be rotatably connected to the arm joint 913a, 913b. One side of the first arm 911a, 911b may be rotatably connected to the arm joint 913a, 913b. The other side of the first arm 911a, 911b may be rotatably connected to the link bracket 951a, 951b.

The link bracket 951a, 951b may include a right link bracket 951a connected to the first arm 911a of the right link 910a and a left link bracket 951b connected to the first arm 911b of the left link 910b. The link bracket 951a, 951b may be connected to the upper bar 950.

The upper bar 950 may connect the right link bracket 951a and the left link bracket 951b.

A rod 870a, 870b may connect a slider 860a, 860b to the link 910a, 910b. One side of the rod 870a, 870b may be rotatably connected to the slider 860a, 860b. The other side of the rod 870a, 870b may be rotatably connected to the second arm 912a, 912b. The rod 870a, 870b may include a right rod 870a connecting the right slider 860a and the second arm 912a of the right link 910a and a left rod 870b connecting the left slider 860b and the second arm 912b of the left link 910b. The right rod 870a may be referred to as a first rod 870a. The left rod 870b may be referred to as a second rod 870b.

Specifically, a structure formed by a right lead screw 840a, the right slider 860a, the right rod 870a, and the right link 910a will be described. The right slider 860a may include a body 861a and a rod mount 862a. The body 861a may have a thread SS formed on an inner circumferential surface thereof. The thread formed in the body 861a may be engaged with the thread RS of the right lead screw 840a. The right lead screw 840a may penetrate the body 861a.

The rod mount 862a may be formed in the right side of the body 861a. The rod mount 862a may be rotatably connected to one side of the right rod 870a. The rod mount 862a may include a first rod mount 862a1 and a second rod mount 862a2. The first rod mount 862a1 may be disposed in front of the right lead screw 840a. The second rod mount 862a2 may be disposed behind the right lead screw 840a. The first rod mount 862a1 and the second rod mount 862a2 may be spaced apart from each other. The second rod mount 862a2 may be spaced apart from the first rod mount 862a1 in the −z axis direction. The right lead screw 840a may be located between the first rod mount 862a1 and the second rod mount 862a2.

The rod mount 862a may be rotatably connected to one side of the rod 870a through a connecting member C1. The connecting member C1 may penetrate the rod mount 862a and the right rod 870a.

The right rod 870a may be rotatably connected to a second arm 912a through a connecting member C2. The connecting member C2 may penetrate the second arm 912a and the right rod 870a.

The right rod 870a may include a transmission part 871a connected to the second arm 912a of the right link 910a and a cover 872a connected to the rod mount 862a of the right slider 860a. The transmission part 871a may transmit a force, which is generated as the right slider 860a moves forward or rearward along the right lead screw 840a, to the right link 910a.

The cover 872a may include a first plate 873a disposed in front of the right lead screw 840a. The first plate 873a may be disposed perpendicular to the base 31. Alternatively, the first plate 873a may face the right lead screw 840a.

The cover 872a may include a second plate 874a disposed behind the right lead screw 840a. The second plate 874a may be disposed perpendicular to the base 31. Alternatively, the second plate 874a may face the right lead screw 840a. Alternatively, the second plate 874a may be spaced apart from the first plate 873a. The right lead screw 840a may be located between the first plate 873a and the second plate 874a.

The cover 872a may include a third plate 875a connecting the first plate 873a and the second plate 874a. The third plate 875a may be connected to the transmission part. The third plate 875a may be located above the right lead screw 840a.

The cover 872a may include a fourth plate 876a connecting the first plate 873a and the second plate 874a. The fourth plate 876a may be connected to the third plate 875a. The fourth plate 876a may be located above the right lead screw 840a.

One side of the first plate 873a may be connected to the first rod mount 862a1. The first plate 873a and the first rod mount 862a1 may be connected through the connecting member C1'. The other side of the first plate 873a may be connected to the third plate 875a.

One side of the second plate 874a may be connected to the second rod mount 862a2. The second plate 874a and the second rod mount 862a2 may be connected through the connecting member C1. The other side of the second plate 874a may be connected to the third plate 875a.

When the right slider 860a is moved closer to the motor assembly 810, the right lead screw 840a and the right rod 870a may be in contact with each other. When the right lead screw 840a and the right rod 870a contact each other, mutual interference may occur and the movement of the right slider 860a may be restricted.

The cover 872a may provide a space S1 therein. The first plate 873a, the second plate 874a, the third plate 875a, and the fourth plate 876a may form the space S1. When the right slider 860a is moved closer to the motor assembly 810, the right lead screw 840a may be accommodated or escaped into the space S1 provided by the cover 872a. The right slider 860a may move closer to the motor assembly 810 than a case of not having the cover 872a, due to the space S1 provided by the cover 872a. That is, the cover 872a may expand the movable range of the right slider 860a by providing the space S1 therein. In addition, since the right lead screw 840a is accommodated in the cover 872a, the size of the housing 30 (see FIG. 2) can be reduced.

In addition, the cover 872a may limit the minimum value of the angle theta S formed between the second arm 912a and the base 31. The third plate 875a of the cover 872a may contact the second arm 912a and may support the second arm 912a, when theta S is sufficiently small. By supporting the second arm 912a, the third plate 875a may limit the minimum value of theta S and prevent sagging of the second arm 912a. That is, the cover 872a may serve as a stopper for preventing sagging of the second arm 912a. In addition, the third plate 875a may reduce the initial load for standing the second arm 912a by limiting the minimum value of theta S.

The lead screw 840a, 840b may be driven by a single motor assembly 810. The lead screw 840a, 840b is driven by a single motor assembly 810, so that the second arm 912a, 912b can stand up in symmetry. However, when driving the lead screw 840a, 840b by a single motor assembly 810, the load on the motor assembly 810 to stand the second arm 912a, 912b may be excessively increased. At this time, the third plate 875a may reduce the load on the motor assembly 810 to stand the second arm 912a, 912b, by limiting the minimum value of theta S.

The structure formed by the left lead screw 840b, the left slider 860b, the left rod 870b, and the left link 910b may be symmetric with the structure formed by the right lead screw 840a, the right slider 860a, the right rod 870a, and the right link 910a. In this case, the axis of symmetry may be the axis of symmetry ys of the motor assembly 810.

Referring to FIG. 47, a guide 850a, 850b, 850c, 850d may be connected to the bearing 830a, 830b, 830c, and 830d. The guide 850a, 850b, 850c, 850d may include a right guide 850a, 850b disposed in the right side of the motor assembly 810 and a left guide 850c, 850d disposed in the left side of the motor assembly 810.

The right guide 850a, 850b may have one side connected to a first right bearing 830a and the other side connected to a second right bearing 830b. The right guide 850a, 850b may be located in parallel with the right lead screw 840a. Alternatively, the right guide 850a, 850b may be spaced apart from the right lead screw 840a.

The right guide 850a, 850b may include a first right guide 850a and a second right guide 850b. The first right guide 850a and the second right guide 850b may be spaced apart from each other. The right lead screw 840a may be located between the first right guide 850a and the second right guide 850b.

The right slider 860a may include a protrusion. Alternatively, the display device may include a protrusion formed in the right slider 860a. The protrusion may be formed in the body of the slider. The protrusion may include a front protrusion (not shown) protruded in the +z-axis direction from the body 861a of the right slider 860a and a rear protrusion 865a protruded in the −z-axis direction from the body of the slider.

The first right guide 850a may penetrate the rear protrusion 865a. Alternatively, it may include a first hole 863a formed in the rear protrusion, and the first right guide 850a may penetrate the first hole 863a. The first hole 863a may be formed in the x-axis direction. The first hole 863a may be referred to as a hole 863a.

The second right guide (not shown) may penetrate the front protrusion (not shown). Alternatively, it may include a second hole (not shown) formed in the front protrusion, and the second right guide may penetrate the second hole. The second hole may be formed in the x-axis direction.

The right guide 850a, 850b may guide the right slider 860a to move more stably when the right slider 860a moves forward or rearward along the right lead screw 840a. As the right guide 850a, 850b stably guides the right slider 860a, the right slider 860a can move forward or rearward along the right lead screw 840a while not rotating with respect to the right lead screw 840a.

The structure formed by the left guide 850c, 850d, the left bearing 830a, 830b, 830c, and 830d, the left slider 860b, and the left lead screw 840b may be symmetrical with the structure formed by the right guide 850a, 850b, the right bearing 830a, 830b, 830c, and 830d, the right slider 860a, and the right lead screw 840a. In this case, the axis of symmetry may be the axis of symmetry ys of the motor assembly 810.

Referring to FIG. 48, a first spring 841a, 841b may be inserted into the lead screw 840a, 840b. Alternatively, the lead screw 840a, 840b may penetrate the first spring 841a, 841b. The first spring 841a, 841b may include a first right spring 841a disposed in the right side of the motor assembly 810 and a first left spring 841b disposed in the left side of the motor assembly 810.

The first right spring 841a may be disposed between the right slider 860a and the second right bearing 830b. One end of the first right spring 841a may be in contact with or separated from the right slider 860a. The other end of the first right spring 841a may be in contact with or separated from the second right bearing 830b.

When the second arm 912a is fully laid with respect to the base 31, the distance between the right slider 860a and the second right bearing 830b may be a distance RD3. The first right spring 841a may have a length greater than the distance RD3 in the state of not being compressed or tensioned. Thus, when the second arm 912a is fully laid with respect to the base 31, the first right spring 841a may be compressed between the right slider 860a and the second right bearing 830b. Then, the first right spring 841a may provide a restoring force to the right slider 860a in the +x axis direction.

When the second arm 912a changes from a fully laid state to a standing state with respect to the base 31, the restoring force provided by the first right spring 841a may assist the second arm 912a to stand up. As the first right spring 841a assists the second arm 912a to stand up, the load on the motor assembly 810 may be reduced.

The lead screw 840a, 840b may be driven by a single motor assembly 810. As the lead screw 840a, 840b is driven by a single motor assembly 810, the second arm 912a, 912b can stand up in symmetry. However, when the lead screw 840a, 840b is driven by a single motor assembly 810, the load on the motor assembly 810 to stand the second arm 912a, 912b may be excessively increased. At this time, the first right spring 841a assists the second arm 912a to stand up, so that the load on the motor assembly 810 can be decreased, and the load on the motor assembly 810 to stand the second arm 912a can be reduced.

Alternatively, when the second arm 912a changes from the standing state to the fully laid state with respect to the base 31, the restoring force provided by the first right spring 841a can alleviate the shock that occurs when the second arm 912a is laid with respect to the base 31. That is, the first right spring 841a may serve as a damper when the second arm 912a is laid with respect to the base 31. As the first right spring 841a serves as a damper, the load of the motor assembly 810 may be reduced.

The structure formed by the first left spring 841b, the left bearing 830a, 830b, 830c, and 830d, the left slider 860b, the left lead screw 840b, and the second arm 912a may be symmetrical with the structure formed by the first right spring 841a, the right bearing 830a, 830b, 830c, and 830d, the right slider 860a, the right lead screw 840a, and the second arm 912a. In this case, the axis of symmetry may be the axis of symmetry ys of the motor assembly 810.

Referring to FIG. 49, the second spring 851a, 851b may be inserted into the guide 850a, 850b, 850c, 850d. Alternatively, the guide 850a, 850b, 850c, 850d may penetrate the second spring 851a, 851b. The second spring 851a, 851b may include a second right spring 851a disposed in the right side of the motor assembly 810 and a second left spring 851b disposed in the left side of the motor assembly 810.

A plurality of second right springs 851a may be formed. The second right spring 851a may include a spring 940a, 940b inserted into the first right guide 850a and a spring 940a, 940b inserted into the second right guide 850b. Alternatively, the second right spring 851a may include a spring 940a, 940b through which the first right guide 850a passes and a spring 940a, 940b through which the second right guide 850b passes.

The guide 850a, 850b, 850c, 850d may include a locking jaw 852a, 852b. The locking jaw 852a, 852b may include a right locking jaw 852a disposed in the right side of the motor assembly 810 and a left locking jaw 852b disposed in the left side of the motor assembly 810.

The right locking jaw 852a may be disposed between the right slider 860a and the second right bearing 830b. The second right spring 851a may be disposed between the right slider 860a and the second right bearing 830b. One end of the second right spring 851a may be in contact with or separated from the right slider 860a. The other end of the second right spring 851a may be in contact with or separated from the right locking jaw 852a.

When the second arm 912a is fully laid with respect to the base 31, the distance between the right slider 860a and the right locking jaw 852a may be a distance RD4. The second right spring 851a may have a length greater than the distance RD4 in the state of being not compressed or tensioned. Thus, when the second arm 912a is fully laid with respect to the base 31, the second right spring 851a may be compressed between the right slider 860a and the right locking jaw 852a. The second right spring 851a may provide a restoring force to the right slider 860a in the +x axis direction.

When the second arm 912a changes from the fully laid state to the standing state with respect to the base 31, the restoring force provided by the second right spring 851a may assist the second arm 912a to stand up. As the second right spring 851a assists the second arm 912a to stand, the load on the motor assembly 810 can be reduced.

The lead screw 840a, 840b may be driven by a single motor assembly 810. As the lead screw 840a, 840b is driven by a single motor assembly 810, the second arm 912a, 912b may stand up in symmetry. However, when the lead screw 840a, 840b is driven by a single motor assembly 810, the load on the motor assembly 810 to stand the second arm 912a, 912b may be excessively increased. At this time, the second right spring 851a may assist the second arm 912a to stand up so that the load on the motor assembly 810 can be decreased, thereby reducing the load on the motor assembly 810 to stand the second arm 912a.

Alternatively, when the second arm 912a changes from the standing state to the fully laid state with respect to the base 31, the restoring force provided by the second right spring 851a can alleviate the shock that occurs when the second arm 912a is laid with respect to the base 31. That is, the second right spring 851a may serve as a damper when the second arm 912a is laid with respect to the base 31. As the second right spring 851a serves as a damper, the load of the motor assembly 810 may be reduced.

The structure formed by the second left spring 851b, the left locking jaw 852b, the left slider 860b, the left guide 850c, 850d, and the second arm 912a may be symmetric with the structure formed by the above-described second right spring 851a, the right locking jaw 852a, the right slider 860a, the right guide 850a, 850b, and the second arm 912a. In this case, the axis of symmetry may be the axis of symmetry ys of the motor assembly 810.

Referring to FIGS. 50 to 52, the second arm 912a may stand up by receiving a restoring force from the first right spring 841a and the second right spring 851a.

An angle formed by the second arm 912a with respect to the base 31 may be referred to as an angle theta S. The angle formed by the right rod 870a with respect to the base 31 may be referred to as an angle theta T. The force applied by the motor assembly 810 for moving the right slider 860a in the +x-axis direction may be referred to as FA. The force exerted on the right slider 860a by the first right spring 841a may be referred to as FB. The force exerted on the right slider 860a by the second right spring 851a may be referred to as FC.

The force transmitted by the right rod 870a to the second arm 912a may be referred to as FT.

When the second arm 912a is fully laid with respect to the base 31, the angle theta S and the angle theta T may have minimum values. When the second arm 912a changes from the fully laid state to the standing state with respect to the second base 31, the angle theta S and the angle theta T may be gradually increased.

When the second arm 912a is fully laid with respect to the base 31, the first right spring 841a may be compressed. The compressed first right spring 841a may provide restoring force FB to the right slider 860a. The restoring force FB may act in the +x direction. When the second arm 912a is fully laid with respect to the base 31, the compression displacement amount of the first right spring 841a may be maximized, and the magnitude of the restoring force FB may have a maximum value. When the second arm 912a changes from the fully laid state to the standing state with respect to the base 31, the compression displacement amount of the first right spring 841a may be gradually decreased, and the magnitude of the restoring force FB may be gradually decreased.

When the second arm 912a is fully laid with respect to the base 31, the second right spring 851a may be compressed. The compressed second right spring 851a may provide restoring force FC to the right slider 860a. The restoring force FC may act in the +x direction. When the second arm 912a is fully laid with respect to the base 31, the compression displacement amount of the second right spring 851a may be maximized, and the magnitude of the restoring force FC may have a maximum value. When the second arm 912a changes from the fully laid state to the standing state with respect to the base 31, the compression displacement amount of the second right spring 851a may be gradually decreased, and the magnitude of the restoring force FC may be gradually decreased.

The force FT that the right rod 870a transmits to the second arm 912a may be a summed force of the force FA applied by the motor assembly 810 for moving the right slider 860a in the +x-axis direction, the restoring force FB of the first right spring 841a, and the restoring force FC of the second right spring 851a.

When the second arm 912a starts to stand up in the state where the second arm 912a is fully laid with respect to the base 31, the load of the motor assembly 810 may be maximized. At this time, the magnitude of the restoring force FB provided by the first right spring 841a may be maximized. In addition, the magnitude of the restoring force FC provided by the second spring 851a, 851b may be maximized.

When the second arm 912a changes from the fully laid state to the standing state with respect to the base 31, the restoring force provided by the first right spring 841a and the second right spring 851a may assist to stand the second arm 912a. As the first right spring 841a and the second right spring 851a assist the second arm 912a to stand, the load of the motor assembly 810 can be reduced.

The first right spring 841a and the second right spring 851a may simultaneously provide the restoring force (the summed force of the restoring force FB and the restoring force FC) to the right slider 860a. The restoring force (the summed force of the restoring force FB and the restoring force FC) may be provided to the right slider 860a until the distance RD5 between the right slider 860a and the right locking jaw 852a becomes equal to the length of the second right spring 851a.

When the distance RD5 between the right slider 860a and the right locking jaw 852a is equal to the length of the second right spring 851a, the compression displacement amount of the second right spring 851a may become zero. When the compression displacement amount of the second right spring 851a is zero, the restoring force FC provided by the second right spring 851a to the right slider 860a may be zero.

When the distance RD5 between the right slider 860a and the right locking jaw 852a is greater than the length of the second right spring 851a, only the first right spring 841a may provide the restoring force FB to the right slider 860a. The restoring force FB may be provided to the right slider 860a until the distance RD6 between the right slider 860a and the second right bearing 830b becomes equal to the length of the first right spring 841a.

When the distance RD6 between the right slider 860a and the second right bearing 830b is equal to the length of the first right spring 841a, the compression displacement amount of the first right spring 841a may be zero. When the compression displacement amount of the first right spring 841a becomes zero, the restoring force FB provided by the first right spring 841a to the right slider 860a may be zero.

When the distance RD6 between the right slider 860a and the second right bearing 830b is greater than the length of the first right spring 841a, the motor assembly 810 may stand the second arm 912a without receiving the restoring force from the first right spring 841a or the second right spring 851a.

The structure formed by the first left spring 841b, the second left spring 851b, the left locking jaw 852b, the left slider 860b, the left guide 850c, 850d, the left lead screw 840b, the left rod 870b, and the second arm 912a may be symmetrical with the structure formed by the first right spring 841a, the second right spring 851a, the right locking jaw 852a, the right slider 860a, the right guide 850a, 850b, the right lead screw 840a, the right rod 870a, and the second arm 912a. In this case, the axis of symmetry may be the axis of symmetry ys of the motor assembly 810.

Referring to FIG. 53, the pusher 930a, 930b may be connected to the link mount 920a, 920b. The pusher 930a, 930b may include a right pusher 930a disposed in the right side of the motor assembly 810 and a left pusher 930b disposed in the left side of the motor assembly 810.

The link mount 920a, 920b may form an accommodation space A. The accommodation space A may accommodate the spring 940a, 940b and the pusher 930a, 930b. The spring 940a, 940b may include a right spring 940a disposed in the right side of the motor assembly 810 and a left spring 940b disposed in the left side of the motor assembly 810. The accommodation space A may be referred to as an internal space A.

The link mount 920a, 920b may include a first hole 922a connecting the accommodation space A and an external space (the first hole corresponding to 920b is not shown). The first hole 922a may be formed in the upper surface of the link mount 920a, 920b. The first hole 922a may be referred to as a hole 922a.

The pusher 930a, 930b may be located perpendicular to the base 31. Alternatively, the pusher 930a, 930b may be disposed parallel to the y axis. The spring 940a, 940b may be located perpendicular to the base 31. Alternatively, the spring 940a, 940b may be disposed parallel to the y axis.

The pusher 930a, 930b may include a first part 931a, 931b and a second part 932a, 932b. The second part 932a, 932b may be connected to the lower side of the first part 931a, 931b. The lower end of the second part 932a, 932b may be connected to the spring 940a, 940b. All or part of the second part 932a, 932b may be accommodated in the accommodation space A formed by the link mount 920a, 920b. The second part 932a, 932b may have a diameter equal to the diameter of the first hole 922a or may have a diameter smaller than the diameter of the first hole 922a. The second part 932a, 932b may penetrate the first hole 922a.

The first part 931a, 931b may be located outside the link mount 920a, 920b. Alternatively, the first part 931a, 931b may be located outside the accommodation space A of the link mount 920a, 920b. The first part 931a, 931b may have a diameter larger than the diameter of the first hole 922a.

The first part 931a, 931b may be in contact with or spaced apart from the link bracket 951a, 951b. For example, when the second arm 912a, 912b is fully laid with respect to the base 31, the first part 931a, 931b may be in contact with the link bracket 951a, 951b. Alternatively, when the second arm 912a, 912b fully stands up with respect to the base 31, the first part 931a, 931b may be spaced apart from the link bracket 951a, 951b.

When the first part 931a, 931b is in contact with the link bracket 951a, 951b, the pusher 930a, 930b may receive a force from the link bracket 951a, 951b. The force applied to the pusher 930a, 930b may be in a downward direction. Alternatively, the force applied to the pusher 930a, 930b may be in the −y axis direction. Alternatively, the link bracket 951a, 951b may press the pusher 930a, 930b. The direction in which the link bracket 951a, 951b presses the pusher 930a, 930b may be downward. Alternatively, the direction in which the link bracket 951a, 951b presses the pusher 930a, 930b may be in the −y axis direction.

When the first part 931a, 931b is applied with a force, the spring 940a, 940b may be compressed. The compressed spring 940a, 940b may provide restoring force to the pusher 930a, 930b. The direction of the restoring force may be opposite to the direction of the force applied to the first part 931a, 931b. Alternatively, the restoring force may act in the +y-axis direction.

The link mount 920a, 920b may include a second hole 921a (the second hole corresponding to 920b is not shown). The second hole 921a may connect the accommodation space A and the external space. All or part of the spring 940a, 940b may be exposed to the outside through the second hole 921a. All or part of the pusher 930a, 930b may be exposed to the outside through the second hole 921a. In the maintenance or repair of the display device, a service provider may check the operating state of the pusher 930a, 930b through the second hole 921a. The second hole 921a may provide a service provider with convenience of maintenance or repair.

Referring to FIGS. 54 to 56, the right link 910a may stand up by receiving the restoring force from the right pusher 930a. It will be described based on the right link 910a.

An angle formed by the second arm 912a with respect to the base 31 may be referred to as an angle theta S. The force transmitted by the right rod 870a to the second arm 912a may be referred to as FT. The force transmitted by the right pusher 930a to the right link bracket 951a may be referred to as FP.

Referring to FIG. 54, when the second arm 912a is fully laid with respect to the base 31, the angle theta S may have a minimum value. The right spring 940a connected to the right pusher 930a may be compressed maximally, and the magnitude of the restoring force FP may have a maximum value. The compressed right spring 940a may provide restoring force FP to the right pusher 930a. The right pusher 930a may transmit the restoring force FP to the right link bracket 951a. The restoring force FP can act in the +y-axis direction.

If the second arm 912a is fully laid with respect to the base 31, the distance HL from the base 31 to the upper end of the right pusher 930a may have a minimum value. The first part 931a of the right pusher 930a may protrude to the outside of the right link mount 920a, and the second part 932a of the right pusher 930a may be fully accommodated in the accommodation space 923a of the right link mount 920a.

Referring to FIG. 55, when the second arm 912a changes from the fully laid state to the standing state with respect to the base 31, the angle theta S may gradually increase. The compression displacement amount of the right spring 940a may gradually decrease, and the magnitude of the restoring force FP may gradually decrease.

As the angle theta S gradually increases, at least a part of the second part 932a of the right pusher 930a may protrude to the outside of the right link mount 920a. The length by which the second part 932a of the right pusher 930a protrudes to the outside of the right link mount 920a may be referred to as a length HP. The distance HL from the base 31 to the upper end of the right pusher 930a may increase by HP than a case where the second arm 912a is fully laid with respect to the base 31.

Referring to FIG. 56, when the second arm 912a stands up with respect to the base 31, the right pusher 930a and the right link bracket 951a may be separated from each other. The compression displacement amount of the right spring 940a may be zero. When the compression displacement amount of the right spring 940a becomes zero, the restoring force FP provided by the right pusher 930a to the right link bracket 951a may be zero.

In addition, the length HP by which the second part 932a of the right pusher 930a protrudes to the outside of the right link mount 920a may have a maximum value. The distance HL from the base 31 to the upper end of the right pusher 930a may have a maximum value.

That is, the right pusher 930a may assist the second arm 912a to stand and reduce the load of the motor assembly 810 by applying a restoring force to the right link bracket 951a, while the right pusher 930a and the right link bracket 951a are in contact with each other.

The lead screw 840a, 840b may be driven by a single motor assembly 810. As the lead screw 840a, 840b is driven by a single motor assembly 810, the second arm 912a, 912b can stand up in symmetry. However, when the lead screw 840a, 840b is driven by a single motor assembly 810, the load on the motor assembly 810 to stand the second arm 912a, 912b may be excessively increased. At this time, the right pusher 930a may apply the restoring force to the right link bracket 951a, thereby assisting the second arm 912a to stand up and reducing the load of the motor assembly 810.

Alternatively, when the second arm 912a changes from the standing state to the fully laid state with respect to the base 31, the restoring force that the right pusher 930a provides to the right link bracket 951a can alleviate the shock that occurs when the link 910a is laid with respect to the base 31. That is, the restoring force provided by the right pusher 930a to the right link bracket 951a may serve as a damper when the link 910a is laid with respect to the base 31. As the right pusher 930a serves as a damper, the load of the motor assembly 810 may be reduced.

The structure formed by the left pusher 930b, the left spring 940b, the left link bracket 951b, the left link mount 920b, and the left rod 870b may be symmetric with the structure formed by the right pusher 930a, the right spring 940a, the right link bracket 951a, the right link 910a mount, and the right rod 870a. In this case, the axis of symmetry may be the axis of symmetry of the motor assembly 810.

Referring to FIGS. 57 to 59, the panel roller 143 may be installed in the base 31. The panel roller 143 may be installed in front of the lead screw 840a, 840b. Alternatively, the panel roller 143 may be disposed in parallel with the longitudinal direction of the lead screw 840a, 840b. Alternatively, the panel roller 143 may be spaced apart from the lead screw 840a, 840b.

The display unit 20 may include a display panel 10 and a module cover 15. The lower side of the display unit 20 may be connected to the panel roller 143, and the upper side of the display unit 20 may be connected to the upper bar 75. The display unit 20 may be wound around or unwound from the panel roller 143.

The distance from the axis of symmetry ys of the motor assembly 810 to the right slider 860a may be referred to as a distance RD. The distance from the axis of symmetry ys of the motor assembly 810 to the left slider 860b may be referred to as a distance LD. The distance between the right slider 860a and the left slider 860b may be referred to as a distance SD. The distance SD may be the sum of the distance RD and the distance LD. The distance from the base 31 to the upper end of the display unit 20 may be referred to as a distance HD.

Referring to FIG. 57, when the second arm 912a, 912b is fully laid with respect to the base 31, the distance SD between the right slider 860a and the left slider 860b may have a minimum value. The distance RD from the axis of symmetry ys of the motor assembly 810 to the right slider 860a may be the same as the distance LD from the axis of symmetry ys of the motor assembly 810 to the left slider 860b.

When the second arm 912a, 912b is fully laid with respect to the base 31, the distance HD from the base 31 to the upper end of the display unit 20 may have a minimum value.

When the second arm 912a, 912b is fully laid with respect to the base 31, the first spring 841a, 841b may contact the slider 860a, 860b. In addition, the second spring 851a, 851b may contact the slider 860a, 860b. In addition, the pusher 930a, 930b may contact the link bracket 951a, 951b.

When the second arm 912a, 912b is fully laid with respect to the base 31, the amount of compression of the first spring 841a, 841b may have a maximum value, and the magnitude of the restoring force provided to the slider 860a, 860b by the first spring 841a, 841b may have a maximum value.

When the second arm 912a, 912b is fully laid with respect to the base 31, the amount of compression of the second spring 851a, 851b may have a maximum value, and the magnitude of the restoring force provided to the slider 860a, 860b by the second spring 851a, 851b may have a maximum value.

When the second arm 912a, 912b is fully laid with respect to the base 31, the amount of compression of the spring 940a, 940b may have a maximum value, and the magnitude of the restoring force provided to the pusher 930a, 930b by the spring 940a, 940b may have a maximum value.

When the second arm 912a, 912b start to stand with respect to the base 31, the second arm 912a, 912b may stand by receiving a restoring force from the first spring 841a, 841b, the second spring 851a, 851b, and the spring 940a, 940b. Thus, the load on the motor assembly 810 may be reduced.

Referring to FIG. 58, as the second arm 912a, 912b stands with respect to the base 31, the distance SD between the right slider 860a and the left slider 860b may gradually increase. Even if the distance SD increases, the distance LD and the distance RD may be equal to each other. That is, the right slider 860a and the left slider 860b may be symmetrically located with respect to the axis of symmetry ys of the motor assembly 810. In addition, the extent to which the second arm 912a, 912b of the right link 910a stands with respect to the base 31 and may be equal to the extent to which the second arm 912a, 912b of the left link 910b stands with respect to the base 31.

As the second arm 912a, 912b stands with respect to the base 31, the distance HD from the base 31 to the upper end of the display unit 20 may gradually increase. The display unit 20 may be unwound from the panel roller 143. Alternatively, the display unit 20 may be unfolded from the panel roller 143.

When the second arm 912a, 912b fully stands up with respect to the base 31, the first spring 841a, 841b may be separated from the slider 860a, 860b. In addition, when the second arm 912a, 912b fully stands up with respect to the base 31, the second spring 851a, 851b may be separated from the slider 860a, 860b. In addition, when the second arm 912a, 912b stands up with respect to the base 31, the pusher 930a, 930b may be separated from the link bracket 951a, 951b.

The separation of the first spring 841a, 841b from the slider 860a, 860b, the separation of the second spring 851a, 851b from the slider 860a, 860b, and the separation of the pusher 930a, 930b from the link bracket 951a, 951b may proceed independently of each other. That is, the order of the separation of the first spring 841a, 841b from the slider 860a, 860b, the separation of the second spring 851a, 851b from the slider 860a, 860b, and the separation of the pusher 930a, 930b from the link bracket 951a, 951b may be mutually variable.

The angle formed between the axis xs1 parallel to the base 31 and the second arm 912a may be referred to as theta R. The angle formed between the axis xs1 parallel to the base 31 and the first arm 911a may be referred to as theta R'. The axis xs1 and x-axis may be parallel.

When the second arm 912a is fully laid with respect to the base 31, or while the second arm 912a stands up with respect to the base 31, or when the standing of the second arm 912a with respect to the base 31 is completed, theta R and theta R' can be maintained to be the same.

The angle formed between the axis xs2 parallel to the base 31 and the second arm 912b may be referred to as theta L. The angle formed between the axis xs2 parallel to the base 31 and the first arm 911b may be referred to as theta L'. The axis xs2 and x-axis may be parallel.

When the second arm 912b is fully laid with respect to the base 31, or while the second arm 912b stands up with respect to the base 31, or when the standing of the second arm 912a with respect to the base 31 is completed, theta L and theta L' can be maintained to be the same.

The axis xs1 and the axis xs2 may be the same axis mutually.

Referring to FIG. 59, when the second arm 912a, 912b fully stands up with respect to the base 31, the distance SD between the right slider 860a and the left slider 860b may have a maximum value. Even when the distance SD is maximized, the distance LD and the distance RD may be equal to each other.

When the second arm 912a, 912b fully stands up with respect to the base 31, the distance HD from the base 31 to the upper end of the display unit 20 may have a maximum value.

Referring to FIG. 60, the module cover 15 is provided as a flexible sheet and may be wound around or unwound from the roller 143. In this case, the module cover 15 may be referred to as a cover sheet or a sheet.

The cover sheet 15 may be coupled to the rear of the display panel 10 to improve torsional rigidity and/or bending rigidity of the display panel. For example, the cover sheet 15 may include a metal material. For example, the cover sheet 15 may include a stainless material. For example, the thickness of the cover sheet 15 may be 0.1~0.3 mm.

The cover sheet 15 may include a base 151 and a plurality of holes 153. The plurality of holes 153 may be formed to penetrate the base 151. The plurality of holes 153 may be formed throughout the left-right direction and up-down direction of the cover sheet 15. In this case, compared to a case in which the plurality of holes 153 are not provided, the cover sheet 15 having the plurality of holes 153 can be easily wound around or unwound from the roller 143.

Referring to FIGS. 60 and 61, each of the plurality of holes 153 may be formed to be elongated along the longitudinal direction of the roller 143, and formed to be narrower and curved as it progresses toward the center of the hole 153. For example, the hole 153 may be formed in a dumbbell shape as a whole. The boundary of the hole 153 may be divided into a first zone 1531, a second zone 1532, a third zone 1533, and a fourth zone 1534.

The first zone 1531 may be located in the upper side of the center of the hole 153. The first zone 1531 may correspond to a portion of an arc having a first radius R1 with respect to a first center O1 located outside the hole 153.

The second zone 1532 may be connected to the first zone 1531 and may be located in the right side based on the center of the hole 153. The second zone 1532 may correspond to a portion of an arc having a second radius R2 with respect to the second center O2 located inside the hole 153. Here, the length of the second zone 1532 may be shorter than the length of the first zone 1531, and the second radius R2 may be smaller than the first radius R1.

The third zone 1533 is connected to the second zone 1532, and may be located in the lower side based on the center of the hole 153. The third zone 1533 may correspond to a portion of an arc having a third radius R3 with respect to a third center O3 located outside the hole 153. Here, the third zone 1533 and the first zone 1531 may form a symmetry with respect to an imaginary line (not shown) extending in the left-right direction while passing through the center of the hole 153. That is, the length of the third zone 1533 may be equal to the length of the first zone 1531, and the third radius R3 may be equal to the first radius R1.

The fourth zone 1534 may be connected to the third zone 1533 and may be located in the left side based on the center of the hole 153. The fourth zone 1534 may correspond to a portion of an arc having a fourth radius R4 with respect to a fourth center O4 located inside the hole 153. Here, the fourth zone 1534 and the second zone 1532 may form a symmetry with respect to an imaginary line (not shown) extending in the up-down direction while passing through the center of the hole 153. That is, the length of the fourth zone 1534 may be equal to the length of the second zone 1532, and the fourth radius R4 may be equal to the second radius R2.

Such a shape of the hole 153 may allow the cover sheet 15 to easily wind around or unwind from the roller 143 in a direction (e.g. up-down direction) intersecting with the longitudinal direction of the roller 143.

Referring to FIGS. 62 and 63, a first adhesive member 11 may be coupled to the display panel 10 and the cover sheet 15 at between the display panel 10 and the cover sheet 15. For example, the first adhesive member 11 may be a double-sided tape.

Referring to FIG. 62, the lower end of the cover sheet 15 is coupled to the roller 143, and a point belonging to an edge in contact with the roller 143 among the lower end of the cover sheet 15 may be referred to as a contact point MO. In this case, when the roller 143 rotates counterclockwise, the display panel 10 and the cover sheet 15 may be wound around the roller 143 clockwise. In this case, the rear surface of the cover sheet 15 may contact the outer circumferential surface of the roller 143.

Referring to FIG. 63, the lower end of the display panel 10 is coupled to the roller 143, and a point belonging to an edge in contact with the roller 143 among the lower end of the display panel 10 may be referred to as a contact point MO. In this case, when the roller 143 rotates in a clockwise direction, the display panel 10 and the cover sheet 15 may be wound around the roller 143 in a counterclockwise direction. In this case, the front surface of the display panel 10 may contact the outer circumferential surface of the roller 143.

When the cover sheet 15 is wound around the roller 143, the cover sheet 15 may include an area forming a straight line and an area forming a curved line. That is, the cover sheet 15 wound around the roller 143 generally forms a curved line, but may form a straight line at a portion spanning the lower end of the cover sheet 15 coupled to the roller 143. Specifically, there may exist an area forming a straight line within an angle rotated by theta X in the rotation direction of the roller 143 from the imaginary line connecting the center RO of the roller and the contact point MO, and a corresponding zone may be referred to as a first zone SC1. In addition, there may exist an area forming a curved line within an angle rotated by theta (360°-X) in the direction opposite to the rotation direction of the roller 143 from the imaginary line connecting the center RO of the roller and the contact point MO, and a corresponding zone may be referred to as a second zone SC2.

The cover sheet 15 in the first zone SC1 may include an area forming a straight line and an area forming a curved line. That is, the cover sheet 15 wound around the roller 143 generally forms a straight line at a portion spanning the lower end of the cover sheet 15 coupled to the roller 143, but may partially form a curved line at a point adjacent to the lower end of the cover sheet 15. Specifically, there may exist an area forming a curved line within an angle rotated by theta Y in the rotation direction of the roller 143 from the imaginary line connecting the center RO of the roller and the contact point MO, and a corresponding zone may be referred to as a first-second zone SC12. In addition, there may exist an area forming a straight line in a zone of the first zone SC1 excluding the first-second zone SC12, and a corresponding zone may be referred to as a first-first zone SC11.

When the cover sheet 15 is wound around the roller 143, as the distance from the center RO of the roller increases, the curvature of the cover sheet 15 may decrease. In other words, as the distance from the center of the center RO of the roller increases, the radius of curvature of the cover sheet 15 may increase. Accordingly, a different stress may be applied to the cover sheet 15 depending on the distance from the center RO of the roller. That is, since the stress applied to the cover sheet 15 increases as the distance from the center RO of the roller decreases, it is preferable that the flexible characteristic of the cover sheet 15 becomes greater as the cover sheet 15 has a shorter distance from the center RO of the roller.

Referring to FIG. 64, the cover sheet 15 may include a plurality of sections. Each of the plurality of sections may be elongated along the longitudinal direction of the roller 143. The plurality of sections may be sequentially arranged in a direction (e.g., up-down direction) intersecting with the longitudinal direction of the roller 143.

The plurality of sections may include a first section (i1), a second section (i2), . . . , and an n-th section (in) sequentially from the bottom. Here, n is a natural number. For example, n may be 24. In this case, the first section (i1), the second section (i2), . . . , and the n-th section (in) may be wound around the roller 143 in this order. For example, the vertical length, i.e., the width, of each of the plurality of sections may be equal to each other. Each of the plurality of holes 153 may be formed in each of the plurality of sections. For example, the plurality of holes 153 may be alternately disposed in a direction intersecting with the longitudinal direction of the roller 143. For example, the size of the plurality of holes 153 or the distance therebetween may be 0.1 to 10 mm.

Among the plurality of holes 153, a plurality of first holes (153i1: 153i11, 153i12, . . . , 153i1n, where n is a natural number) may be located in the first section i1. The plurality of first holes 153i1 may be disposed at first intervals. The plurality of first holes 153i1 may be disposed at first horizontal intervals in the longitudinal direction of the roller 143, and may be disposed at first vertical intervals in a direction intersecting with the longitudinal direction of the roller 143. Here, the first interval may include the first horizontal interval and the first vertical interval.

Specifically, the plurality of first holes 153i1 may be disposed in the up-down direction to form a plurality of first rows, and the holes disposed in the plurality of first rows may be disposed to form a plurality of first columns in the left-right direction. In this case, the interval between the plurality of first rows may be maintained constant, and the interval between the plurality of first columns may also be maintained constant.

For example, each of the plurality of first holes 153i1 may have the same length d10 and the same shape. The holes 153i1 located in a 1-1 row (i1-1), which is one of the plurality of first rows, may be spaced apart from each other by the same first horizontal interval d11. In addition, the holes 153i1 located in a 1-2 row (i1-2) located in the upper side of the 1-1 row (i1-1) among the plurality of first rows may also be spaced apart by the same first horizontal interval d11. In addition, the distance, between the centers (ci11 and ci12) of each of a 1-1 hole (153i11) and a 1-2 hole (153i12) that are adjacent to each other as the holes located in the 1-1 row (i1-1), may be d12. In this case, a distance between the center ci13 of the 1-3 hole (153i13) adjacent to the 1-1 hole (153i11) and the 1-2 hole (153i12) as a hole located in the 1-2 row (i1-2), and the center ci11 of the 1-1 hole (153i11) or the center ci12 of the 1-2 hole (153i12) may be d13. Further, since a line connecting the centers (ci11, ci12, and ci13) of the 1-1 hole (153i11), the 1-2 hole (153i12), and the 1-3 hole (153i13), respectively, forms an isosceles triangle, a vertical distance d14 from the line connecting the center ci11 of the 1-1 hole (153i11) and the center ci12 of the 1-2 hole (153i12) to the center ci13 of the 1-3 hole (153i13) may be calculated as a square root of (d13 square−(d12/2) square).

A plurality of second holes 153i2 (153i21, 153i22, 153i2n, where n is a natural number) among the plurality of holes 153 may be located in a second section i2. The plurality of second holes 153i2 may be disposed at second intervals. The plurality of second holes 153i2 may be disposed at second horizontal intervals in the longitudinal direction of the roller 143, and may be disposed at second vertical intervals in a direction intersecting with the longitudinal direction of the roller 143. Here, the second interval may include the second horizontal interval and the second vertical interval. In this case, the second horizontal interval may be greater than the first horizontal interval, and the second vertical interval may be greater than the first vertical interval.

Specifically, the plurality of second holes 153i2 may be disposed in the up-down direction to form a plurality of second rows, and the holes disposed in the plurality of second rows may be disposed in the left-right direction to form a plurality of second columns. In this case, the interval between the plurality of second rows may be maintained constant, and the interval between the plurality of second columns may also be maintained constant.

For example, each of the plurality of second holes 153i2 may have the same length d20 and the same shape. Here, a length d20 and a shape of each of the plurality of second holes 153i2 may be the same as a length d10 and a shape of each of the plurality of first holes 153i1. The holes 153i2 located in a 2-1 row (i2-1), which is one of the plurality of second rows, may be spaced apart from each other by the same second horizontal interval d21. In addition, the holes (153i2) located in a 2-2 row (i2-2) located in the upper side of the 2-1 row (i2-1) among the plurality of second rows may be spaced apart from each by the same second horizontal interval d21. In this case, the second horizontal interval d21 may be greater than the first horizontal interval d11.

For example, the distance, between the centers (ci21 and ci22) of each of the 2-1 hole (153i21) and the 2-2 hole (153i22) that are adjacent to each other as holes located in the 2-1 row (i2-1), may be d22. At this time, the distance, between the center ci23 of a 2-3 hole (153i23) which is adjacent to the 2-1 hole (153i21) and the 2-2 hole (153i22) as a hole located in the 2-2 row (i2-2) and the center ci21 of the 2-1 hole (153i21) or the center ci22 of the 2-2 hole (153i22), may be d23. Furthermore, since the line connecting each of the centers (ci21, ci22, and ci23) of the 2-1 hole (153i21), the 2-2 hole (153i22), and the 2-3 hole (153i23) forms an isosceles triangle, the vertical distance d24 from the line connecting the center ci21 of the 2-1 hole (153i21) and the center ci22 of the 2-2 hole (153i22) to the center ci23 of the 2-3 hole (153i23) may be calculated as the square root of (d23 square−(d22/2)2 square). In this case, the distance d22 may be greater than the distance d12, the distance d23 may be greater than the distance d13, and the distance d24 may be greater than the distance d14.

Similarly, each of the plurality of holes 153 located in each of a third section i3 to a twenty-fourth section i24 has the same length and shape as each of the plurality of first holes 153i1 located in the first section i1. In addition, the horizontal interval and the vertical interval between the plurality of holes 153 located in each of the third section i3 to the twenty-fourth section i24 are the same for each section, but the horizontal interval and the vertical interval between the plurality of holes 153 located in the section located in the upper side may be greater than the horizontal interval and vertical interval between the plurality of holes 153 located in the section located in the lower side.

Accordingly, the interval between the plurality of holes 153 is the same for each section of the cover sheet 15, but may gradually increase from the first section i1 to the twenty-fourth section i24. When the length and shape of each of the plurality of holes 153 are the same, the area of the front or rear surface of the base 151 may be smaller as the distance between the plurality of holes 153 becomes narrower. That is, the area of the front or rear surface of the base 151 is the same for each section of the cover sheet 15, but may gradually increase from the first section i1 to the twenty-fourth section i24. Further, a plurality of holes 153 in each section of the cover sheet 15 are disposed to form a plurality of rows, and a plurality of holes 153 in each section are provided with a relatively large size so that the cover sheet 15 may be easily wound around or unwound from the roller 143 in comparison with a case of being disposed in a single row.

Meanwhile, when the first section i1 and the second section i2 are wound around the roller 143, the curvature of the second section i2 may be equal to or smaller than the curvature of the first section i1. That is, when the cover sheet 15 is wound around the roller 143, some of the plurality of sections may have the same curvature. For example, if the first section i1 to the twenty-fourth section i24 are sequentially wound around the roller 143, the first section i1 to a sixth section i6 may have a first curvature, and a seventh section i7 to a twelfth section i12 may be located outside the roller 143 than the first section i1 to the sixth section i6 to have a second curvature smaller than the first curvature. In addition, a thirteenth section i13 to an eighteenth section i18 may be located outside the roller 143 than a seventh section i7 to the twelfth section i12 to have a third curvature smaller than the second curvature, and a nineteenth section i19 to the twenty-fourth section i24 may be located outside the roller 143 than a thirteenth section i13 to an eighteenth section i18 to have a fourth curvature smaller than the third curvature.

Accordingly, the interval between the plurality of holes 153 is formed to be larger when being located in the section wound around the roller 143 with a relatively small curvature than in the section wound around the roller 143 with a relatively large curvature. Furthermore, the interval between the holes 153 may be gradually increased even in sections wound around the roller 143 with the same curvature. As a result, the section that is previously wound around the roller 143 in time can be easily wound around the roller 143, and the stress applied to the cover sheet 15 wound around the roller 143 over a plurality of times can be alleviated from being concentrated on one part.

Referring to FIGS. 65 and 66, a cover sheet 15' is made of a flexible material and may be wound around or unwound from the roller 143.

The cover sheet 15' may include a base 151' and a plurality of holes 153'. The plurality of holes 153' may be formed to penetrate the base 151'. The plurality of holes 153' may be formed throughout the left-right and up-down directions of the cover sheet 15'. In this case, compared to a case in which the plurality of holes 153' are not provided, the cover sheet 15' having the plurality of holes 153' can be easily wound around or unwound from the roller 143.

Each of the plurality of holes 153' may be formed to be elongated in the longitudinal direction of the roller 143, and both ends of the hole 153' may be formed to be rounded. For example, the hole 153' may be formed in an elliptical shape having a long axis parallel to the longitudinal direction of the roller 143 as a whole.

The cover sheet 15' may include a plurality of sections. Each of the plurality of sections may be elongated along the longitudinal direction of the roller 143. The plurality of sections may be sequentially arranged in a direction (e.g., up-down direction) intersecting with the longitudinal direction of the roller 143.

The plurality of sections may include a first section i1, a second section i2, ..., and an n-th section in sequentially from the bottom. Here, n is a natural number. For example, n may be 24. In this case, the first section i1, the second section i2, ..., and the n-th section in may be wound around the roller 143 in this order. For example, the vertical length, i.e., the width, of each of the plurality of sections may be equal to each other. Each of the plurality of holes 153' may be formed in each of the plurality of sections. For example, the plurality of holes 153' may be alternately disposed in a direction intersecting with the longitudinal direction of the roller 143. For example, the size the plurality of holes 153' or the distance therebetween may be 0.1 to 10 mm.

Among the plurality of holes 153', a plurality of first holes (153i1': 153i11', 153i12', ..., 153i1n', where n is a natural number) may be located in the first section i1. The plurality of first holes 153i1' may be disposed at a first interval. The plurality of first holes 153i1' may be disposed at first horizontal intervals in the longitudinal direction of the roller 143, and may be disposed at first vertical intervals in a direction intersecting with the longitudinal direction of the roller 143. Here, the first interval may include the first horizontal interval and the first vertical interval.

Specifically, the plurality of first holes 153i1' may be disposed to form a plurality of first rows in the up-down direction, and the holes disposed in the plurality of first rows may be disposed to form a plurality of first columns in the left-right direction. In this case, the interval between the plurality of first rows may be maintained constant, and the interval between the plurality of first columns may also be maintained constant.

For example, each of the plurality of first holes 153i1' may have the same length d10' and the same shape. The holes 153i1' located in the 1-1 row (i1-1), which is one of the plurality of first rows, may be spaced apart from each other by the same first horizontal interval d11'. In addition, the holes 153i1' located in the 1-2 row (i1-2) located in the upper side of the 1-1 row (i1-1) among the plurality of first rows may also be spaced apart from each other by the same first horizontal interval d11'. In addition, the distance, between the centers (ci11' and ci12') of the 1-1 hole (153i11') and the 1-2 hole (153i12') which are adjacent to each other as the holes located in the 1-1 row (i1-1), may be d12'. At this time, the distance, between the center ci13' of the 1-3 hole (153i13') adjacent to the 1-1 hole (153i11') and the 1-2 hole (153i12') as a hole located in the 1-2 row (i1-2), and the center ci11' of the 1-1 hole (153i11') or the center ci12' of the 1-2 hole (153i12'), may be d13'. Further, since a line connecting the centers (ci11', ci12', and ci13') of each of the 1-1 hole (153i11'), the 1-2 hole (153i12'), and the 1-3 hole (153i13') forms an isosceles triangle, the vertical distance d14' from a line connecting the center ci11' of the 1-1 hole (153i11') and the center ci12' of the 1-2 hole (153i12') to the center ci13' of the 1-3 hole (153i13') may be calculated as the square root of (d13'square−(d12'/2)square).

A plurality of second holes (153i2': 153i21', 153i22', ..., 153i2n', where n is a natural number) among the plurality of holes 153' may be located in the second section i2. The plurality of second holes 153i2' may be disposed at second intervals. The plurality of second holes 153i2' may be disposed at second horizontal intervals in the longitudinal direction of the roller 143, and may be disposed at second vertical intervals in a direction intersecting with the longitudinal direction of the roller 143. Here, the second interval may include the second horizontal interval and the second vertical interval. In this case, the second horizontal interval may be greater than the first horizontal interval, and the second vertical interval may be greater than the first vertical interval.

Specifically, the plurality of second holes $153i2'$ may be disposed in the up-down direction to form a plurality of second rows, and the holes disposed in the plurality of second rows may be disposed in the left-right direction to form a plurality of second columns. In this case, the interval between the plurality of second rows may be maintained constant, and the interval between the plurality of second columns may also be maintained constant.

For example, each of the plurality of second holes $153i2'$ may have the same length $d20'$ and the same shape. Here, the length $d20'$ and the shape of each of the plurality of second holes $153i2'$ may be the same as the length $d10'$ and the shape of each of the plurality of first holes $153i1'$. The holes $153i2'$ located in the 2-1 row (i2-1), which is one of the plurality of second rows, may be spaced apart from each other by the same second horizontal interval $d21'$. In addition, the holes $153i2'$ located in the 2-2 row (i2-2) located in the upper side of the 2-1 row (i2-1) among the plurality of second rows may also be spaced apart by the same second horizontal interval $d21'$. In this case, the second horizontal interval $d21'$ may be greater than the first horizontal interval $d11'$.

For example, the distance, between the centers ($ci21'$ and $ci22'$) of the 2-1 hole ($153i21'$) and the 2-2 hole ($153i22'$) that are adjacent to each other as the holes located in the 2-1 row (i2-1), may be $d22'$. At this time, the distance, between the center $ci23'$ of the 2-3 hole ($153i23'$) adjacent to the 2-1 hole ($153i21'$) and the 2-2 hole ($153i22'$) as a hall located in the 2-2 row (i2-2), and the center $ci21'$ of the 2-1 hole ($153i21'$) or the center $ci22'$ of the 2-2 hole ($153i22'$), may be $d23'$. Further, since the line connecting the centers ($ci21'$, $ci22'$, and $ci23'$) of the 2-1 hole ($153i21'$), the 2-2 hole ($153i22'$), and the 2-3 hole ($153i23'$) forms an isosceles triangle, the vertical distance $d24'$ from the line connecting the center $ci21'$ of the 2-1 hole ($153i21'$) and the center $ci22'$ of the 2-2 hole ($153i22'$) to the center $ci23'$ of the 2-3 hole ($153i23'$) may be calculated as the square root of ($d23'$ square–($d22'/2$)2 square). In this case, the distance $d22'$ may be greater than the distance $d12'$, the distance $d23'$ may be greater than the distance $d13'$, and the distance $d24'$ may be greater than the distance $d14'$.

Similarly, each of the plurality of holes $153'$ located in each of the third section i3 to the twenty-fourth section i24 may have the same length and shape as each of the plurality of first holes $153i1'$ located in the first section i1. In addition, the horizontal interval and the vertical interval between the plurality of holes $153'$ located in each of the third section i3 to the twenty-fourth section i24 are the same for each section, but the horizontal interval and the vertical interval between the plurality of holes $153'$ located in the section located in the upper side may be greater than the horizontal interval and the vertical interval between the plurality of holes $153'$ located in the section located in the lower side.

Accordingly, the interval between the plurality of holes $153'$ is the same for each section of the cover sheet $15'$, but may gradually increase from the first section i1 to the twenty-fourth section i24. In a case where the length and shape of each of the plurality of holes $153'$ are the same, the area of the front or rear surface of the base $151'$ may become smaller as the distance between the plurality of holes $153'$ becomes narrower. That is, the area of the front or rear surface of the base $151'$ is the same for each section of the cover sheet $15'$, but may gradually increase from the first section i1 to the twenty-fourth section i24. Furthermore, in each section of the cover sheet $15'$, a plurality of holes $153'$ are disposed to form a plurality of rows, and a plurality of holes $153'$ in each section are provided with a relatively large size, so that the cover sheet $15'$ can be easily wound around or unwound from the roller 143, in comparison with a case where a plurality of holes $153'$ are disposed to form only a single row.

Meanwhile, when the first section i1 and the second section i2 are wound around the roller 143, the curvature of the second section i2 may be equal to or smaller than the curvature of the first section i1. That is, when the cover sheet $15'$ is wound around the roller 143, some of the plurality of sections may have the same curvature. For example, if the first section i1 to the twenty-fourth section i24 are sequentially wound around the roller 143, the first section i1 to the sixth section i6 have a first curvature, and the seventh section i7 to the twelfth section i12 may be located outside the roller 143 than the first section i1 to the sixth section i6 to have a second curvature smaller than the first curvature. In addition, the thirteenth section i13 to the eighteenth section i18 may be located outside the roller 143 than the seventh section i7 to the twelfth section i12 and have a third curvature smaller than the second curvature, and the nineteenth section i19 to the twenty-fourth section i24 may be located outside the roller 143 than the thirteenth section i13 to the eighteenth section i18 and have a fourth curvature smaller than the third curvature.

Accordingly, the interval between the plurality of holes $153'$ is formed to be larger when being located in the section wound around the roller 143 with a relatively small curvature than in the section wound around the roller 143 with a relatively large curvature. Furthermore, the interval between the holes $153'$ may be gradually increased even in sections wound around the roller 143 with the same curvature. As a result, the section that is previously wound around the roller 143 in time can be easily wound around the roller 143, and the stress applied to the cover sheet 15 wound around the roller 143 over a plurality of times can be alleviated from being concentrated on one part.

Referring to FIGS. 67 and 68, a cover sheet 15" is made of a flexible material and may be wound around or unwound from the roller 143.

The cover sheet 15" may include a base 151" and a plurality of holes 153". The plurality of holes 153" may be formed to penetrate the base 151". The plurality of holes 153" may be formed throughout the left-right direction and the up-down direction of the cover sheet 15". In this case, in comparison with a case in which the plurality of holes 153" are not provided, the cover sheet 15" having the plurality of holes 153" can be easily wound around or unwound from the roller 143.

Each of the plurality of holes 153" is formed to be elongated in the longitudinal direction of the roller 143, and may be formed in a rectangular shape as a whole.

The coversheet 15" may include a plurality of sections. Each of the plurality of sections may be elongated along the longitudinal direction of the roller 143. The plurality of sections may be sequentially arranged in a direction (e.g., up-down direction) intersecting with the longitudinal direction of the roller 143.

The plurality of sections may include a first section (i1), a second section (i2), . . . , and an n-th section (in) sequentially from the bottom. Here, n is a natural number. For example, n may be 24. In this case, the first section (i1), the second section (i2), . . . , and the n-th section (in) may be wound around the roller 143 in this order. For example, the vertical length, i.e., the width, of each of the plurality of sections may be equal to each other. Each of the plurality of holes 153" may be formed in each of the plurality of sections. For example, the plurality of holes 153" may be alternately disposed in a direction intersecting with the longitudinal direction of the roller 143. For example, the size of the plurality of holes 153" or the distance therebetween may be 0.1 to 10 mm.

Among the plurality of holes 153", a plurality of first holes (153$i$1": 153$i$11", 153$i$12", . . . , 153$i$1$n$", where n is a natural number) may be located in the first section i1. The plurality of first holes 153$i$1" may be disposed at first intervals. The plurality of first holes 153$i$1" may be disposed at first horizontal intervals in the longitudinal direction of the roller 143, and may be disposed at first vertical intervals in a direction intersecting with the longitudinal direction of the roller 143. Here, the first interval may include the first horizontal interval and the first vertical interval.

Specifically, the plurality of first holes 153$i$1" may be disposed in the up-down direction to form a plurality of first rows, and the holes disposed in the plurality of first rows may be disposed to form a plurality of first columns in the left-right direction. In this case, the interval between the plurality of first rows may be maintained constant, and the interval between the plurality of first columns may also be maintained constant.

For example, each of the plurality of first holes 153$i$1" may have the same length d10" and the same shape. The holes 153$i$1" located in a 1-1 row (i1-1), which is one of the plurality of first rows, may be spaced apart from each other by the same first horizontal interval d11". In addition, the holes 153$i$1" located in a 1-2 row (i1-2) located in the upper side of the 1-1 row (i1-1) among the plurality of first rows may also be spaced apart by the same first horizontal interval d11". In addition, the distance, between the centers (ci11" and ci12") of each of a 1-1 hole (153$i$11") and a 1-2 hole (153$i$12") that are adjacent to each other as the holes located in the 1-1 row (i1-1), may be d12". In this case, a distance between the center ci13" of the 1-3 hole (153$i$13") adjacent to the 1-1 hole (153$i$11") and the 1-2 hole (153$i$12") as a hole located in the 1-2 row (i1-2), and the center ci11" of the 1-1 hole (153$i$11") or the center ci12" of the 1-2 hole (153$i$12") may be d13". Further, since a line connecting the centers (ci11", ci12", and ci13") of the 1-1 hole (153$i$11"), the 1-2 hole (153$i$12"), and the 1-3 hole (153$i$13"), respectively, forms an isosceles triangle, a vertical distance d14" from the line connecting the center ci11" of the 1-1 hole (153$i$11") and the center ci12" of the 1-2 hole (153$i$12") to the center ci13" of the 1-3 hole (153$i$13") may be calculated as a square root of (d13" square–(d12"/2) square).

A plurality of second holes 153$i$2" (153$i$21", 153$i$22", . . . , 153$i$2$n$", where n is a natural number) among the plurality of holes 153" may be located in a second section i2. The plurality of second holes 153$i$2" may be disposed at second intervals. The plurality of second holes 153$i$2" may be disposed at second horizontal intervals in the longitudinal direction of the roller 143, and may be disposed at second vertical intervals in a direction intersecting with the longitudinal direction of the roller 143. Here, the second interval may include the second horizontal interval and the second vertical interval. In this case, the second horizontal interval may be greater than the first horizontal interval, and the second vertical interval may be greater than the first vertical interval.

Specifically, the plurality of second holes 153$i$2" may be disposed in the up-down direction to form a plurality of second rows, and the holes disposed in the plurality of second rows may be disposed in the left-right direction to form a plurality of second columns. In this case, the interval between the plurality of second rows may be maintained constant, and the interval between the plurality of second columns may also be maintained constant.

For example, each of the plurality of second holes 153$i$2" may have the same length d20" and the same shape. Here, a length d20" and a shape of each of the plurality of second holes 153$i$2" may be the same as a length d10" and a shape of each of the plurality of first holes 153$i$1". The holes 153$i$2" located in a 2-1 row (i2-1), which is one of the plurality of second rows, may be spaced apart from each other by the same second horizontal interval d21". In addition, the holes (153$i$2") located in a 2-2 row (i2-2) located in the upper side of the 2-1 row (i2-1) among the plurality of second rows may be spaced apart from each by the same second horizontal interval d21". In this case, the second horizontal interval d21" may be greater than the first horizontal interval d11".

For example, the distance, between the centers (ci21" and ci22") of each of the 2-1 hole (153$i$21") and the 2-2 hole (153$i$22") that are adjacent to each other as holes located in the 2-1 row (i2-1), is d22". At this time, the distance, between the center ci23" of a 2-3 hole (153$i$23") which is adjacent to the 2-1 hole (153$i$21") and the 2-2 hole (153$i$22") as a hole located in the 2-2 row (i2-2) and the center ci21" of the 2-1 hole (153$i$21") or the center ci22" of the 2-2 hole (153$i$22"), may be d23". Furthermore, since the line connecting each of the centers (ci21", ci22", and ci23") of the 2-1 hole (153$i$21"), the 2-2 hole (153$i$22"), and the 2-3 hole (153$i$23") forms an isosceles triangle, the vertical distance d24" from the line connecting the center ci21" of the 2-1 hole (153$i$21") and the center ci22" of the 2-2 hole (153$i$22") to the center ci23" of the 2-3 hole (153$i$23") may be calculated as the square root of (d23" square–(d22"/2)2 square). In this case, the distance d22" may be greater than the distance d12", the distance d23" may be greater than the distance d13", and the distance d24" may be greater than the distance d14".

Similarly, each of the plurality of holes 153" located in each of a third section i3 to a twenty-fourth section i24 has the same length and shape as each of the plurality of first holes 153$i$1" located in the first section i1. In addition, the horizontal interval and the vertical interval between the plurality of holes 153" located in each of the third section i3 to the twenty-fourth section i24 are the same for each section, but the horizontal interval and the vertical interval between the plurality of holes 153" located in the section located in the upper side may be greater than the horizontal interval and vertical interval between the plurality of holes 153" located in the section located in the lower side.

Accordingly, the interval between the plurality of holes 153" is the same for each section of the cover sheet 15, but may gradually increase from the first section i1 to the twenty-fourth section i24. When the length and shape of each of the plurality of holes 153" are the same, the area of the front or rear surface of the base 151 may be smaller as the distance between the plurality of holes 153" becomes narrower. That is, the area of the front or rear surface of the base 151 is the same for each section of the cover sheet 15, but may gradually increase from the first section i1 to the twenty-fourth section i24. Further, a plurality of holes 153" in each section of the cover sheet 15 are disposed to form a plurality of rows, and a plurality of holes 153" in each section are provided with a relatively large size so that the cover sheet 15 may be easily wound around or unwound from the roller 143 in comparison with a case of being disposed in a single row.

Meanwhile, when the first section i1 and the second section i2 are wound around the roller 143, the curvature of the second section i2 may be equal to or smaller than the curvature of the first section i1. That is, when the cover sheet 15 is wound around the roller 143, some of the plurality of sections may have the same curvature. For example, if the first section i1 to the twenty-fourth section i24 are sequentially wound around the roller 143, the first section i1 to a sixth section i6 may have a first curvature, and a seventh section i7 to a twelfth section i12 may be located outside the roller 143 than the first section i1 to the sixth section i6 to have a second curvature smaller than the first curvature. In addition, a thirteenth section i13 to an eighteenth section i18 may be located outside the roller 143 than a seventh section i7 to the twelfth section i12 to have a third curvature smaller than the second curvature, and a nineteenth section i19 to the twenty-fourth section i24 may be located outside the roller 143 than a thirteenth section i13 to an eighteenth section i18 to have a fourth curvature smaller than the third curvature.

Accordingly, the interval between the plurality of holes 153" is formed to be larger when being located in the section wound around the roller 143 with a relatively small curvature than in the section wound around the roller 143 with a relatively large curvature. Furthermore, the interval between the holes 153" may be gradually increased even in sections wound around the roller 143 with the same curvature. As a result, the section that is previously wound around the roller 143 in time can be easily wound around the roller 143, and the stress applied to the cover sheet 15 wound around the roller 143 over a plurality of times can be alleviated from being concentrated on one part.

Referring to FIGS. 69 and 70, the cover sheet 16 is made of a flexible material and may be wound around or unwound from the roller 143.

The cover sheet 16 may include a first part 161 and a second part 162. The first part 161 may extend long along the longitudinal direction of the roller 143. For example, the first part 161 may include a plurality of first parts 161 sequentially arranged in a direction intersecting with the longitudinal direction of the roller 143. The second part 162 may extend along the longitudinal direction of the roller 143, and may be disposed in parallel with the first part 161 in a direction intersecting with the longitudinal direction of the roller 143. For example, the second part 162 may include a plurality of second parts 162 located between the plurality of first parts 161. In this case, the plurality of first parts 161 and the plurality of second parts 162 may be alternately located with each other in the up-down direction to form a stripe pattern as a whole. For example, the size the plurality of first parts 161 or the distance therebetween may be 1 to 10 mm.

The second part 162 may be lowered in a forward direction from the first part 161 to form a step difference. For example, the second part 162 may be formed in a portion of the first part 161 by etching.

The vertical length, i.e., the width, of each of the plurality of first parts 161 may be the same as l1. In addition, the front-rear length, i.e., the thickness, of each of the plurality of first parts 161 may be the same as t1. The vertical length, i.e., the width, of each of the plurality of second parts 162 may be the same as l2. In addition, the front-rear length, i.e., the thickness, of each of the plurality of second parts 162 may be the same as t2. For example, the width l2 may be equal to the width l1. For example, the thickness t2 may be smaller than the thickness t1 by 50 to 90%. That is, the second part 162 may form a step difference of a height h corresponding to 50 to 90% of the thickness t1 with respect to the first part 161.

Accordingly, the cover sheet 16 can be easily wound around or unwound from the roller 143 by the relatively thin second part 162, while securing the rigidity of the display unit 20 by a relatively thick first part 161.

Referring to FIG. 71, the cover sheet 16 may include a third part 163. The third part 163 may protrude rearward from some of the plurality of second parts 162. For example, a plurality of third parts 163 may be provided. For example, the plurality of second parts 162 may include parts 162a in which the plurality of third parts 163 are not formed and parts 162b in which the plurality of third parts 163 are formed.

The third part 163 may be spaced apart from a plurality of adjacent first parts 161 by a certain interval. For example, the second part 162 may be formed in a portion of the first part 161 and the third part 163 by etching.

The vertical length, i.e., the width, of each of the plurality of third parts 163 may be the same as l3. In this case, the third part 163 may be spaced apart from a plurality of neighboring first parts 161 by a certain interval (l2: l21, l22). For example, the certain interval l2 may be 0.5 to 2 mm. In addition, the front-rear length, i.e., the thickness, of each of the plurality of third parts 163 may be the same as t3. For example, the thickness t3 may be equal to the thickness t1.

For example, two first parts 161 and the second part 162a in which the third part 163 is not formed may be located between the plurality of third parts 163. In this case, an interval between the plurality of third parts 163 may be a length of l21+l1+l2+l1+l22.

Accordingly, the stress applied to the cover sheet 15 wound around the roller 143 can be alleviated from being concentrated on one part.

Referring to FIG. 72, the cover sheet 16 may include a plurality of sections. Each of the plurality of sections may be elongated along the longitudinal direction of the roller 143. The plurality of sections may be sequentially arranged in a direction (e.g., up-down direction) intersecting with the longitudinal direction of the roller 143.

The plurality of sections may include a first section (i1), a second section (i2), . . . , and an n-th section (in) sequentially from the bottom. Here, n is a natural number. For example, n may be 24. In this case, the first section (i1), the second section (i2), . . . , and the n-th section (in) may be wound around the roller 143 in this order. The plurality of first parts 161 and the plurality of second parts 162 may be located throughout the first section i1 to the twenty-fourth section i24.

Among the plurality of first parts 161, a plurality of first lower parts (161i1: 161i11, 161i12, . . . , 161i1n, where n is a natural number) may be located in the first section i1. The plurality of first lower parts 161i1 may be disposed at first intervals in a direction intersecting with the longitudinal direction of the roller 143. Here, the width of the plurality of first lower parts 161i1 (l1i1: l1i11, l1i12, . . . , l1i1n, where n is a natural number) may be equal to each other.

In detail, the plurality of first lower parts 161i1 may be disposed to form a plurality of first rows in the up-down direction. In this case, an interval between the plurality of first rows may be maintained constant.

For example, a 1-1 lower part 161i11 located in the 1-1 row (i1-1), which is one of the plurality of first rows, may be spaced apart from a 1-2 lower part 161i12 located in the 1-2 row (i1-2) located in the upper side of the 1-1 row (i1-1) by the first interval l2i1. In this case, the second part 162i1 may be located between the 1-1 lower part 161i11 and the 1-2 lower part 161i12.

Among the plurality of first parts 161, a plurality of first upper parts (161*i*2: 161*i*21, 161*i*22, . . . , 161*i*2*n*, where n is a natural number) may be located in the second section i2. The plurality of first upper parts 161*i*2 may be disposed at second intervals in a direction intersecting with the longitudinal direction of the roller 143. Here, the width of the plurality of second upper parts 161*i*2 (11*i*2: 11*i*21, 11*i*22, . . . , 11*i*2*n*, where n is a natural number) may be equal to each other. In this case, the second interval may be smaller than the first interval.

In detail, the plurality of first upper parts 161*i*2 may be disposed to form a plurality of second rows in the up-down direction. In this case, an interval between the plurality of second rows may be maintained constant.

For example, the 1-1 upper part 161*i*21 located in the 2-1 row (i2-1), which is one of the plurality of second rows, may be spaced apart from the 1-2 upper part 161*i*22 located in the 2-2 row (i2-2) located in the upper side of the 2-1 row (i2-1) by the second interval 12*i*2. In this case, the second part 162*i*2 may be located between the 1-1 upper part 161*i*21 and the 1-2 upper part 161*i*22. In this case, the second interval 12*i*2 may be smaller than the first interval 12*i*1.

Similarly, the plurality of first parts 161 located in each of the third section i3 to the twenty-fourth section i24 may have the same width as the plurality of first parts 161 located in the first section i1, respectively. In addition, the distance between the plurality of first parts 161 located in each of the third section i3 to the twenty-fourth section i24 is the same for each section, but the interval between the plurality of first parts 161 located in the section located in the upper side may be smaller than the interval between the plurality of first parts 161 located in the section located in the lower side.

Accordingly, the interval between the plurality of first parts 161 may be the same for each section of the cover sheet 16, but may gradually decrease from the first section i1 to the twenty-fourth section i24. In a case where each of the plurality of first parts 161 has the same width, the area of the front or rear surface of the cover sheet 16 may be identically maintained in the sections of the cover sheet 15.

Meanwhile, when the first section i1 and the second section i2 are wound around the roller 143, the curvature of the second section i2 may be equal to or smaller than the curvature of the first section i1. That is, when the cover sheet 15 is wound around the roller 143, some of the plurality of sections may have the same curvature. For example, if the first section i1 to the twenty-fourth section i24 are sequentially wound around the roller 143, the first section i1 to a sixth section i6 may have a first curvature, and a seventh section i7 to a twelfth section i12 may be located outside the roller 143 than the first section i1 to the sixth section i6 to have a second curvature smaller than the first curvature. In addition, a thirteenth section i13 to an eighteenth section i18 may be located outside the roller 143 than a seventh section i7 to the twelfth section i12 to have a third curvature smaller than the second curvature, and a nineteenth section i19 to the twenty-fourth section i24 may be located outside the roller 143 than a thirteenth section i13 to an eighteenth section i18 to have a fourth curvature smaller than the third curvature.

Accordingly, the interval between the plurality of first parts 161 is formed to be smaller when being located in the section wound around the roller 143 with a relatively small curvature than in the section wound around the roller 143 with a relatively large curvature. Furthermore, the interval between the first parts 161 may be gradually decreased even in sections wound around the roller 143 with the same curvature. As a result, the section that is previously wound around the roller 143 in time can be easily wound around the roller 143, and the stress applied to the cover sheet 15 wound around the roller 143 over a plurality of times can be alleviated from being concentrated on one part.

Referring to FIG. 73, a side cap 12 extends long in the up-down direction, and may be coupled to the front surface of the cover sheet 15 while being adjacent to the left and right distal ends of the cover sheet 15. Meanwhile, the side cap 12 may be applied not only to the cover sheet 15, but also to the aforementioned cover sheet (15'; 15"; 16).

A second adhesive member 13 may be coupled to the side cap 12 and the cover sheet 15 at between the side cap 12 and the cover sheet 15. For example, the second adhesive member 13 may be a double-sided tape.

The side cap 12 may be adjacent to the left and right distal ends of the display panel 10 coupled to the front surface of the cover sheet 15 by the first adhesive member 11. For example, the side cap 12 may include an elastic material. For example, the side cap 12 may include a polyurethane or polyurethane foam material.

Accordingly, the side cap 12 may cover the left and right distal ends of the display panel 10 to prevent the display panel 10 from being damaged due to an external impact.

Referring to FIG. 74, the side cap 12 may include a first surface 12*a*, a second surface 12*b*1, a third surface 12*b*2, a fourth surface 12*c*, a fifth surface 12*d*, and a sixth surface 12*e*.

The first surface 12*a* may be coupled to the front surface of the cover sheet 15 by the second adhesive member 13. Here, the first surface 12*a* may be referred to as a coupling surface.

The third surface 12*b*2 may be lowered in the rearward direction from the second surface 12*b*1 to form the fourth surface 12*c*. Here, the fourth surface 12*c* may be referred to as a step difference. The fourth surface 12*c* may be adjacent to the left and right distal ends of the display panel 10 and may cover the left and right distal ends of the display panel 10. The third surface 12*b*2 may face the first surface 12*a*, and a portion of the rear surface of the display panel 10 may be seated thereon. Here, the third surface 12*b*2 may be referred to as a seating surface.

The fifth surface 12*d* may connect the first surface 12*a* and the third surface 12*b*2, and may be adjacent to the left and right distal ends of the first adhesive member 11. The sixth surface 12*e* may connect the first surface 12*a* and second surface 12*b*1, face the fifth surface 12*d*, and form a side surface of the side cap 12.

The length of the third surface 12*b*2 may be a value obtained by subtracting the length a2 of the second surface 12*b*1 from the length a1 of the first surface 12*a*. The length of the fourth surface 12*c* may be a value obtained by subtracting the length a4 of the fifth surface 12*d* from the length a3 of the sixth surface 12*e*.

The thickness b1 of the first adhesive member 11 may be a value obtained by adding the length a4 of the fifth surface 12*d*, which is the vertical distance from the first surface 12*a* to the third surface 12*b*2, to the thickness b2 of the second adhesive member 13.

Accordingly, the rear surface of the display panel 10 may be located flat with respect to the cover sheet 15 on the first adhesive member 11 and the third surface 12*b*2.

Referring to FIG. 75, a side cap 12' may include a first surface 12*a'*, a second surface 12*b*1', a third surface 12*b*2', a fourth surface 12*c'*, a fifth surface 12*d'*, a sixth surface 12*e'*, a seventh surface 12*f'*, and an eighth surface 12*g'*.

The first surface 12a' may be coupled to the front surface of the cover sheet 15 by the second adhesive member 13. Here, the first surface 12a' may be referred to as a coupling surface.

The third surface 12b2' may be lowered in the rearward direction from the second surface 12b1' to form the fourth surface 12c'. Here, the fourth surface 12c' may be referred to as a step difference. The fourth surface 12c' may be adjacent to the left and right distal ends of the display panel 10 and cover the left and right distal ends of the display panel 10. The third surface 12b2' may face the first surface 12a', and a portion of the rear surface of the display panel 10 may be seated thereon. Here, the third surface 12b2' may be referred to as a seating surface.

The fifth surface 12d' connects the first surface 12a' and the third surface 12b2', and may be adjacent to left and right distal ends of the first adhesive member 11. The sixth surface 12e' may extend in the rearward direction from the second surface 12b1', face the fifth surface 12d', and form a side surface of the side cap 12'.

The seventh surface 12f' may extend in the rearward direction from the first surface 12a', and may be adjacent to and cover the left and right distal ends of the second adhesive member 13 and the cover sheet 15, respectively. The eighth surface 12g' may connect the sixth surface 12e' and the seventh surface 12f', and may form a rear side surface of the side cap 12'.

The thickness b1' of the first adhesive member 11 may be a value obtained by adding a value obtained by adding the length a4' of the fifth surface 12d', which is the vertical distance from the first surface 12a' to the third surface 12b2', to the thickness b2' of the second adhesive member 13.

Accordingly, the rear surface of the display panel 10 may be located flat with respect to the cover sheet 15 on the first adhesive member 11 and the third surface 12b2'.

Referring to FIG. 76, the side cap 12" may include a first surface 12a", a second surface 12b1", a third surface 12b2", a fourth surface 12c", a fifth surface 12d", a sixth surface 12e", a seventh surface 12f", an eighth surface 12g", a ninth surface 12h", and a tenth surface 12i".

The first surface 12a" may be coupled to the front surface of the cover sheet 15 by the second adhesive member 13. Here, the first surface 12a" may be referred to as a coupling surface.

The third surface 12b2" may be lowered in the rearward direction from the second surface 12b1" to form the fourth surface 12c". Here, the fourth surface 12c" may be referred to as a step difference. The fourth surface 12c" may be adjacent to the left and right distal ends of the display panel 10 and cover the left and right distal ends of the display panel 10. The third surface 12b2" may face the first surface 12a", and a portion of the rear surface of the display panel 10 may be seated thereon. Here, the third surface 12b2" may be referred to as a seating surface.

The fifth surface 12d" may connect the first surface 12a" and the third surface 12b2", and may be adjacent to left and right distal ends of the first adhesive member 11. The sixth surface 12e" may extend in the rearward direction from the second surface 12b1", face the fifth surface 12d", and form a side surface of the side cap 12".

The seventh surface 12f" may extend in the rearward direction from the first surface 12a", and may be adjacent to and cover the left and right distal ends of the second adhesive member 13 and the cover sheet 15, respectively. The eighth surface 12g" may extend to the left or right side from the sixth surface 12e", and may form a rear side surface of the side cap 12". The ninth surface 12h" extends in the forward direction from the eighth surface 12g", and the tenth surface 12i" may be located between the ninth surface 12h" and the seventh surface 12f" to contact the rear surface of the cover sheet 15.

The thickness b1" of the first adhesive member 11 may be a value obtained by adding the length a4" of the fifth surface 12d", which is the vertical distance from the first surface 12a" to the third surface 12b2", to the thickness b2" of the second adhesive member 13.

Accordingly, the rear surface of the display panel 10 may be located flat with respect to the cover sheet 15 on the first adhesive member 11 and the third surface 12b2".

According to an aspect of the present disclosure, provided is a display device including: a flexible display panel; a cover sheet which is located in a rearward direction of the display panel, and has a plurality of holes; and a roller which extends long, and around or from which the display panel and the cover sheet are wound or unwound, wherein the cover sheet includes: a first section which extends long along a longitudinal direction of the roller; and a second section which extends long along the longitudinal direction of the roller, and is disposed side by side with the first section in a direction intersecting with the longitudinal direction of the roller; wherein the plurality of holes include: a plurality of first holes which are located in the first section, and disposed at a first interval; and a plurality of second holes which are located in the second section, and disposed at a second interval different from the first interval.

According to another aspect of the present disclosure, the plurality of first holes may be disposed at a first horizontal interval in the longitudinal direction of the roller, and may be disposed at a first vertical interval in the direction intersecting with the longitudinal direction of the roller, wherein the plurality of second holes may be disposed at a second horizontal interval in the longitudinal direction of the roller, and may be disposed at a second vertical interval in the direction intersecting with the longitudinal direction of the roller, wherein the first interval may include the first horizontal interval and the first vertical interval, and the second interval may include the second horizontal interval and the second vertical interval.

According to another aspect of the present disclosure, the second section may be wound around the roller later than the first section, the second horizontal interval may be greater than the first horizontal interval, and the second vertical interval may be greater than the first vertical interval.

According to another aspect of the present disclosure, a width of the second section and a width of the first section may be equal to each other, in the direction intersecting with the longitudinal direction of the roller.

According to another aspect of the present disclosure, when the first section and the second section may be wound around the roller, a curvature of the second section may be equal to or smaller than a curvature of the first section.

According to another aspect of the present disclosure, the plurality of first holes may be disposed to be staggered from each other in the direction intersecting with the longitudinal direction of the roller.

According to another aspect of the present disclosure, each of the plurality of first holes and the plurality of second holes may be formed to extend long along the longitudinal direction of the roller, and to become narrower and curved as it progress toward a center.

According to another aspect of the present disclosure, the display device may further include a side cap which is adjacent to a distal end of the cover sheet, coupled to a front surface of the cover sheet, and adjacent to a distal end of the display panel, in the longitudinal direction of the roller.

According to another aspect of the present disclosure, the display device may further include a first adhesive member coupled to the display panel and the cover sheet at between the display panel and the cover sheet; and a second adhesive member coupled to the side cap and the cover sheet at between the side cap and the cover sheet, wherein the side caps may further include: a coupling surface coupled to the second adhesive member; and a seating surface which opposites the coupling surface, and on which a rear surface of the display panel is seated, wherein a thickness of the first adhesive member may be equal to a value obtained by adding a vertical distance from the coupling surface to the seating surface to a thickness of the second adhesive member.

According to another aspect of the present disclosure, the side cap may further include an extension portion which is adjacent to a distal end of the cover sheet, and in contact with a side surface or a rear surface of the cover sheet, in the longitudinal direction of the roller.

According to another aspect of the present disclosure, provided is a display device including: a flexible display panel; a cover sheet which is located in a rearward direction of the display panel; and a roller which extends long, and around or from which the display panel and the cover sheet are wound or unwound, wherein the cover sheet includes: a first part which extends long along a longitudinal direction of the roller; and a second part which extends long along the longitudinal direction of the roller, and is disposed side by side with the first part in a direction intersecting with the longitudinal direction of the roller, wherein the second part is formed while lowering in a forward direction from the first part.

According to another aspect of the present disclosure, the first part may further include a plurality of first parts sequentially arranged in the direction intersecting with the longitudinal direction of the roller, wherein the second part may further include a plurality of second parts located between the plurality of first parts.

According to another aspect of the present disclosure, the cover sheet may include a third part which protrudes in a rearward direction from some of the plurality of second parts, and may be spaced apart from the plurality of adjacent first parts by a certain interval.

According to another aspect of the present disclosure, the cover sheet may further include: a first section which extends long along the longitudinal direction of the roller; and a second section which extends long along the longitudinal direction of the roller, and is disposed side by side with the first section in the direction intersecting with the longitudinal direction of the roller, wherein the first part may further include: a plurality of first lower parts which are located in the first section, and disposed at a first interval in the direction intersecting with the longitudinal direction of the roller; and a plurality of first upper parts which are located in the second section, and disposed at a second interval different from the first interval in the direction intersecting with the longitudinal direction of the roller.

According to another aspect of the present disclosure, the second section may be wound around the roller later than the first section, and the second interval may be smaller than the first interval.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a flexible display panel;
a cover sheet which is located in a rearward direction of the display panel, and has a plurality of holes; and
a roller which is elongated, and around or from which the display panel and the cover sheet are wound or unwound,
wherein the cover sheet comprises:
a first section which extends along a longitudinal direction of the roller, and which has a first curvature when the first section is wound around the roller;
a second section which extends along the longitudinal direction of the roller, and which is disposed side by side with the first section in a direction intersecting with the longitudinal direction of the roller, and which is wound around the roller later than the first section, and which has the first curvature when the second section is wound around the roller;
a third section which extends along the longitudinal direction of the roller, and which is wound around the roller later than the second section, and which has a second curvature, which is smaller than the first curvature, when the third section is wound around the roller,
wherein the plurality of holes comprises:
a plurality of first holes which are located in the first section, and disposed at a first interval;
a plurality of second holes which are located in the second section, and disposed at a second interval greater than the first interval; and
a plurality of third holes which are located in the third section, and disposed at a third interval greater than the second interval.

2. The display device of claim 1, wherein the plurality of first holes are disposed at a first horizontal interval in the longitudinal direction of the roller, and disposed at a first vertical interval in the direction intersecting with the longitudinal direction of the roller,
wherein the plurality of second holes are disposed at a second horizontal interval in the longitudinal direction of the roller, and disposed at a second vertical interval in the direction intersecting with the longitudinal direction of the roller, wherein the first interval comprises the first horizontal interval and the first vertical interval, and the second interval comprises the second horizontal interval and the second vertical interval.

3. The display device of claim 2, wherein the second horizontal interval is greater than the first horizontal interval, and wherein the second vertical interval is greater than the first vertical interval.

4. The display device of claim 3, wherein a width of the second section and a width of the first section are equal to each other, in the direction intersecting with the longitudinal direction of the roller.

5. The display device of claim 2, wherein the plurality of first holes are disposed to be staggered from each other in the direction intersecting with the longitudinal direction of the roller.

6. The display device of claim 1, wherein each of the plurality of first holes and the plurality of second holes is formed to extend along the longitudinal direction of the roller, and to become narrower and curved as it progresses toward a center.

7. The display device of claim 1, further comprising a side cap which is adjacent to a distal end of the cover sheet, coupled to a front surface of the cover sheet, and adjacent to a distal end of the display panel, in the longitudinal direction of the roller.

8. The display device of claim 7, further comprising:

a first adhesive member coupled to the display panel and the cover sheet at between the display panel and the cover sheet; and a second adhesive member coupled to the side cap and the cover sheet at between the side cap and the cover sheet, wherein the side cap further comprises:

a coupling surface coupled to the second adhesive member; and a seating surface which opposites the coupling surface, and on which a rear surface of the display panel is seated, wherein a thickness of the first adhesive member is equal to a value obtained by adding a vertical distance from the coupling surface to the seating surface to a thickness of the second adhesive member.

9. The display device of claim 7, wherein the side cap further comprises an extension portion which is adjacent to a distal end of the cover sheet, and in contact with a side surface or a rear surface of the cover sheet, in the longitudinal direction of the roller.

10. A display device comprising:

a flexible display panel;

a cover sheet which is located in a rearward direction of the display panel; and a roller which is elongated, and around or from which the display panel and the cover sheet are wound or unwound, wherein the cover sheet comprises:

a first part which extends along a longitudinal direction of the roller; and a second part which extends along the longitudinal direction of the roller, and is disposed side by side with the first part in a direction intersecting with the longitudinal direction of the roller, wherein the second part is formed by being recessed in a forward direction from a rear surface of the first part.

11. The display device of claim 10, wherein the first part further comprises a plurality of first parts sequentially arranged in the direction intersecting with the longitudinal direction of the roller, wherein the second part further comprises a plurality of second parts located between the plurality of first parts.

12. The display device of claim 11, wherein the cover sheet comprises a third part which protrudes in a rearward direction from some of the plurality of second parts, and is spaced apart from the plurality of adjacent first parts by a certain interval.

13. The display device of claim 10, wherein the cover sheet further comprises:

a first section which extends along the longitudinal direction of the roller; and a second section which extends along the longitudinal direction of the roller, and is disposed side by side with the first section in the direction intersecting with the longitudinal direction of the roller, wherein the first part further comprises:

a plurality of first lower parts which are located in the first section, and disposed at a first interval in the direction intersecting with the longitudinal direction of the roller; and a plurality of first upper parts which are located in the second section, and disposed at a second interval different from the first interval in the direction intersecting with the longitudinal direction of the roller.

14. The display device of claim 13, wherein the second section is wound around the roller later than the first section, and the second interval is smaller than the first interval.

* * * * *